US012785728B2

(12) United States Patent
Watanabe et al.

(10) Patent No.: US 12,785,728 B2
(45) Date of Patent: Nov. 3, 2026

(54) COMPOSITE FILTER COMPONENT AND RADIO FREQUENCY MODULE

(71) Applicant: Murata Manufacturing Co., Ltd., Nagaokakyo (JP)

(72) Inventors: Takashi Watanabe, Nagaokakyo (JP); Morio Takeuchi, Nagaokakyo (JP); Mayuka Ono, Nagaokakyo (JP); Akira Ogasawara, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 199 days.

(21) Appl. No.: 18/894,112

(22) Filed: Sep. 24, 2024

(65) Prior Publication Data

US 2025/0233603 A1 Jul. 17, 2025

(30) Foreign Application Priority Data

Jan. 16, 2024 (JP) ................................ 2024-004748

(51) Int. Cl.

| | |
|---|---|
| ***H03H 7/46*** | (2006.01) |
| ***H03H 9/02*** | (2006.01) |
| ***H03H 9/54*** | (2006.01) |
| ***H04B 1/00*** | (2006.01) |

(52) U.S. Cl.

CPC ........... *H04B 1/0078* (2013.01); *H03H 7/461* (2013.01); *H03H 9/0222* (2013.01); *H03H 9/54* (2013.01); *H04B 1/006* (2013.01)

(58) Field of Classification Search

CPC .......... H03H 9/0222; H03H 9/54; H03H 9/46; H03H 9/542; H03H 7/463; H03H 7/46; H03H 7/461; H03H 7/465; H03H 7/468; H03H 7/466; H04B 1/0078; H04B 1/0075; H04B 1/0067; H04B 1/005; H04B 1/006

USPC ........................................................ 333/134

See application file for complete search history.

(56) References Cited

U.S. PATENT DOCUMENTS

2022/0302893 A1 * 9/2022 Yasuda .................... H03H 7/46
2023/0246009 A1 * 8/2023 Watanabe ................. H03F 3/19 455/73

FOREIGN PATENT DOCUMENTS

JP 2018-019392 A 2/2018

* cited by examiner

*Primary Examiner* — Stephen E. Jones
(74) *Attorney, Agent, or Firm* — XSENSUS LLP

(57) ABSTRACT

A composite filter component includes a filter causing a signal of a band AL reception band to pass through, a filter causing a signal of a band BL reception band to pass through, a filter causing a signal of a band AM reception band configured to be simultaneously received with a signal of the band AL to pass through, a filter causing a signal of a band BM reception band configured to be simultaneously received with a signal of the band BL to pass through.

20 Claims, 20 Drawing Sheets

COMPOSITE FILTER COMPONENT AND RADIO FREQUENCY MODULE

CROSS REFERENCE TO RELATED APPLICATIONS

This application claims priority to Japanese Patent Application No. JP 2024-004748 filed on Jan. 16, 2024. The entire contents of the above-identified applications, including the specifications, drawings and claims, are incorporated herein by reference in their entirety.

BACKGROUND OF THE DISCLOSURE

1. Field of the Disclosure

The present disclosure relates to a composite filter component and a radio frequency module including the same.

2. Description of the Related Art

Japanese Unexamined Patent Application Publication No. 2018-19392 discloses a multi-band compatible radio frequency front end circuit. In a circuit configuration disclosed in FIG. 4 in Japanese Unexamined Patent Application Publication No. 2018-19392, a filter and a low noise amplifier are connected by wires with a band selection switch interposed therebetween. Since one low noise amplifier can amplify a plurality of bands, a configuration is adopted such that the low noise amplifier can be connected to a plurality of filters.

SUMMARY OF THE DISCLOSURE

However, in the radio frequency front end circuit (radio frequency module) disclosed in FIG. 4 in Japanese Unexamined Patent Application Publication No. 2018-19392, assuming the plurality of filters and the plurality of low noise amplifiers are connected by wires, the wires intersect each other in a region between the plurality of filters and the plurality of low noise amplifiers. Assuming the wires intersect each other in the above-described region, parasitic capacitance increases in the vicinity of an input end of the low noise amplifier, a noise figure of the low noise amplifier increases, and amplification characteristics deteriorate. In addition, in a transmission path as well as a reception path, assuming wires connecting a plurality of power amplifiers and the plurality of filters intersect each other in a region between the plurality of power amplifiers and the plurality of filters, parasitic capacitance increases in the vicinity of an output end of the power amplifier. For this reason, since the parasitic capacitance is added to a low impedance power amplifier, impedance matching between the power amplifier and the filter is degraded, and the amplification characteristics of the power amplifier deteriorate.

Therefore, the present disclosure provides a multi-band compatible composite filter component and a radio frequency module which can suppress deterioration of amplification characteristics.

According to an aspect of the present disclosure, there is provided a composite filter component including a first filter having a first pass band including a reception band of a first band, a second filter having a second pass band including a reception band of a second band, a third filter having a third pass band including a reception band of a third band a signal of which is configured to be simultaneously received with a signal of the first band, a fourth filter having a fourth pass band including a reception band of a fourth band a signal of which is configured to be simultaneously received with a signal of the second band, a first input bump connected to an input end of the first filter and an input end of the third filter, a second input bump connected to an input end of the second filter and an input end of the fourth filter, a first output bump connected to an output end of the first filter, a second output bump connected to an output end of the second filter, a third output bump connected to an output end of the third filter, and a fourth output bump connected to an output end of the fourth filter. In the first output bump, the second output bump, the third output bump, and the fourth output bump, the first output bump and the second output bump are disposed adjacent to each other, and the third output bump and the fourth output bump are disposed adjacent to each other.

In addition, according to an aspect of the present disclosure, there is provided a composite filter component including a first filter having a first pass band including a transmission band of a first band, a second filter having a second pass band including a transmission band of a second band, a third filter having a third pass band including a transmission band of a third band a signal of which is configured to be simultaneously transmitted with a signal of the first band, a fourth filter having a fourth pass band including a transmission band of a fourth band a signal of which is configured to be simultaneously transmitted with a signal of the second band, a first output bump connected to an output end of the first filter and an output end of the third filter, a second output bump connected to an output end of the second filter and an output end of the fourth filter, a first input bump connected to an input end of the first filter, a second input bump connected to an input end of the second filter, a third input bump connected to an input end of the third filter, and a fourth input bump connected to an input end of the fourth filter. In the first input bump, the second input bump, the third input bump, and the fourth input bump, the first input bump and the second input bump are disposed adjacent to each other, and the third input bump and the fourth input bump are disposed adjacent to each other.

According to the present disclosure, it is possible to provide a multi-band compatible composite filter component and a radio frequency module which can suppress deterioration of amplification characteristics.

DESCRIPTION OF THE PREFERRED EMBODIMENTS

Figure 1A:
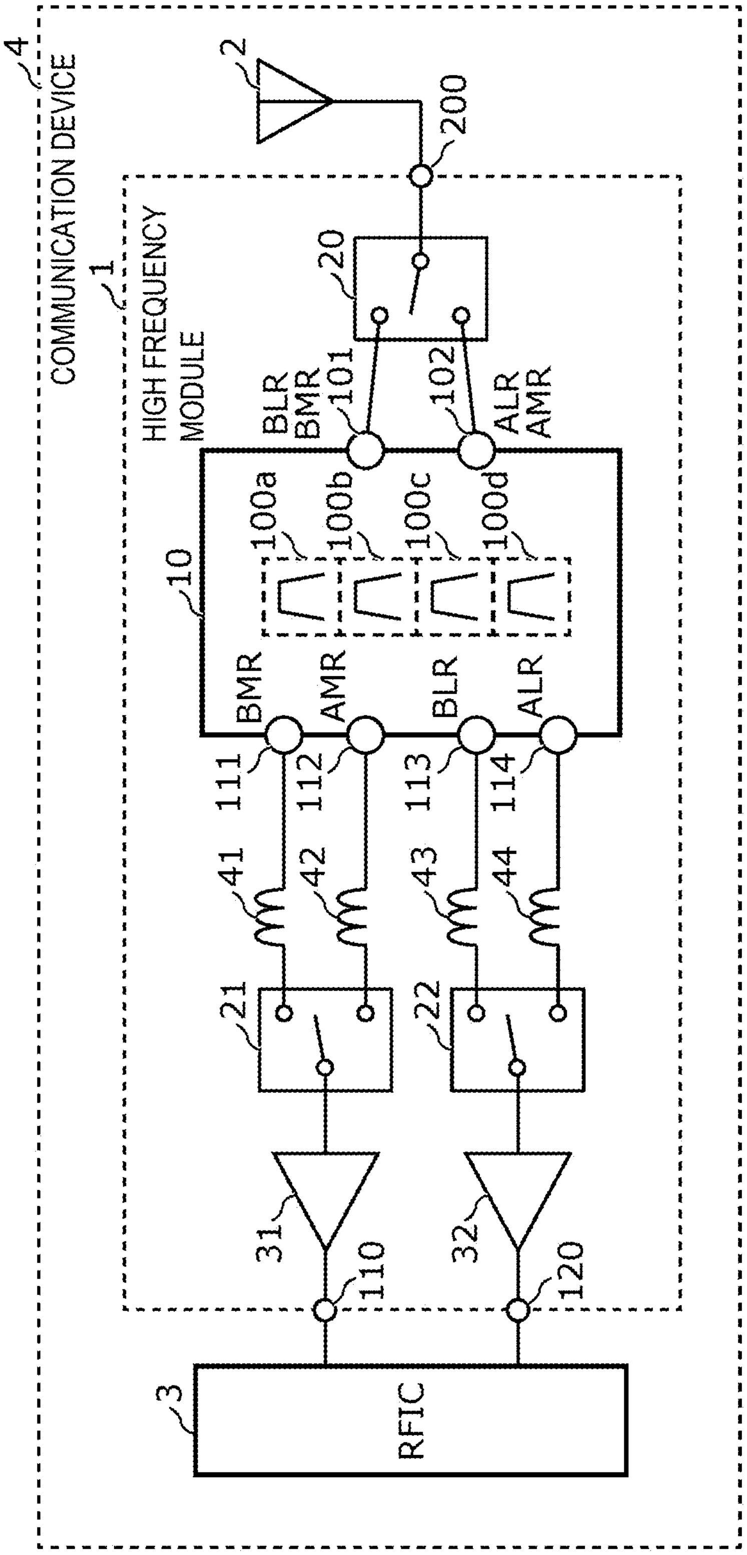
FIG. 1A is a circuit configuration diagram of a radio frequency module and a communication device according to Embodiment 1.

Hereinafter, embodiments of the present disclosure will be described in detail with reference to the drawings. In all of the following embodiments, comprehensive or specific examples are described. For example, numerical values, shapes, materials, configuration elements, or dispositions and connection forms of the configuration elements which are described in the following embodiments are merely examples, and are not intended to limit the present disclosure.

Each drawing is a schematic view in which emphasis, omission, or ratio adjustment is made as appropriate to represent the present disclosure, and is not necessarily shown strictly. In some cases, a shape, a positional relationship, and a ratio may be different from actual ones. In the drawings, the same reference numerals are assigned to substantially the same configurations, and repeated description thereof may be omitted or simplified in some cases.

In each of the following drawings, an x-axis and a y-axis are axes orthogonal to each other on a plane parallel to a main surface of a module substrate or a composite filter component. Specifically, assuming the module substrate or the composite filter component has a rectangular shape in a plan view, the x-axis is parallel to a first side of the module substrate or the composite filter component, and the y-axis is parallel to a second side orthogonal to the first side of the module substrate or the composite filter component. In addition, a z-axis is an axis perpendicular to the main surface of the module substrate or the composite filter component. A positive direction thereof indicates an upward direction, and a negative direction thereof indicates a downward direction.

In the circuit configuration of the present disclosure, the expression "connected" means a case of being electrically connected through another circuit element, in addition to a case of being directly connected by a connection terminal and/or a wiring conductor. A case of "being connected between A and B" means that the configuration elements are connected to both A and B between A and B.

In a component disposition of the present disclosure, the expression "the component is disposed on the substrate" means that the component is disposed on the main surface of the substrate and that the component is disposed in the substrate. The expression "the component is disposed on the main surface of the substrate" means that the component is disposed above the main surface without being in contact with the main surface (for example, the component is laminated on another component disposed in contact with the main surface), in addition to meaning that the component is disposed in contact with the main surface of the substrate. The expression "the component is disposed on the main surface of the substrate" may mean that the component is disposed in a recess portion formed in the main surface. The expression "the component is disposed in the substrate" means that the entire component is disposed between both main surfaces of the substrate, but a part of the component is not covered with the substrate, and only a part of the component is disposed in the substrate, in addition to meaning that the component is encapsulated in the module substrate.

In addition, in the component disposition of the present disclosure, the expression "a plan view of the main surface" means a view of an object orthogonally projected to an xy-plane from a positive side of the z-axis. The expression "A overlaps with B in a plan view" means that at least a part of a region of A that is orthogonally projected onto the xy-plane overlaps with at least a part of a region of B that is orthogonally projected onto the xy-plane. The expression "A is disposed between B and C" means that at least one of a plurality of line segments connecting any point in B and any point in C passes through A.

In addition, in the component disposition of the present disclosure, the expression "A is disposed adjacent to B" means that A and B are disposed close to each other and specifically means that another circuit component is not present in a space where A faces B. In other words, the expression "A is disposed adjacent to B" means that none of a plurality of line segments reaching B along a normal direction of a surface from any point on the surface of A facing B passes through the circuit component other than A and B. Here, the circuit component means a component including an active element and/or a passive element. That is, the circuit component includes an active component including a transistor, a diode, or the like, and a passive component including an inductor, a transformer, a capacitor, a resistor, or the like, and does not include an electromechanical component including a terminal, a connector, a wire, or the like.

In the present disclosure, the "terminal" means a point where a conductor ends inside an element. Assuming an impedance of the conductor between the elements is sufficiently low, the terminal is interpreted as not only a single point but also any point on the conductor between the elements or the entire conductor. In addition, the "bump" means a protruding electrode having a spherical shape, a cylindrical shape, a conical shape, a square columnar shape, a square conical shape, or the like in the "terminals".

In a bump disposition of the present disclosure, the expression "a bump A and a bump B are disposed adjacent to each other" means that there is no bump (HOT bump) to which a signal potential is applied in a space where the bump A and the bump B face each other, and specifically, means that none of a plurality of (straight) line segments reaching the bump B from any point on the surface of the bump A passes through the HOT bump. A bump (GND bump) to which a ground potential is applied may be present in the space where the bump A and the bump B face each other.

In addition, the expression "three or more bumps are disposed adjacent to each other" means that there is no HOT bump other than the three or more bumps in a space where any two of the three or more bumps face each other. Therefore, one of the three or more bumps may be present in the space where any two of the three or more bumps face each other.

Furthermore, terms such as "parallel" and "perpendicular", representing a relationship between the elements, a term such as "rectangular" representing the shape of the element, and a numerical value range mean not only their exact meaning but also a substantially equivalent range, for example, the inclusion of an error of about a few percent.

The expression "the pass band of the filter" is a portion of a frequency spectrum transmitted by the filter, and is defined as a frequency band in which output power is attenuated by 3 dB or more from maximum output power. Therefore, a radio frequency end and a low frequency end of the pass band of the band pass filter are specified as a higher frequency and a lower frequency of two points where the output power is attenuated by 3 dB from the maximum output power.

The "reception band" means a frequency band used for reception in the communication device. For example, in frequency division duplex (FDD), mutually different frequency bands are used as the transmission band and the reception band, and in time division duplex (TDD), the same frequency band is used as the transmission band and the reception band. In particular, in the FDD, assuming the communication device is mounted on a user equipment (UE) of a cellular network, an uplink operation band is used as the transmission band, and a downlink operation band is used as the reception band. On the contrary, assuming the communication device is mounted as a base station (BS) of the cellular network, the downlink operation band is used as the transmission band, and the uplink operation band is used as the reception band.

Embodiment 1

1.1 Configuration of Radio Frequency Module 1 and Communication Device 4

First, a circuit configuration and a component disposition configuration of the radio frequency module 1 and the communication device 4 according to the present embodiment will be described with reference to FIG. 1A. FIG. 1A is a circuit configuration diagram of the radio frequency module 1 and the communication device 4 according to Embodiment 1. FIG. 1A shows an example of the circuit configuration of the radio frequency module 1 and the communication device 4, and the radio frequency module 1 and the communication device 4 can be mounted by using any of various circuit mounting methods and circuit technologies. Therefore, the description of the radio frequency module 1 and the communication device 4 provided below should not be interpreted as being limited.

The communication device 4 is mounted on the UE of the cellular network, and is typically a mobile phone, a smartphone, a tablet computer, a wearable device, or the like. The communication device 4 may be an Internet of Things (IoT) sensor/device, a medical/healthcare device, a vehicle, an unmanned aerial vehicle (UAV) (so-called drone), or an automated guided vehicle (AGV). In addition, the communication device 4 may be mounted on a BS of a cellular communication system.

As shown in FIG. 1A, the communication device 4 includes a radio frequency module 1, an antenna 2, and a radio frequency integrated circuit (RFIC) 3.

The radio frequency module 1 can transmit a radio frequency signal between the antenna 2 and the RFIC 3. An internal configuration of the radio frequency module 1 will be described later.

The antenna 2 is connected to an antenna connection terminal 200 of the radio frequency module 1. The antenna 2 can receive a radio frequency signal from the outside of the communication device 4, and can supply the radio frequency signal to the radio frequency module 1. Furthermore, the antenna 2 may transmit the radio frequency signal supplied from the radio frequency module 1 to the outside of the communication device 4. The antenna 2 does not need to be provided in the communication device 4. In addition, the communication device 4 may include a plurality of antennas.

The RFIC 3 is an example of a signal processing circuit that processes the radio frequency signal. Specifically, the RFIC 3 can perform signal processing by performing down-conversion or the like on the radio frequency reception signal input via a reception path of the radio frequency module 1, and can output the reception signal generated by the signal processing to a baseband integrated circuit (BBIC). Furthermore, the RFIC 3 may perform signal processing by performing up-conversion or the like on the transmission signal input from the BBIC, and may output the radio frequency transmission signal generated by the signal processing to the radio frequency module 1. In addition, the RFIC 3 may include a control unit for controlling a switch, a low noise amplifier, and the like which are provided in the radio frequency module 1. The control unit may be partially or entirely provided outside the RFIC 3, or may be provided in the BBIC or the radio frequency module 1, for example.

Next, the circuit configuration of the radio frequency module 1 according to the present embodiment will be described. The radio frequency module 1 includes a composite filter component 10, low noise amplifiers 31 and 32, switches 20, 21, and 22, inductors 41, 42, 43, and 44, an antenna connection terminal 200, and signal output terminals 110 and 120.

The composite filter component 10 includes filters 100*a*, 100*b*, 100*c*, and 100*d*, input bumps 101 and 102, and output bumps 111, 112, 113, and 114.

The filter 100*d* has a first pass band including a reception band (ALR) of a band AL (first band). The filter 100*c* has a second pass band including a reception band (BLR) of a band BL (second band). The filter 100*b* has a third pass band including a reception band (AMR) of a band AM (third band). The filter 100*a* has a fourth pass band including a reception band (BMR) of a band BM (fourth band). The filters 100*d* and 100*c* are each an example of one of the first filter and the second filter, and an example of the other of the first filter and the second filter, and the filters 100*b* and 100*a* are each an example of one of the third filter and the fourth filter, and an example of the other of the third filter and the fourth filter.

The filter 100*d* and the filter 100*c* may be each an example of one of the third filter and the fourth filter, and an example of the other of the third filter and the fourth filter, and in this case, the filter 100*b* and the filter 100*a* are each an example of one of the first filter and the second filter, and an example of the other of the first filter and the second filter.

The band AL (first band) and the band AM (third band) are a combination of bands signals of which are configured to be simultaneously received, and the band BL (second band) and the band BM (fourth band) are a combination of bands signals of which are configured to be simultaneously received. That is, a signal of the band AL (first band) and a signal of the band AM (third band) can be simultaneously received, and a signal of the band BL (second band) and a signal of the band BM (fourth band) can be simultaneously received.

The input bump 102 is an example of a first input bump, and is connected to an input end of the filter 100*d* and an input end of the filter 100*b*. The input bump 101 is an example of a second input bump, and is connected to an input end of the filter 100*c* and an input end of the filter 100*a*.

According to this configuration, the input ends of the two filters 100*a* and 100*c* configured to perform simultaneous reception are connected in common to the input bump 101, and the input ends of the two filters 100*b* and 100*d* configured to perform simultaneous reception are connected in common to the input bump 102. Therefore, the number of the input bumps of the composite filter component 10 can be reduced, and a size of the composite filter component 10 can be reduced. Furthermore, the number of terminals of the switch 20 can be reduced by reducing the number of input bumps of the composite filter component 10. Therefore, off-capacitance generated in the terminal of the switch 20 can be reduced.

The output bump 114 is an example of a first output bump, and is connected to an output end of the filter 100*d*. The output bump 113 is an example of a second output bump, and is connected to an output end of the filter 100*c*. The output bump 112 is an example of a third output bump, and is connected to an output end of the filter 100*b*. The output bump 111 is an example of a fourth output bump, and is connected to an output end of the filter 100*a*.

In the output bump 111 to the output bump 114, the output bump 111 and the output bump 112 are disposed adjacent to each other, and the output bump 113 and the output bump 114 are disposed adjacent to each other.

The low noise amplifier 32 is an example of a first low noise amplifier, and can amplify signals of the ALR and the BLR. The bands AL and BL are a combination of bands signals of which are not simultaneously received. Therefore, the low noise amplifier 32 can be connected to both the filter 100*d* including the ALR in the pass band and the filter 100*c* including the BLR in the pass band. In this manner, the input end of the low noise amplifier 32 is connected to the output bumps 113 and 114 with the switch 22 interposed therebetween.

The low noise amplifier 31 is an example of a second low noise amplifier, and can amplify signals of the AMR and the BMR. The bands AM and BM are a combination of bands signals of which are not simultaneously received. Therefore, the low noise amplifier 31 can be connected to both the filter 100*b* including the AMR in the pass band and the filter 100*a* including the BMR in the pass band. In this manner, the input end of the low noise amplifier 31 is connected to the output bumps 111 and 112 with the switch 21 interposed therebetween.

The switch 20 is connected between the antenna connection terminal 200 and the composite filter component 10, and switches connection between the antenna 2 and the input bump 101 and connection between the antenna 2 and the input bump 102. The switch 21 is connected between the low noise amplifier 31 and the composite filter component 10, and switches connection between the low noise amplifier 31 and the output bump 111 and connection between the low noise amplifier 31 and the output bump 112. The switch 22 is connected between the low noise amplifier 32 and the composite filter component 10, and switches connection between the low noise amplifier 32 and the output bump 113 and connection between the low noise amplifier 32 and the output bump 114.

The inductor 41 is connected between the output bump 111 and the switch 21, and performs impedance matching between the composite filter component 10 and the low noise amplifier 31. The inductor 42 is connected between the output bump 112 and the switch 21, and performs impedance matching between the composite filter component 10 and the low noise amplifier 31. The inductor 43 is connected between the output bump 113 and the switch 22, and performs impedance matching between the composite filter component 10 and the low noise amplifier 32. The inductor 44 is connected between the output bump 114 and the switch 22, and performs impedance matching between the composite filter component 10 and the low noise amplifier 32. Each of the inductors 41 to 44 may be a matching circuit including at least one of an inductor or a capacitor. In addition, the radio frequency module 1 according to the present embodiment does not need to include at least one of the switches 20 to 22 and the inductors 41 to 44.

In a composite filter component in the related art including the plurality of filters 100*a* to 100*d*, the filters 100*b* (AMR) and 100*d* (ALR) configured to perform simultaneous reception are connected to the input bump 102, and the filters 100*a* (BMR) and 100*c* (BLR) configured to perform simultaneous reception are connected to the input bump 101. In order that wires connecting the input bump and each filter are shortened without causing the intersection, inside the composite filter component, the filters 100*b* and 100*d* are disposed adjacent to each other, and the filters 100*a* and 100*c* are disposed adjacent to each other. On the other hand, in order that the wires connecting the output bump and each filter are shortened without causing the intersection, on the output side of the composite filter component, the output bump 114 connected to the filter 100*d* and the output bump 112 connected to the filter 100*b* are adjacent to each other since the filters 100*b* and 100*d* are disposed adjacent to each other, and the output bump 111 connected to the filter 100*a* and the output bump 113 connected to the filter 100*c* are adjacent to each other since the filters 100*a* and 100*c* are disposed adjacent to each other. In the low noise amplifiers 31 and 32 that receive reception signals output from the composite filter component, it is difficult to receive two signals which are configured to be simultaneously received by one low noise amplifier, and it is desirable that the two signals are distributed to and received by the low noise amplifiers 31 and 32. Therefore, the output bumps 112 and 114 disposed adjacent to each other are distributed and connected to the low noise amplifiers 31 and 32, and the output bumps 111 and 113 disposed adjacent to each other are distributed and connected to the low noise amplifiers 31 and 32. In this case, the connection wires intersect each other in a region between the output bumps 111 to 114 and the low noise amplifiers 31 and 32, and parasitic capacitance caused by the intersection is generated in the vicinity of the input ends of the low noise amplifiers 31 and 32. As the parasitic capacitance to be generated is closer to the input end of the low noise amplifier, the noise figure of the low noise amplifier deteriorates.

In contrast, in the configuration of the composite filter component 10 according to the present embodiment, on the input side of the composite filter component 10, the filters 100*b* (AMR) and 100*d* (ALR) configured to perform simultaneous reception are connected to the input bump 102, and the filters 100*a* (BMR) and 100*c* (BLR) configured to perform simultaneous reception are connected to the input bump 101. On the other hand, on the output side of the composite filter component 10, the output bump 114 connected to the filter 100*d* and the output bump 113 connected to the filter 100*c* are adjacent to each other, and the output bump 112 connected to the filter 100*b* and the output bump 111 connected to the filter 100*a* are adjacent to each other. According to this configuration, assuming the filters 100*d* (to which the output bump 114 is connected) and 100*c* (to which the output bump 113 is connected) which do not perform mutually simultaneous reception and connected to the low noise amplifier 32, and the filters 100*b* (to which the output bump 112 is connected) and 100*a* (to which the output bump 111 is connected) which do not perform mutually simultaneous reception are connected to the low noise amplifier 31, the filters 100*a* to 100*d* and the low noise amplifiers 31 and 32 can be connected without causing the intersection of the wires connecting the output bumps 111 to 114 and the low noise amplifiers 31 and 32. In this manner, it is possible to suppress the occurrence of the parasitic capacitance caused by the intersection of the wires, in the vicinity of the input ends of the low noise amplifiers 31 and 32.

Therefore, since the wires do not intersect each other in a region between the output bumps 111 to 114 and the low noise amplifiers 31 and 32, the deterioration of the noise figure of the low noise amplifiers 31 and 32 can be suppressed, and the deterioration of the amplification characteristics on the output side of the composite filter component 10 can be suppressed.

In addition, since the wires do not intersect each other between the output bumps 111 to 114 and the low noise amplifiers 31 and 32, the height of the radio frequency module 1 can be reduced.

The bands AL, AM, BL, and BM, as well as the bands which appear in the subsequent embodiment are frequency bands for a communication system constructed by using a radio access technology (RAT), and are defined in advance by a standardization organization (for example, 3GPP (registered trademark), IEEE, and the like). Examples of the communication system include a 5th Generation New Radio (5GNR) system, a Long Term Evolution (LTE) system, a wireless local area network (WLAN) system, and the like.

For example, the band AL is Band 3 for LTE or n3 for 5GNR. For example, the band AM is Band 1 for LTE or n1 for 5GNR. For example, the band BL is Band 25 for LTE or n25 for 5GNR. For example, the band BM is Band 66 for LTE or n66 for 5GNR.

In addition, the band combinations in which simultaneous reception can be performed are defined in advance by the standardization organization or the like. For example, the band combinations in which simultaneous reception can be performed are defined as band combinations for CA, EN-DC, New Radio-Dual Connectivity (NR-DC), or New Radio E-UTRAN-Dual Connectivity (NE-DC).

Figure 1B:
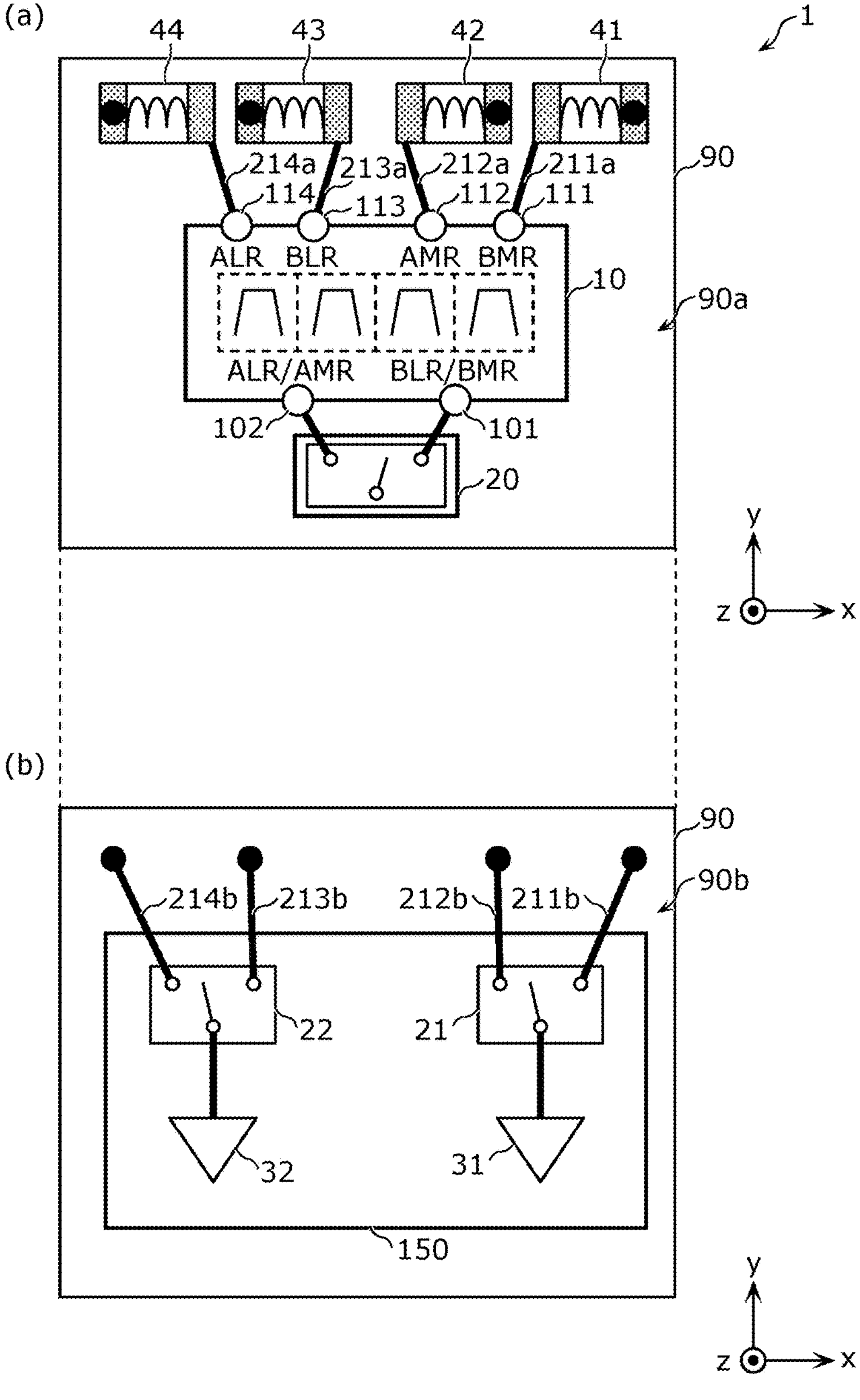
FIG. 1B is a plan view of the radio frequency module according to Embodiment 1.

FIG. 1B is a plan view of the radio frequency module 1 according to Embodiment 1. FIG. 1B shows a disposition configuration example of each circuit component and the bumps which form the radio frequency module 1. (a) of FIG. 1B is a view assuming a main surface 90*a* side of the mounting substrate 90 is viewed from the positive side of the z-axis, and (b) of FIG. 1B is a view assuming a main surface 90*b* side of the mounting substrate 90 is viewed from the positive side of the z-axis.

In FIG. 1B, a resin member covering the circuit component and a shield electrode layer formed on the surface of the resin member are omitted in the drawing. The resin member and the shield electrode layer do not need to be provided.

As shown in FIG. 1B, the radio frequency module 1 includes the mounting substrate 90, the composite filter component 10, the low noise amplifiers 31 and 32, the switches 20 to 22, and the inductors 41 to 44.

The composite filter component 10, the switch 20, and the inductors 41 to 44 are disposed on the main surface 90*a* of the mounting substrate 90. The switches 21 and 22, and the low noise amplifiers 31 and 32 are disposed on the main surface 90*b* of the mounting substrate 90.

The mounting substrate 90 has main surfaces 90*a* (third main surface) and 90*b* (fourth main surface) facing each other. A ground electrode layer or the like is formed on the mounting substrate 90 and the main surfaces 90*a* and 90*b*. In FIG. 1B, the mounting substrate 90 has a rectangular shape in a plan view, but the shape of the mounting substrate 90 is not limited thereto.

As the mounting substrate 90, for example, a low temperature co-fired ceramics (LTCC) substrate or a high temperature co-fired ceramics (HTCC) substrate having a multilayer structure of a plurality of dielectric layers, a component-embedded substrate, a substrate having a redistribution layer (RDL), a printed board, or the like can be used, but the example is not limited thereto.

For example, the composite filter component 10 has a form in which (1) the IC chip is used on the silicon substrate, (2) the filters 100*a* to 100*d* are accommodated inside one package, (3) a plurality of piezoelectric substrates are bonded to each other with a support layer interposed therebetween, or (4) the filters 100*a* to 100*d* are disposed on one substrate.

For example, each of the inductors 41 to 44 is a surface mounting type chip inductor. Each of the inductors 41 to 44 may include a coil conductor formed on the mounting substrate 90.

The low noise amplifiers 31 and 32 and the switches 21 and 22 are formed inside the IC 150.

Here, the output bumps 113 and 114 are disposed closer to the low noise amplifier 32 than the low noise amplifier 31, and the output bumps 111 and 112 are disposed closer to the low noise amplifier 31 than the low noise amplifier 32.

According to this configuration, the wire connecting the output bumps 113 and 114 to the low noise amplifier 32 and the wire connecting the output bumps 111 and 112 to the low noise amplifier 31 can be shortened. Therefore, a loss and a size of the radio frequency module 1 can be reduced.

The wires 211*a*, 212*a*, 213*a*, and 214*a* are disposed on the main surface 90*a* of the mounting substrate 90, and the wires 211*b*, 212*b*, 213*b*, and 214*b* are disposed on the main surface 90*b* of the mounting substrate 90 and inside the mounting substrate 90.

One end of the wire 211*a* is connected to the output bump 111, and the other end is connected to the inductor 41. One end of the wire 211*b* is connected to the inductor 41, and the other end is connected to the switch 21. One end of the wire 212*a* is connected to the output bump 112, and the other end is connected to the inductor 42. One end of the wire 212*b* is connected to the inductor 42, and the other end is connected to the switch 21. One end of the wire 213*a* is connected to the output bump 113, and the other end is connected to the inductor 43. One end of the wire 213*b* is connected to the inductor 43, and the other end is connected to the switch 22. One end of the wire 214*a* is connected to the output bump 114, and the other end is connected to the inductor 44. One end of the wire 214*b* is connected to the inductor 44, and the other end is connected to the switch 22.

The output bumps 111 to 114 are disposed in the first direction (x-axis negative direction) in an order of the output bumps 111, 112, 113, and 114. On the other hand, the input bumps 101 and 102 are disposed in the first direction (x-axis negative direction) in an order of the input bumps 101 and 102.

According to the above-described configuration of the radio frequency module 1, the wires 211*a* to 214*a* do not intersect each other, and the wires 211*b* to 214*b* do not intersect each other. In this manner, it is possible to suppress the occurrence of the parasitic capacitance caused by the intersection of the wires, in the vicinity of the input ends of the low noise amplifiers 31 and 32. Therefore, the deterioration of the noise figure of the low noise amplifiers 31 and 32 can be suppressed.

In addition, since each of the wires 211*b* to 214*b* includes a via conductor penetrating between the main surface 90*a* and the main surface 90*b*, the wires 211*b* to 214*b* can be shortened. In addition, the circuit components forming the radio frequency module 1 are distributed to and disposed on both surfaces of the mounting substrate 90. Therefore, a loss and a size of the radio frequency module 1 can be reduced.

1.2 Structure of Composite Filter Component 10A According to Example 1

Figure 2A:
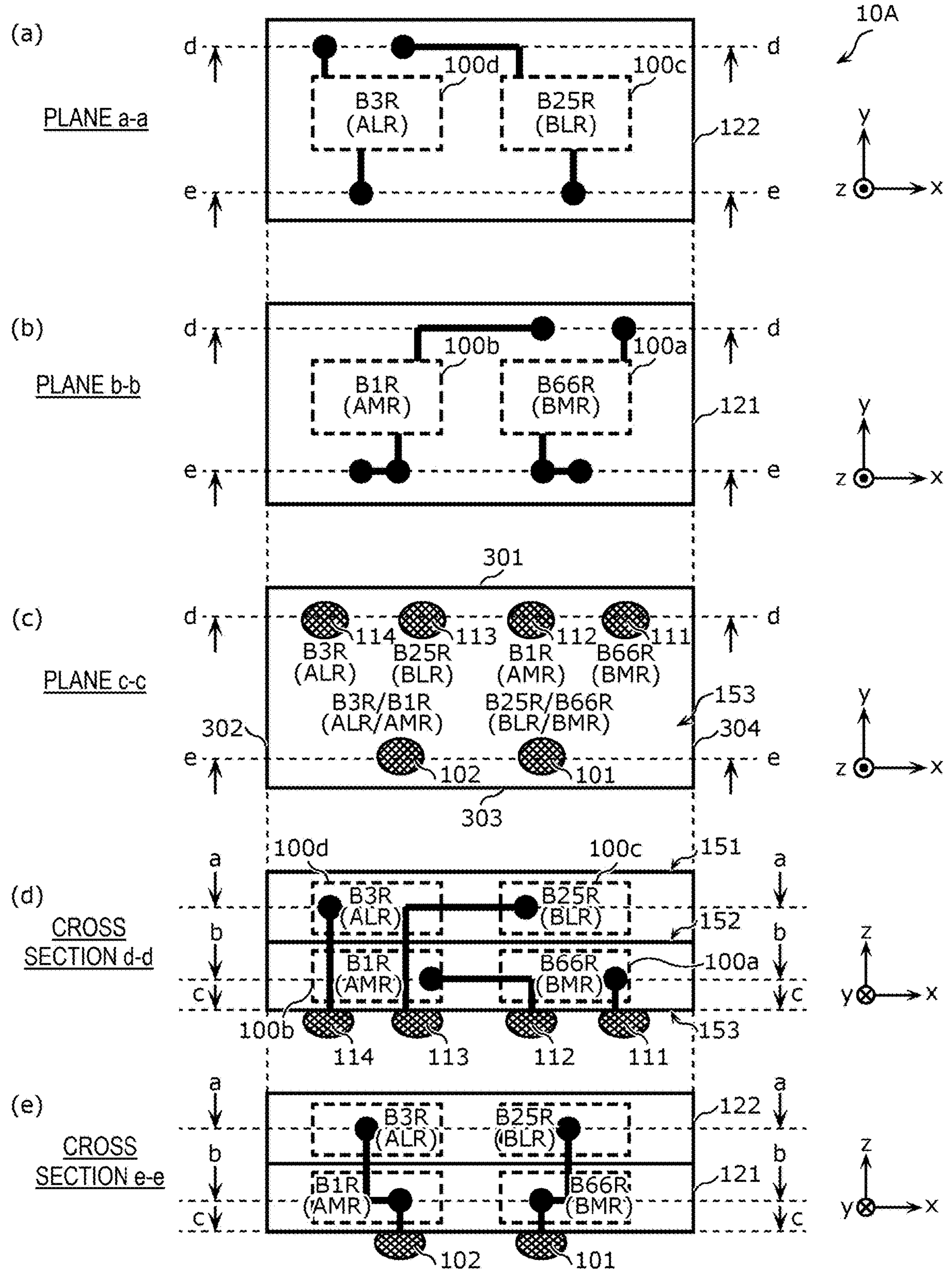
FIG. 2A is a plan view and a cross-sectional view of a composite filter component according to Example 1.

FIG. 2A is a plan view and a cross-sectional view of a composite filter component 10A according to Example 1. FIG. 2A shows a disposition configuration example of each filter and each bump which form the composite filter component 10A. (a) of FIG. 2A is a view assuming a plane a-a is viewed from the positive side of the z-axis, (b) of FIG. 2A is a view assuming a plane b-b is viewed from the positive side of the z-axis, (c) of FIG. 2A is a view assuming a plane c-c is viewed from the positive side of the z-axis, (d) of FIG. 2A is a view assuming a cross section d-d is viewed from the negative side of the y-axis, and (e) of FIG. 2A is a view assuming a cross section e-e is viewed from the negative side of the y-axis. The plane a-a is a plane parallel to a main surface 151 and between the main surface and a facing main surface of a filter chip 122. In addition, the plane b-b is a plane parallel to a main surface 153 and between the main surface and a facing main surface of a filter chip 121. In addition, the plane c-c is the main surface 153. In addition, the cross section d-d is a plane perpendicular to the main surface 153 and passing through the output bumps 111 to 114. In addition, the cross section e-e is a plane perpendicular to the main surface 153 and passing through the input bumps 101 and 102.

The composite filter component 10A includes the filter chips 121 and 122 laminated on each other, and includes the main surface 153 (first main surface) and the main surface 151 (second main surface) which face each other. The filter chip 121 is an example of a first layer portion, and includes the main surface 153 (first main surface), the filter 100*a* (BMR), and the filter 100*b* (AMR). The filter chip 122 is an example of a second layer portion, and includes the main surface 151 (second main surface), the filter 100*c* (BLR), and the filter 100*d* (ALR).

In the present example, the filter 100*d* is an example of the first filter, and is connected to the input bump 102 (first input bump) and the output bump 114 (first output bump). The filter 100*c* is an example of the second filter, and is connected to the input bump 101 (second input bump) and the output bump 113 (second output bump). The filter 100*b* is an example of the third filter, and is connected to the input bump 102 (first input bump) and the output bump 112 (third output bump). The filter 100*a* is an example of the fourth filter, and is connected to the input bump 101 (second input bump) and the output bump 111 (fourth output bump).

For example, each of the filter chips 121 (first layer portion) and 122 (second layer portion) has a form in which (1) the IC chip is used on the silicon substrate, (2) two filters are accommodated inside one package, or (3) functional electrodes of two filters are formed on one piezoelectric substrate. In addition, for example, the composite filter component 10A has at least one form of (1) the filter chips 121 and 122 are bonded between electrodes, (2) the filter chips 121 and 122 are bonded with an adhesive, and (3) the filter chips 121 and 122 are formed in a resin mold. In the present example, the filter chips 121 and 122 are bonded in an interface 152.

As shown in (c) of FIG. 2A, the composite filter component 10A has a rectangular shape assuming the main surface 153 is viewed in a plan view, and has outer edges 301 (first outer edge) and 303 (second outer edge) facing each other, and outer edges 302 and 304 facing each other. The composite filter component 10A may have a polygonal shape assuming the main surface 153 is viewed in a plan view.

The output bumps 111 to 114 are disposed on the main surface 153 in the first direction (x-axis negative direction) along the outer edge 301 in the order of the output bumps 111, 112, 113, and 114. On the other hand, the input bumps 101 and 102 are disposed on the main surface 153 in the first direction (x-axis negative direction) of a region between the output bumps 111 to 114 and the outer edge 303 in the order of the input bumps 101 and 102.

According to this configuration, the wires do not intersect each other in a region between the output bump 111 to 114 and the low noise amplifiers 31 and 32 disposed on the output side of the composite filter component 10A. Therefore, the deterioration of the noise figure of the low noise amplifiers 31 and 32 can be suppressed, and the deterioration of the amplification characteristics on the output side of the composite filter component 10A can be suppressed.

The output bumps 111 to 114 do not need to be linearly disposed in the first direction as shown in FIG. 2A. In the output bumps 111 to 114, in a region between the outer edge 301 and the input bumps 101 and 102, the output bump 111 and the output bump 112 may be disposed adjacent to each other, and the output bump 113 and the output bump 114 may be disposed adjacent to each other.

The filters 100*c* and 100*d* are disposed in the first direction (x-axis negative direction) in the order of the filters 100*c* and 100*d*. The filters 100*a* and 100*b* are disposed in the first direction (x-axis negative direction) in the order of the filters 100*a* and 100*b*. Assuming the main surfaces 151 and 153 are viewed in a plan view, the filter 100*c* and the filter 100*a* at least partially overlap each other, and the filter 100*d* and the filter 100*b* at least partially overlap each other.

That is, in the composite filter component 10A according to the present example, since two filters which do not perform simultaneous reception are disposed in one filter chip, isolation between two reception signals which are simultaneously received is improved. In addition, since two filters which perform simultaneous reception are disposed to overlap each other in a plan view, close contact and intersection between the wire connected to the input bump 101 and the wire connected to the input bump 102 are suppressed.

According to the above-described disposition configuration, the wires connecting the input bump 101 and the filters 100*a* and 100*c* do not intersect the wires connecting the input bump 102 and the filters 100*b* and 100*d* inside the filter chip 121, and do not intersect inside the filter chip 122 (refer to (a), (b), and (e) of FIG. 2A). In addition, the wire connecting the output bump 111 and the filter 100*a*, the wire connecting the output bump 112 and the filter 100*b*, the wire connecting the output bump 113 and the filter 100*c*, and the wire connecting the output bump 114 and the filter 100*d* do not intersect inside the filter chip 121, and do not intersect inside the filter chip 122 (refer to (a), (b), and (d) of FIG. 2A).

That is, inside the composite filter component 10A, the wire connecting the input bump and the filter does not intersect inside the filter chip, and the wire connecting the output bump and the filter does not intersect inside the filter chip. In this manner, the deterioration of the noise figure of the low noise amplifiers 31 and 32 disposed on the output side of the composite filter component 10A can be further suppressed, and the isolation between the filters 100*a* to 100*d* inside the composite filter component 10A can be improved. Therefore, the composite filter component 10A can transmit the reception signal of the ALR and the reception signal of the AMR, which simultaneously pass therethrough, with a low loss, and can transmit the reception signal of the BLR and the reception signal of the BMR which simultaneously pass therethrough, with a low loss.

1.3 Structure of Composite Filter Component 10B According to Example 2

Figure 2B:
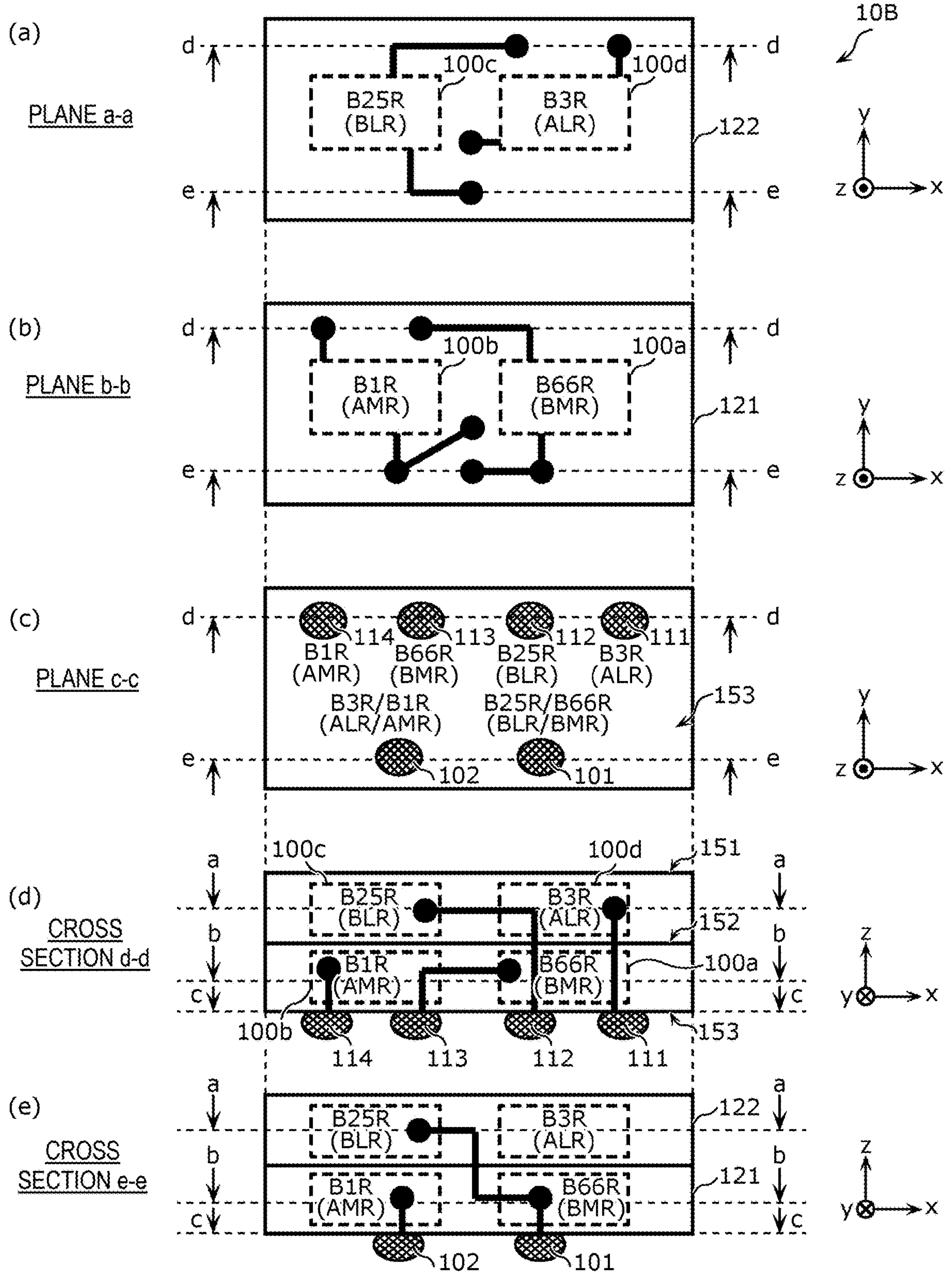
FIG. 2B is a plan view and a cross-sectional view of a composite filter component according to Example 2.

FIG. 2B is a plan view and a cross-sectional view of a composite filter component 10B according to Example 2. FIG. 2B shows a disposition configuration example of each filter and each bump which form the composite filter component 10B. (a) of FIG. 2B is a view assuming a plane a-a is viewed from the positive side of the z-axis, (b) of FIG. 2B is a view assuming a plane b-b is viewed from the positive side of the z-axis, (c) of FIG. 2B is a view assuming a plane c-c is viewed from the positive side of the z-axis, (d) of FIG. 2B is a view assuming a cross section d-d is viewed from the negative side of the y-axis, and (e) of FIG. 2B is a view assuming a cross section e-e is viewed from the negative side of the y-axis. The plane a-a is a plane parallel to a main surface 151 and between the main surface and a facing main surface of a filter chip 122. In addition, the plane b-b is a plane parallel to a main surface 153 and between the main surface and a facing main surface of a filter chip 121. In addition, the plane c-c is the main surface 153. In addition, the cross section d-d is a plane perpendicular to the main surface 153 and passing through the output bumps 111 to 114. In addition, the cross section e-e is a plane perpendicular to the main surface 153 and passing through the input bumps 101 and 102.

In the composite filter component 10B according to the present example, the disposition configuration of the filters 100*c* and 100*d* in the filter chip 122 is different from that in the composite filter component 10A according to Example 1. Therefore, hereinafter, the composite filter component 10B according to the present example will be described, and the same configurations as those of the composite filter component 10A according to Example 1 will be omitted in the description. The configurations of the filter chip 122 which are different from those of the composite filter component 10A will be mainly described.

In the present example, the filter 100*d* is an example of the first filter, and is connected to the input bump 102 (first input bump) and the output bump 111 (fourth output bump). The filter 100*c* is an example of the second filter, and is connected to the input bump 101 (second input bump) and the output bump 112 (third output bump). The filter 100*b* is an example of the third filter, and is connected to the input bump 102 (first input bump) and the output bump 114 (first output bump). The filter 100*a* is an example of the fourth filter, and is connected to the input bump 101 (second input bump) and the output bump 113 (second output bump).

The filters 100*c* and 100*d* are disposed in the first direction (x-axis negative direction) in the order of the filters 100*d* and 100*c*. The filters 100*a* and 100*b* are disposed in the first direction (x-axis negative direction) in the order of the filters 100*a* and 100*b*. Assuming the main surfaces 151 and 153 are viewed in a plan view, the filter 100*c* and the filter 100*b* at least partially overlap each other, and the filter 100*d* and the filter 100*a* at least partially overlap each other.

That is, in the composite filter component 10B according to the present example, since two filters which do not perform mutually simultaneous reception are disposed in one filter chip, the isolation between two reception signals which are simultaneously received is improved. In addition, since two filters which perform simultaneous reception are disposed in different filter chips such that the two filters do not overlap each other in a plan view, a distance between the two filters which perform simultaneous reception is secured, and the isolation between the two reception signals which are simultaneously received is further improved.

According to the above-described disposition configuration, the wires connecting the input bump 101 and the filters 100*a* and 100*c* do not intersect the wires connecting the input bump 102 and the filters 100*b* and 100*d* inside the filter chip 121, and do not intersect inside the filter chip 122 (refer to (a), (b), and (e) of FIG. 2B). In addition, the wire connecting the output bump 111 and the filter 100*d*, the wire connecting the output bump 112 and the filter 100*c*, the wire connecting the output bump 113 and the filter 100*a*, and the wire connecting the output bump 114 and the filter 100*b* do not intersect inside the filter chip 121, and do not intersect inside the filter chip 122 (refer to (a), (b), and (d) of FIG. 2B).

That is, inside the composite filter component 10B, the wire connecting the input bump and the filter does not intersect inside the filter chip, and the wire connecting the output bump and the filter does not intersect inside the filter chip. In this manner, the deterioration of the noise figure of the low noise amplifiers 31 and 32 disposed on the output side of the composite filter component 10B can be suppressed, and the isolation between the filters 100*a* to 100*d* inside the composite filter component 10B can be improved. Therefore, the composite filter component 10B can transmit the reception signal of the band ALR and the reception signal of the band AMR, which simultaneously pass therethrough, with a low loss, and can transmit the reception signal of the band BLR and the reception signal of the band BMR, which simultaneously pass therethrough, with a low loss.

1.4 Structure of Composite Filter Component 10C According to Example 3

Figure 2C:
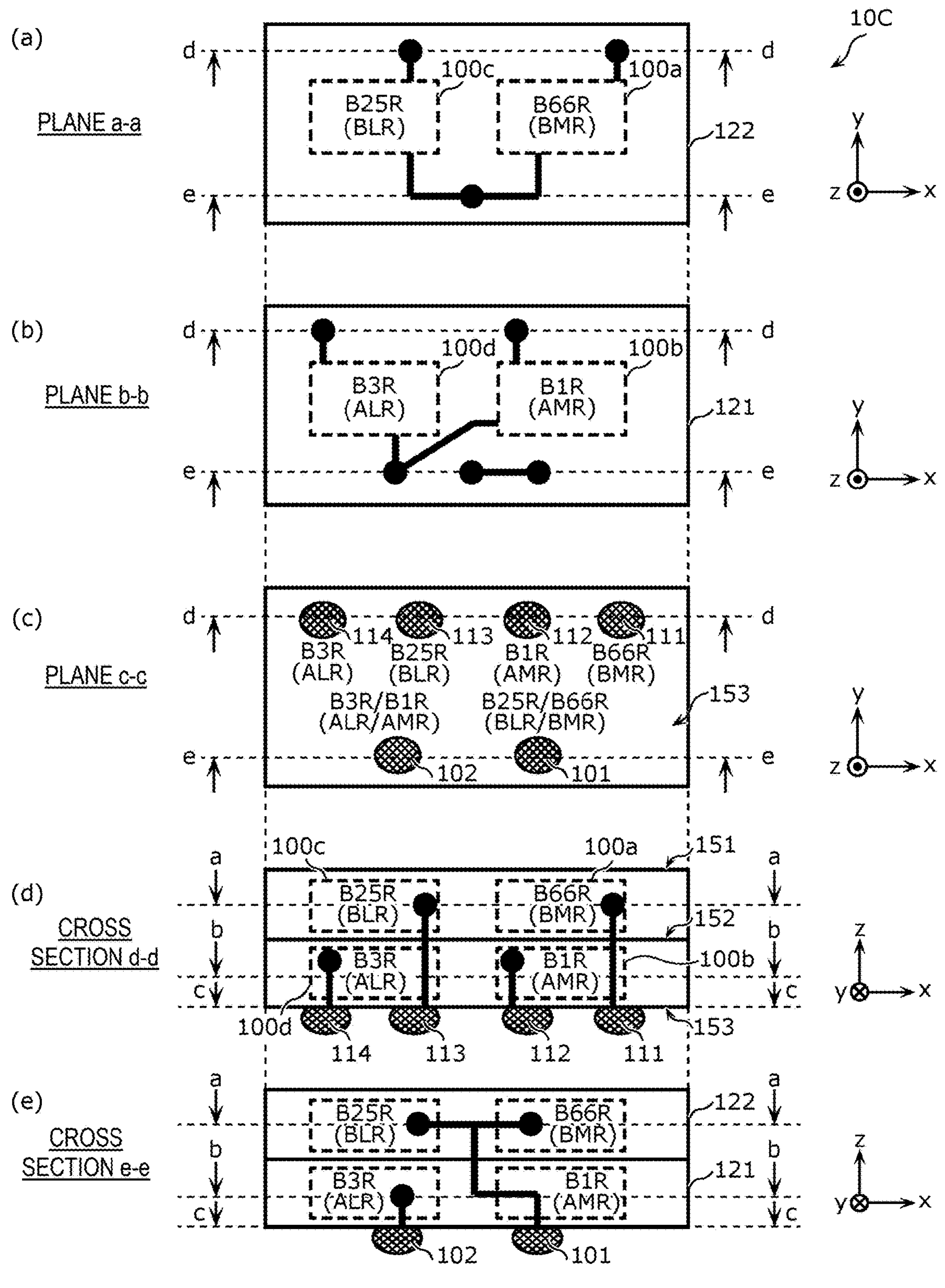
FIG. 2C is a plan view and a cross-sectional view of a composite filter component according to Example 3.

FIG. 2C is a plan view and a cross-sectional view of a composite filter component 10C according to Example 3. FIG. 2C shows a disposition configuration example of each filter and each bump which form the composite filter component 10C. (a) of FIG. 2C is a view assuming a plane a-a is viewed from the positive side of the z-axis, (b) of FIG. 2C is a view assuming a plane b-b is viewed from the positive side of the z-axis, (c) of FIG. 2C is a view assuming a plane c-c is viewed from the positive side of the z-axis, (d) of FIG. 2C is a view assuming a cross section d-d is viewed from the negative side of the y-axis, and (e) of FIG. 2C is a view assuming a cross section e-e is viewed from the negative side of the y-axis. The plane a-a is a plane parallel to a main surface 151 and between the main surface and a facing main surface of a filter chip 122. In addition, the plane b-b is a plane parallel to a main surface 153 and between the main surface and a facing main surface of a filter chip 121. In addition, the plane c-c is the main surface 153. In addition, the cross section d-d is a plane perpendicular to the main surface 153 and passing through the output bumps 111 to 114. In addition, the cross section e-e is a plane perpendicular to the main surface 153 and passing through the input bumps 101 and 102.

In the composite filter component 10C according to the present example, the disposition configuration of the filters 100*a* to 100*d* in the filter chips 121 and 122 is different from that in the composite filter component 10A according to Example 1. Therefore, hereinafter, the composite filter component 10C according to the present example will be described, and the same configurations as those of the composite filter component 10A according to Example 1 will be omitted in the description. The configurations of the filter chips 121 and 122 which are different from those of the composite filter component 10A will be mainly described.

The filter chip 121 is an example of the first layer portion, and includes the main surface 153 (first main surface), the filter 100*b* (AMR), and the filter 100*d* (ALR). The filter chip 122 is an example of the second layer portion, and includes the main surface 151 (second main surface), the filter 100*a* (BMR), and the filter 100*c* (BLR).

In the present example, the filter 100*d* is an example of the first filter, and is connected to the input bump 102 (first input bump) and the output bump 114 (first output bump). The filter 100*c* is an example of the second filter, and is connected to the input bump 101 (second input bump) and the output bump 113 (second output bump). The filter 100*b* is an example of the third filter, and is connected to the input bump 102 (first input bump) and the output bump 112 (third output bump). The filter 100*a* is an example of the fourth filter, and is connected to the input bump 101 (second input bump) and the output bump 111 (fourth output bump).

The filters 100*b* and 100*d* are disposed in the first direction (x-axis negative direction) in the order of the filters 100*b* and 100*d*. The filters 100*a* and 100*c* are disposed in the first direction (x-axis negative direction) in the order of the filters 100*a* and 100*c*. Assuming the main surfaces 151 and 153 are viewed in a plan view, the filter 100*c* and the filter 100*d* at least partially overlap each other, and the filter 100*a* and the filter 100*b* at least partially overlap each other.

That is, in the composite filter component 10C according to the present example, since two filters which perform simultaneous reception are disposed in one filter chip, it is possible to avoid the close contact between the wires connecting the two filters which perform simultaneous reception and the output bump.

According to the above-described disposition configuration, the wire connecting the input bump 101 and the filters 100*a* and 100*c* does not intersect the wire connecting the input bump 102 and the filters 100*b* and 100*d* inside the filter chip 121, and does not intersect inside the filter chip 122 (refer to (a), (b), and (e) of FIG. 2C). In addition, the wire connecting the output bump 111 and the filter 100*a*, the wire connecting the output bump 112 and the filter 100*b*, the wire connecting the output bump 113 and the filter 100*c*, and the wire connecting the output bump 114 and the filter 100*d* do not intersect inside the filter chip 121, and do not intersect inside the filter chip 122 (refer to (a), (b), and (d) of FIG. 2C).

That is, inside the composite filter component 10C, the wire connecting the input bump and the filter does not intersect inside the filter chip, and the wire connecting the output bump and the filter does not intersect inside the filter chip. In this manner, the deterioration of the noise figure of the low noise amplifiers 31 and 32 disposed on the output side of the composite filter component 10C can be suppressed, and the isolation between the filters 100*a* to 100*d* inside the composite filter component 10C can be improved. Therefore, the composite filter component 10C can transmit the reception signal of the band ALR and the reception signal of the band AMR, which simultaneously pass therethrough, with a low loss, and can transmit the reception signal of the band BLR and the reception signal of the band BMR, which simultaneously pass therethrough, with a low loss.

1.5 Structure of Composite Filter Component 10D According to Example 4

Figure 2D:
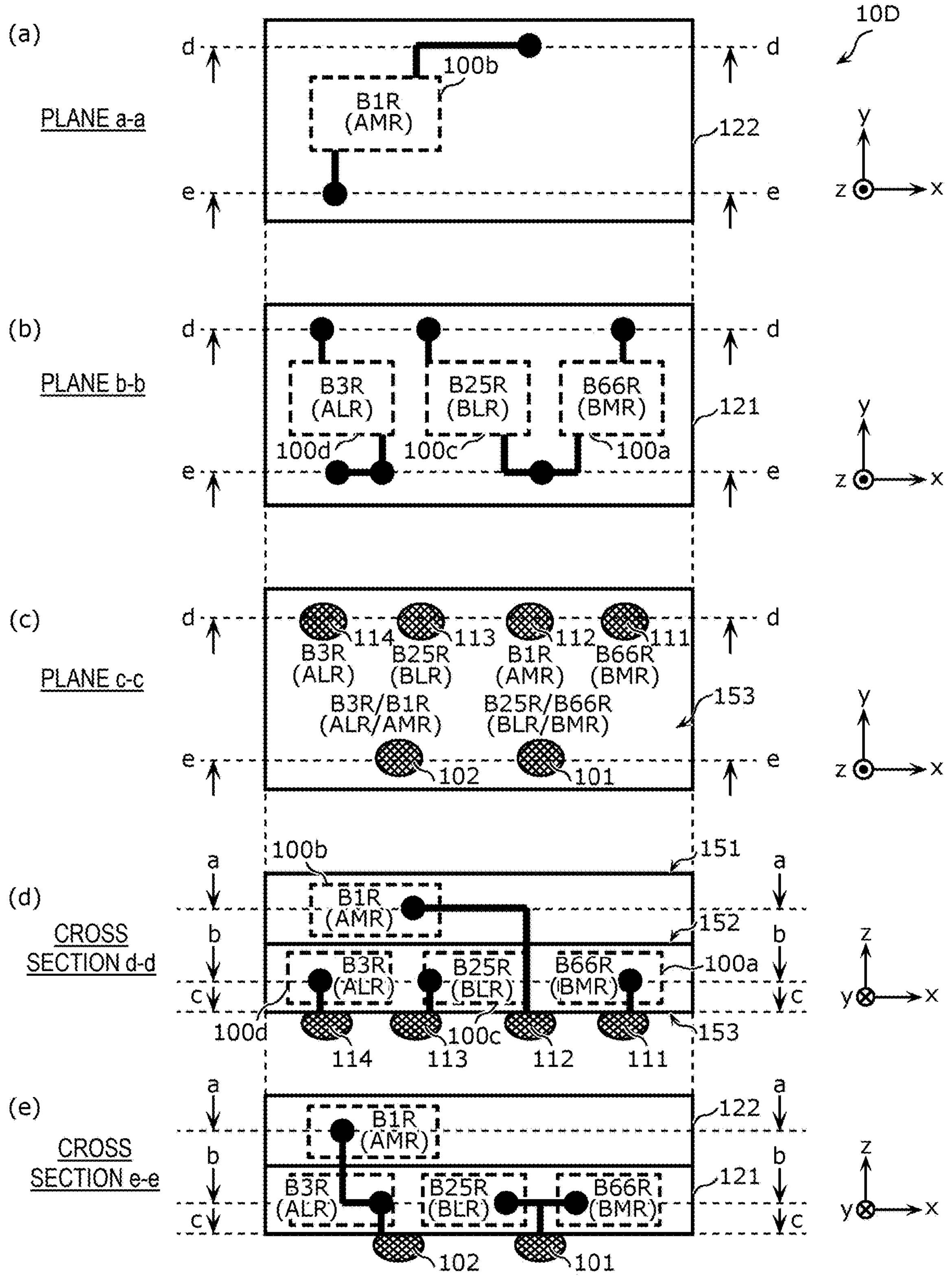
FIG. 2D is a plan view and a cross-sectional view of a composite filter component according to Example 4.

FIG. 2D is a plan view and a cross-sectional view of a composite filter component 10D according to Example 4. FIG. 2D shows a disposition configuration example of each filter and each bump which form the composite filter component 10D. (a) of FIG. 2D is a view assuming a plane a-a is viewed from the positive side of the z-axis, (b) of FIG. 2D is a view assuming a plane b-b is viewed from the positive side of the z-axis, (c) of FIG. 2D is a view assuming a plane c-c is viewed from the positive side of the z-axis, (d) of FIG. 2D is a view assuming a cross section d-d is viewed from the negative side of the y-axis, and (e) of FIG. 2D is a view assuming a cross section e-e is viewed from the negative side of the y-axis. The plane a-a is a plane parallel to a main surface 151 and between the main surface and a facing main surface of a filter chip 122. In addition, the plane b-b is a plane parallel to a main surface 153 and between the main surface and a facing main surface of a filter chip 121. In addition, the plane c-c is the main surface 153. In addition, the cross section d-d is a plane perpendicular to the main surface 153 and passing through the output bumps 111 to 114. In addition, the cross section e-e is a plane perpendicular to the main surface 153 and passing through the input bumps 101 and 102.

In the composite filter component 10D according to the present example, the disposition configuration of the filters 100*a* to 100*d* in the filter chips 121 and 122 is different from that in the composite filter component 10A according to Example 1. Therefore, hereinafter, the composite filter component 10D according to the present example will be described, and the same configurations as those of the composite filter component 10A according to Example 1 will be omitted in the description. The configurations of the filter chips 121 and 122 which are different from those of the composite filter component 10A will be mainly described.

The filter chip 121 is an example of the first layer portion, and includes the main surface 153 (first main surface), the filter 100*a* (BMR), the filter 100*c* (BLR), and the filter 100*d* (ALR). The filter chip 122 is an example of the second layer portion, and includes the main surface 151 (second main surface) and the filter 100*b* (AMR).

In the present example, the filter 100*d* is connected to the input bump 102 (first input bump) and the output bump 114 (first output bump). The filter 100*c* is connected to the input bump 101 (second input bump) and the output bump 113 (second output bump). The filter 100*b* is connected to the input bump 102 (first input bump) and the output bump 112 (third output bump). The filter 100*a* is connected to the input bump 101 (second input bump) and the output bump 111 (fourth output bump).

The filters 100*a*, 100*c*, and 100*d* are disposed in the first direction (x-axis negative direction) in the order of the filters 100*a*, 100*c*, and 100*d*. Assuming the main surfaces 151 and 153 are viewed in a plan view, the filter 100*b* and the filter 100*d* at least partially overlap each other.

That is, in the composite filter component 10D according to the present example, the two filters 100*b* and 100*d* which perform simultaneous reception are disposed to overlap each other in a plan view, and the two filters 100*a* and 100*c* which perform simultaneous reception are disposed inside one filter chip 121. In this manner, the close contact and the intersection between the wire connected to the input bump 101 and the wire connected to the input bump 102 are suppressed. In addition, since the three filters 100*a*, 100*c*, and 100*d* are disposed closer to the output bumps 111 to 114 in the filter chip 121, the wire connecting the three filters and the output bumps is shortened.

According to the above-described disposition configuration, the wire connecting the input bump 101 and the filters 100*a* and 100*c* does not intersect the wire connecting the input bump 102 and the filters 100*b* and 100*d* inside the filter chip 121, and does not intersect inside the filter chip 122 (refer to (a), (b), and (e) of FIG. 2D). In addition, the wire connecting the output bump 111 and the filter 100*a*, the wire connecting the output bump 112 and the filter 100*b*, the wire connecting the output bump 113 and the filter 100*c*, and the wire connecting the output bump 114 and the filter 100*d* do not intersect inside the filter chip 121, and do not intersect inside the filter chip 122 (refer to (a), (b), and (d) of FIG. 2D).

That is, inside the composite filter component 10D, the wire connecting the input bump and the filter inside the filter chip does not intersect, and the wire connecting the output bump and the filter inside the filter chip does not intersect. In this manner, the deterioration of the noise figure of the low noise amplifiers 31 and 32 disposed on the output side of the composite filter component 10D can be suppressed, and the isolation between the filters 100*a* to 100*d* inside the composite filter component 10D can be improved. Therefore, the composite filter component 10D can transmit the reception signal of the band ALR and the reception signal of the band AMR, which simultaneously pass therethrough, with a low loss, and can transmit the reception signal of the band BLR and the reception signal of the band BMR, which simultaneously pass therethrough, with a low loss.

The disposition of the filter 100*d* and the filter 100*b* may be interchanged. In addition, the filter 100*b* may be disposed in the filter chip 121, and the filter 100*a* or the filter 100*c* may be disposed in the filter chip 122. In this case, the filter 100*a* and the filter 100*c* at least partially overlap each other in the above-described plan view.

1.6 Multilayer Structure of Composite Filter Component 10A According to Example 1

Figure 3:
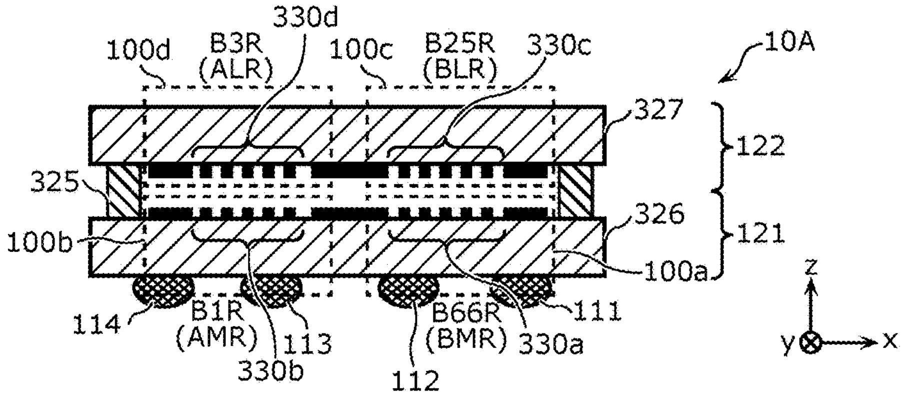
FIG. 3 is a detailed cross-sectional view of a composite filter component according to Example 1.

Next, a specific example of the multilayer structure of the composite filter component 10A according to Example 1 will be described. FIG. 3 is a detailed cross-sectional view of the composite filter component 10A according to Example 1.

The composite filter component 10A includes the filter chips 121 and 122 laminated on each other, and the filter chips 121 and 122 are bonded to each other on a support layer 325 disposed in an outer peripheral portion.

The filter chip 121 is an example of the first chip, and includes the filter 100*a* (BMR) and the filter 100*b* (AMR). In addition, the filter chip 121 includes a piezoelectric substrate 326. The filter 100*a* and the filter 100*b* are surface acoustic wave filters formed on the piezoelectric substrate 326. The filter chip 122 is an example of the second chip, and includes the filter 100*c* (BLR) and the filter 100*d* (ALR). In addition, the filter chip 122 includes a piezoelectric substrate 327. The filter 100*c* and the filter 100*d* are surface acoustic wave filters formed on the piezoelectric substrate 327.

An IDT electrode 330*a* forming the filter 100*a* and an IDT electrode 330*b* forming the filter 100*b* are formed on the main surface of the piezoelectric substrate 326 which faces the piezoelectric substrate 327. An IDT electrode 330*c* forming the filter 100*c* and an IDT electrode 330*d* forming the filter 100*d* are formed on the main surface of the piezoelectric substrate 327 which faces the piezoelectric substrate 326. That is, the IDT electrodes 330*a* to 330*d* and the wires connected thereto are disposed in a hollow space surrounded by the piezoelectric substrates 326 and 327 and the support layer 325.

According to the above-described configuration, the above-described hollow space is an air layer having a relative permittivity of 1. Therefore, the parasitic capacitance generated assuming the wire formed on the piezoelectric substrate 326 and the wire formed on the piezoelectric substrate 327 intersect in a plan view of the piezoelectric substrates 326 and 327 is smaller than the parasitic capacitance generated assuming the wire formed on the dielectric substrate intersects. Therefore, the isolation between the filters 100*a* and 100*b* and the filters 100*c* and 100*d* can be improved. In addition, for example, the wire formed in the above-described hollow space can secure a larger distance from a ground layer formed on the mounting substrate 90, compared to the wire formed on the main surface of the piezoelectric substrate 326 which faces the mounting substrate 90, and the parasitic capacitance generated between the composite filter component 10A and the mounting substrate 90 can be reduced.

Therefore, the composite filter component 10A can transmit the reception signal of the band ALR and the reception signal of the band AMR, which simultaneously pass therethrough, with a low loss, and can transmit the reception signal of the band BLR and the reception signal of the band BMR, which simultaneously pass therethrough, with a low loss.

The above-described configuration in which each of the filter chips 121 and 122 includes the piezoelectric substrate, and the IDT electrodes and the wires connected thereto are disposed in the hollow space between the filter chip 121 and the filter chip 122 may be applied to the composite filter components 10B, 10C, and 10D.

1.7 Configuration of Radio Frequency Module 1A According to Modification Example 1

Figure 4:
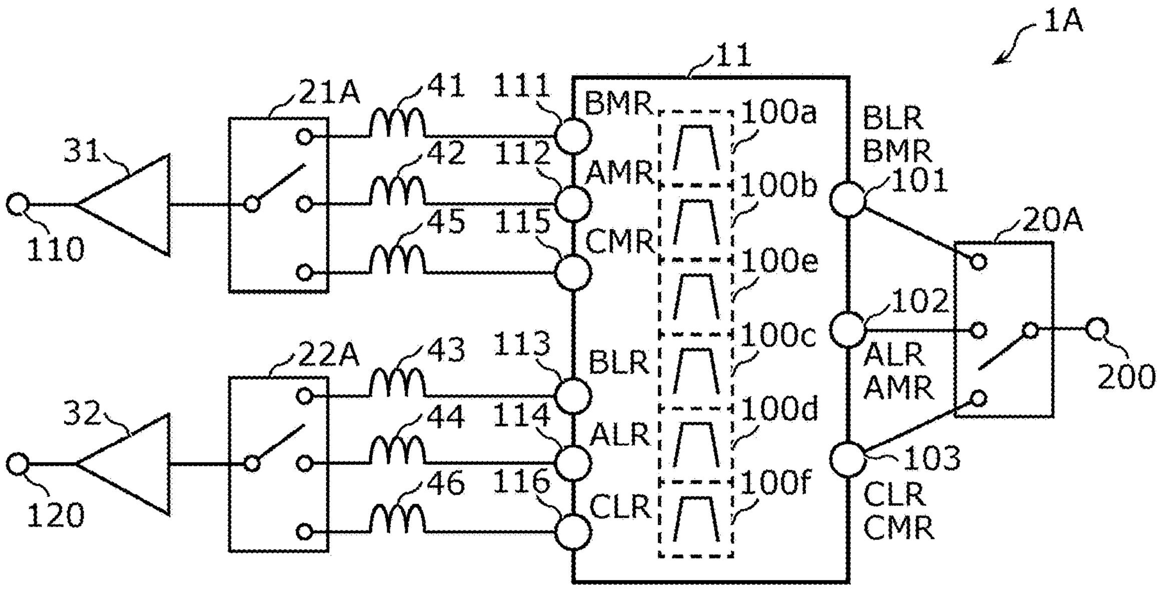
FIG. 4 is a circuit configuration diagram of a radio frequency module according to Modification Example 1 of Embodiment 1.

FIG. 4 is a circuit configuration diagram of a radio frequency module 1A according to Modification Example 1 of Embodiment 1. As shown in FIG. 4, the radio frequency module 1A according to the present modification example includes a composite filter component 11, low noise amplifiers 31 and 32, switches 20A, 21A, and 22A, inductors 41, 42, 43, 44, 45, and 46, an antenna connection terminal 200, and signal output terminals 110 and 120. The radio frequency module 1A according to the present modification example is different from the radio frequency module 1 according to Embodiment 1 of the present disclosure in that there are three sets of two bands signals of which are simultaneously received. Hereinafter, the radio frequency module 1A according to the present modification example will be described, and the same configurations as those of the radio frequency module 1 according to Embodiment 1 will be omitted in the description. Different configurations will be mainly described.

The composite filter component 11 includes the filters 100*a*, 100*b*, 100*c*, 100*d*, 100*e*, and 100*f*, the input bumps 101, 102, and 103, and the output bumps 111, 112, 113, 114, 115, and 116.

The filter 100*d* has a first pass band including a reception band (ALR) of a band AL (first band). The filter 100*c* has a second pass band including a reception band (BLR) of a band BL (second band). The filter 100*b* has a third pass band including a reception band (AMR) of a band AM (third band). The filter 100*a* has a fourth pass band including a reception band (BMR) of a band BM (fourth band). The filter 100*f* has a fifth pass band including the reception band (CLR) of the band CL (fifth band). The filter 100*e* has a sixth pass band including the reception band (CMR) of the band CM (sixth band).

The filters 100*d* and 100*c* are each an example of one of the first filter and the second filter, and an example of the other of the first filter and the second filter, and the filters 100*b* and 100*a* are each an example of one of the third filter and the fourth filter, and an example of the other of the third filter and the fourth filter. The filters 100*f* and 100*e* are each an example of one of the fifth filter and the sixth filter, and an example of the other of the fifth filter and the sixth filter.

The filter 100*d* and the filter 100*c* may be each an example of one of the third filter and the fourth filter, and an example of the other of the third filter and the fourth filter, and in this case, the filter 100*b* and the filter 100*a* are each an example of one of the first filter and the second filter, and an example of the other of the first filter and the second filter.

The signal of the band AL (first band) and the signal of the band AM (third band) can be simultaneously received, the signal of the band BL (second band) and the signal of the band BM (fourth band) can be simultaneously received, and the signal of the band CL (fifth band) and the signal of the band CM (sixth band) can be simultaneously received.

The input bump 102 is an example of a first input bump, and is connected to an input end of the filter 100*d* and an input end of the filter 100*b*. The input bump 101 is an example of a second input bump, and is connected to an input end of the filter 100*c* and an input end of the filter 100*a*. The input bump 103 is an example of a third input bump, and is connected to an input end of the filter 100*e* and an input end of the filter 100*f*.

The output bump 114 is an example of a first output bump, and is connected to an output end of the filter 100*d*. The output bump 113 is an example of a second output bump, and is connected to an output end of the filter 100*c*. The output bump 112 is an example of a third output bump, and is connected to an output end of the filter 100*b*. The output bump 111 is an example of a fourth output bump, and is connected to an output end of the filter 100*a*. The output bump 116 is an example of a fifth output bump and is connected to an output end of the filter 100*f*. The output bump 115 is an example of a sixth output bump, and is connected to an output end of the filter 100*e*.

In the output bumps 111 to 116, the output bump 116 is disposed adjacent to at least one of the output bump 114 or 113, and the output bump 115 is disposed adjacent to at least one of the output bump 112 or 111.

In the composite filter component 11 according to the present modification example, the output bumps 111 to 116 are shown in the drawing to be aligned in the order of the output bumps 111, 112, 115, 113, 114, and 116, but at least one of the output bump 113, 114, or 116 does not need to be disposed between the output bumps 111, 112, and 115, and at least one of the output bump 111, 112, or 115 does not need to be disposed between the output bumps 113, 114, and 116. For example, the output bumps 111 to 116 may be aligned in the order of the output bumps 111, 115, 112, 113, 116, and 114. In this case, the output bump 116 is disposed adjacent to the output bumps 114 and 113, and the output bump 115 is disposed adjacent to the output bumps 112 and 111.

The low noise amplifier 32 is an example of the first low noise amplifier, and can amplify the signals of the ALR, the BLR, and the CLR. The bands AL, BL, and CL are a combination of bands signals of which are not simultaneously received. Therefore, the low noise amplifier 32 can be connected to the filter 100*d* including the ALR in the pass band, the filter 100*c* including the BLR in the pass band, and the filter 100*f* including the CLR in the pass band. In this manner, the input end of the low noise amplifier 32 is connected to the output bumps 113, 114, and 116 with the switch 22A interposed therebetween.

The low noise amplifier 31 is an example of the second low noise amplifier, and can amplify the signals of the AMR, BMR, and CMR. The bands AM, BM, and CM are a combination of bands signals of which are not simultaneously received. Therefore, the low noise amplifier 31 can be connected to the filter 100*b* including the AMR in the pass band, the filter 100*a* including the BMR in the pass band, and the filter 100*e* including the CMR in the pass band. In this manner, the input end of the low noise amplifier 31 is connected to the output bumps 111, 112, and 115 with the switch 21A interposed therebetween.

The switch 20A is connected between the antenna connection terminal 200 and the composite filter component 11, and switches the connection between the antenna 2 and the input bump 101, the connection between the antenna 2 and the input bump 102, and the connection between the antenna 2 and the input bump 103. The switch 21A is connected between the low noise amplifier 31 and the composite filter component 11, and switches the connection between the low noise amplifier 31 and the output bump 111, the connection between the low noise amplifier 31 and the output bump 112, and the connection between the low noise amplifier 31 and the output bump 115. The switch 22A is connected between the low noise amplifier 32 and the composite filter component 11, and switches the connection between the low noise amplifier 32 and the output bump 113, the connection between the low noise amplifier 32 and the output bump 114, and the connection between the low noise amplifier 32 and the output bump 116.

The inductor 45 is connected between the output bump 115 and the switch 21A, and performs impedance matching between the composite filter component 11 and the low noise amplifier 31. The inductor 46 is connected between the output bump 116 and the switch 22A, and performs impedance matching between the composite filter component 11 and the low noise amplifier 32. In addition, the radio frequency module 1A according to the present modification example does not need to include at least one of the switches 20A to 22A and the inductors 41 to 46.

In the above-described configuration, on the input side of the composite filter component 11, the filters 100*b* (AMR) and 100*d* (ALR) configured to perform simultaneous reception are connected to the input bump 102, the filters 100*a* (BMR) and 100*c* (BLR) configured to perform simultaneous reception are connected to the input bump 101, and the filters 100*e* (CMR) and 100*f* (CLR) configured to perform simultaneous reception are connected to the input bump 103. On the other hand, on the output side of the composite filter component 11, the output bump 114 connected to the filter 100*d*, the output bump 113 connected to the filter 100*c*, and the output bump 116 connected to the filter 100*f* are adjacent to each other, and the output bump 112 connected to the filter 100*b*, the output bump 111 connected to the filter 100*a*, and the output bump 115 connected to the filter 100*e* are adjacent to each other.

According to this configuration, assuming the filter 100*d* (to which the output bump 114 is connected), the filter 100*c* (to which the output bump 113 is connected), and the filter 100*f* (to which the output bump 116 is connected) which do not perform simultaneous reception are connected to the low noise amplifier 32, and the filter 100*b* (to which the output bump 112 is connected), the filter 100*a* (to which the output bump 111 is connected), and the filter 100*e* (to which the output bump 115 is connected) which do not perform simultaneous reception are connected to the low noise amplifier 31, the filters 100*a* to 100*f* and the low noise amplifiers 31 and 32 can be connected without causing the intersection of the wires connecting the output bumps 111 to 116 and the low noise amplifiers 31 and 32. In this manner, it is possible to suppress the occurrence of the parasitic capacitance caused by the intersection of the wires, in the vicinity of the input ends of the low noise amplifiers 31 and 32. According to this configuration, the wires do not intersect in a region between the output bumps 111 to 116 and the low noise amplifiers 31 and 32. Therefore, the deterioration of the noise figure of the low noise amplifiers 31 and 32 can be suppressed, and the deterioration of the amplification characteristics on the output side of the composite filter component 11 can be suppressed.

For example, the band AL is Band 3 for LTE or n3 for 5GNR. For example, the band AM is Band 1 for LTE or n1 for 5GNR. For example, the band BL is Band 25 for LTE or n25 for 5GNR. For example, the band BM is Band 66 for LTE or n66 for 5GNR. For example, the band CL is Band 39 for LTE or n39 for 5GNR. For example, the band CM is Band 34 for LTE or n34 for 5GNR.

1.8 Structure of Composite Filter Component 11A According to Example 5

Figure 5:
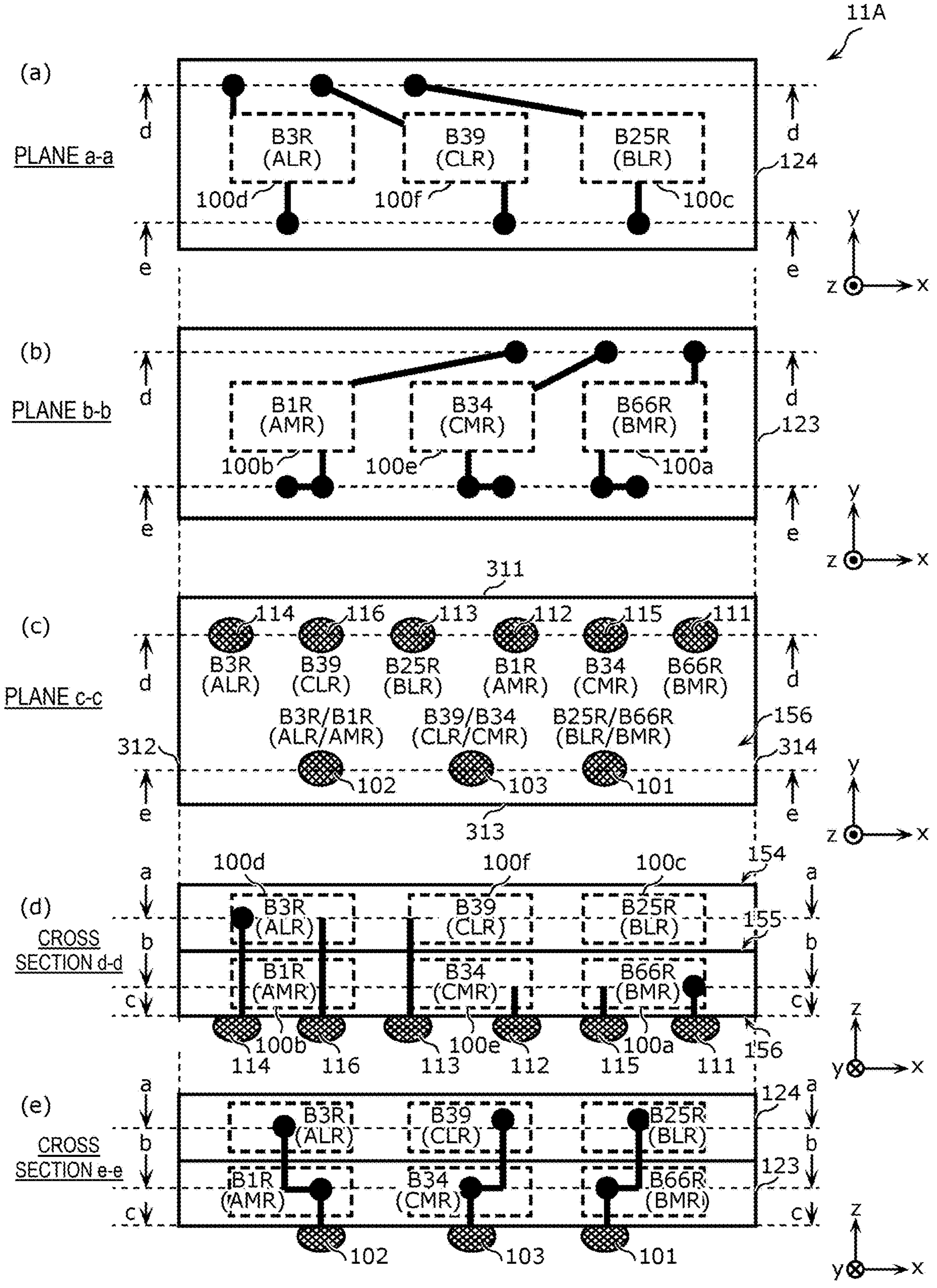
FIG. 5 is a plan view and a cross-sectional view of a composite filter component according to Example 5.

As a specific configuration example of the composite filter component 11 provided in the radio frequency module 1A according to Modification Example 1, a composite filter component 11A according to Example 5 will be described. FIG. 5 is a plan view and a cross-sectional view of the composite filter component 11A according to Example 5. FIG. 5 shows a disposition configuration example of each filter and each bump which form the composite filter component 11A. (a) of FIG. 5 is a view assuming a plane a-a is viewed from the positive side of the z-axis, (b) of FIG. 5 is a view assuming a plane b-b is viewed from the positive side of the z-axis, (c) of FIG. 5 is a view assuming a plane c-c is viewed from the positive side of the z-axis, (d) of FIG. 5 is a view assuming a cross section d-d is viewed from the negative side of the y-axis, and (e) of FIG. 5 is a view assuming a cross section e-e is viewed from the negative side of the y-axis. The plane a-a is a plane parallel to a main surface 154 and between the main surface and a facing main surface of the filter chip 124. In addition, the plane b-b is a plane parallel to a main surface 156 and between the main surface and a facing main surface of the filter chip 123. In addition, the plane c-c is the main surface 156. In addition, the cross section d-d is a plane perpendicular to the main surface 156 and passing through the output bumps 111 to 116. In addition, the cross section e-e is a plane perpendicular to the main surface 156 and passing through the input bumps 101 to 103.

The composite filter component 11A includes the filter chips 123 and 124 laminated on each other, and includes the main surface 156 (first main surface) and the main surface 154 (second main surface) which face each other. The filter chip 123 is an example of the first layer portion, and includes the main surface 156 (first main surface), and the filters 100*a* (BMR), 100*b* (AMR), and 100*e* (CMR). The filter chip 124 is an example of the second layer portion, and includes the main surface 154 (second main surface), and the filters 100*c* (BLR), 100*d* (ALR), and 100*f* (CLR).

In the present example, the filter 100*d* is an example of the first filter, and is connected to the input bump 102 (first input bump) and the output bump 114 (first output bump). The filter 100*c* is an example of the second filter, and is connected to the input bump 101 (second input bump) and the output bump 113 (second output bump). The filter 100*b* is an example of the third filter, and is connected to the input bump 102 (first input bump) and the output bump 112 (third output bump). The filter 100*a* is an example of the fourth filter, and is connected to the input bump 101 (second input bump) and the output bump 111 (fourth output bump). The filter 100*f* is an example of the fifth filter, and is connected to the input bump 103 (third input bump) and the output bump 116 (fifth output bump). The filter 100*e* is an example of the sixth filter, and is connected to the input bump 103 (third input bump) and the output bump 115 (sixth output bump).

For example, each of the filter chips 123 and 124 has a form in which (1) the IC chip is used on the silicon substrate, (2) two filters are accommodated inside one package, or (3) functional electrodes of two filters are formed on one piezoelectric substrate. In addition, for example, the composite filter component 11A has at least one form of (1) the filter chips 123 and 124 are bonded between electrodes, (2) the filter chips 123 and 124 are bonded with an adhesive, and (3) the filter chips 123 and 124 are formed in a resin mold. The filter chips 123 and 124 are bonded in an interface 155.

As shown in (c) of FIG. 5, the composite filter component 11A has a rectangular shape assuming the main surface 156 is viewed in a plan view, and has outer edges 311 (first outer edge) and 313 (second outer edge) facing each other, and outer edges 312 and 314 facing each other. The composite filter component 11A may have a polygonal shape assuming the main surface 156 is viewed in a plan view.

The output bumps 111 to 116 are disposed on the main surface 156 in the first direction (x-axis negative direction) along the outer edge 311 in the order of the output bumps 111, 115, 112, 113, 116, and 114. On the other hand, the input bumps 101 to 103 are disposed on the main surface 156 in the first direction (x-axis negative direction) of a region between the output bumps 111 to 116 and the outer edge 313 in the order of the input bumps 101, 103, and 102.

According to this configuration, the wires do not intersect in a region between the output bumps 111 to 116 and the low noise amplifiers 31 and 32 disposed on the output side of the composite filter component 11A. Therefore, the deterioration of the noise figure of the low noise amplifiers 31 and 32 can be suppressed, and the deterioration of the amplification characteristics on the output side of the composite filter component 11A can be suppressed.

The output bumps 111 to 116 do not need to be linearly disposed in the first direction as shown in FIG. 5. In the output bumps 111 to 116, in a region between the outer edge 311 and the input bumps 101 to 103, the output bumps 111, 112, and 115 may be disposed adjacent to each other, and the output bumps 113, 114, and 116 may be disposed adjacent to each other.

The filters 100*c*, 100*d*, and 100*f* are disposed in the first direction (x-axis negative direction) in the order of the filters 100*c*, 100*f*, and 100*d*. The filters 100*a*, 100*b*, and 100*e* are disposed in the first direction (x-axis negative direction) in the order of the filters 100*a*, 100*e*, and 100*b*. Assuming the main surfaces 154 and 156 are viewed in a plan view, the filter 100*c* and the filter 100*a* at least partially overlap each other, the filter 100*e* and the filter 100*f* at least partially overlap each other, and the filter 100*d* and the filter 100*b* at least partially overlap each other.

That is, in the composite filter component 11A according to the present example, since three filters which do not perform mutually simultaneous reception are disposed on one filter chip, the isolation between two reception signals which are simultaneously received is improved. In addition, since the two filters which perform simultaneous reception are disposed to overlap each other in a plan view, the close contact and the intersection between the wire connected to the input bump 101, the wire connected to the input bump 102, and the wire connected to the input bump 103 are suppressed.

According to the above-described disposition configuration, the wire connecting the input bump 101 and the filters 100*a* and 100*c*, the wire connecting the input bump 102 and the filters 100*b* and 100*d*, and the wire connecting the input bump 103 and the filters 100*e* and 100*f* do not intersect inside the filter chip 123, and do not intersect inside the filter chip 124 (refer to (a), (b), and (e) of FIG. 5). In addition, the wire connecting the output bump 111 and the filter 100*a*, the wire connecting the output bump 112 and the filter 100*b*, the wire connecting the output bump 113 and the filter 100*c*, the wire connecting the output bump 114 and the filter 100*d*, the wire connecting the output bump 115 and the filter 100*e*, and the wire connecting the output bump 116 and the filter 100*f* do not intersect inside the filter chip 123, and do not intersect inside the filter chip 124 (refer to (a), (b), and (d) of FIG. 5).

That is, inside the composite filter component 11A, the wire connecting the input bump and the filter inside the filter chip does not intersect, and the wire connecting the output bump and the filter inside the filter chip does not intersect. In this manner, the deterioration of the noise figure of the low noise amplifiers 31 and 32 disposed on the output side of the composite filter component 11A can be further suppressed, and the isolation between the filters 100*a* to 100*f* inside the composite filter component 11A can be improved. Therefore, the composite filter component 11A can transmit the reception signal of the band AL and the reception signal of the band AM, which simultaneously pass therethrough, with a low loss, can transmit the reception signal of the band BL and the reception signal of the band BM, which simultaneously pass therethrough, with a low loss, and can transmit the reception signal of the band CL and the reception signal of the band CM, which simultaneously pass therethrough, with a low loss.

1.9 Configuration of Radio Frequency Module 1B According to Modification Example 2

Figure 6:
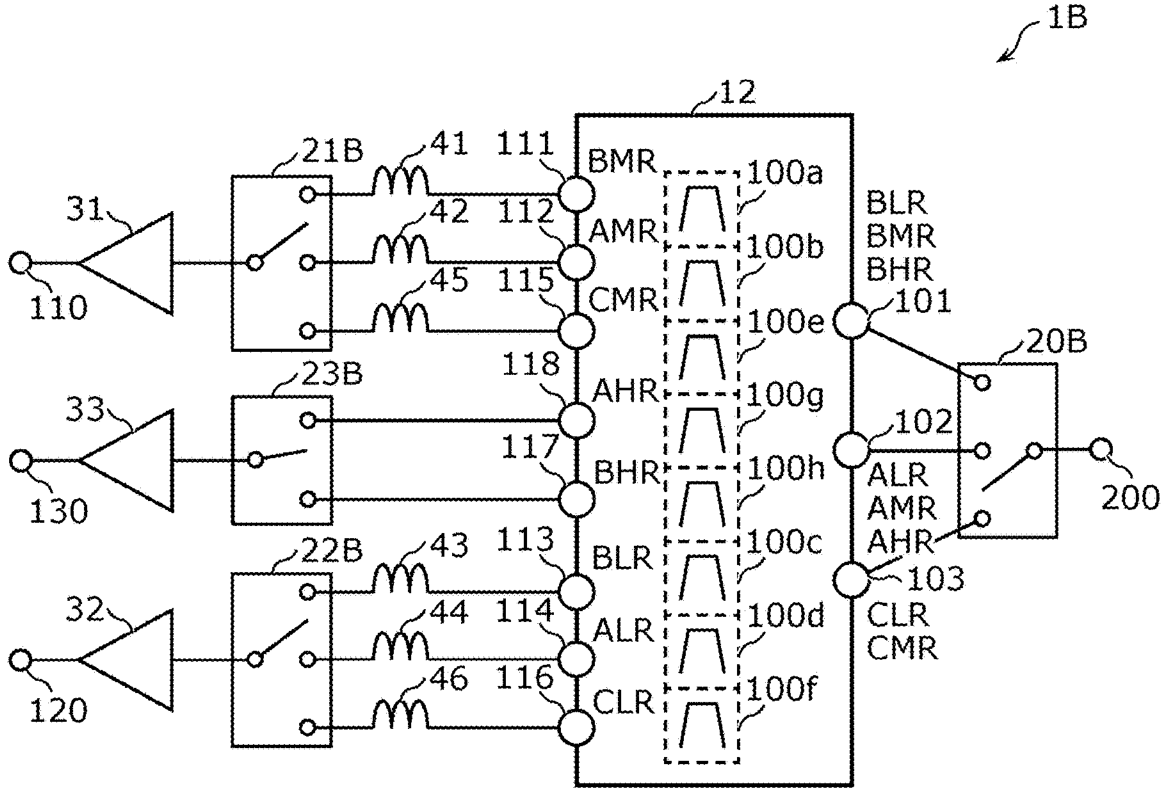
FIG. 6 is a circuit configuration diagram of a radio frequency module according to Modification Example 2 of Embodiment 1.

FIG. 6 is a circuit configuration diagram of a radio frequency module 1B according to Modification Example 2 of Embodiment 1. As shown in FIG. 6, the radio frequency module 1B according to the present modification example includes a composite filter component 12, low noise amplifiers 31, 32, and 33, switches 20B, 21B, 22B, and 23B, inductors 41 to 46, an antenna connection terminal 200, and signal output terminals 110, 120, and 130. The radio frequency module 1B according to the present modification example is different from the radio frequency module 1A according to Modification Example 1 in three bands signals of which are simultaneously received. Hereinafter, the radio frequency module 1B according to the present modification example will be described, and the same configurations as those of the radio frequency module 1A according to Modification Example 1 will be omitted in the description. Different configurations will be mainly described.

The composite filter component 12 includes filters 100*a*, 100*b*, 100*c*, 100*d*, 100*e*, 100*f*, 100*g*, and 100*h*, the input bumps 101, 102, and 103, and the output bumps 111, 112, 113, 114, 115, 116, 117, and 118.

The filter 100*d* has a first pass band including a reception band (ALR) of a band AL (first band). The filter 100*c* has a second pass band including a reception band (BLR) of a band BL (second band). The filter 100*b* has a third pass band including a reception band (AMR) of a band AM (third band). The filter 100*a* has a fourth pass band including a reception band (BMR) of a band BM (fourth band). The filter 100*f* has a fifth pass band including a reception band (CLR) of a band CL (fifth band). The filter 100*e* has a sixth pass band including a reception band (CMR) of a band CM (sixth band). The filter 100*g* has a seventh pass band including a reception band (AHR) of a band AH (seventh band). The filter 100*h* has an eighth pass band including a reception band (BHR) of a band BH (eighth band). The filters 100*d* and 100*c* are each an example of one of the first filter and the second filter, and an example of the other of the first filter and the second filter, and the filters 100*b* and 100*a* are each an example of one of the third filter and the fourth filter, and an example of the other of the third filter and the fourth filter. The filters 100*f* and 100*e* are each an example of one of the fifth filter and the sixth filter, and an example of the other of the fifth filter and the sixth filter. The filters 100*g* and 100*h* are each an example of one of the seventh filter and the eighth filter, and an example of the other of the seventh filter and the eighth filter.

The signal of the band AL (first band), the signal of the band AM (third band), and the signal of the band AH (seventh band) can be simultaneously received, the signal of the band BL (second band), the signal of the band BM (fourth band), and the signal of the band BH (eighth band)

can be simultaneously received, and the signal of the band CL (fifth band) and the signal of the band CM (sixth band) can be simultaneously received.

The input bump 102 is an example of the first input bump, and is connected to the input end of the filter 100*d*, the input end of the filter 100*b*, and the input end of the filter 100*g*. The input bump 101 is an example of the second input bump, and is connected to the input end of the filter 100*c*, the input end of the filter 100*a*, and the input end of the filter 100*h*. The input bump 103 is an example of the third input bump, and is connected to the input end of the filter 100*e* and the input end of the filter 100*f*.

The output bump 114 is an example of a first output bump, and is connected to an output end of the filter 100*d*. The output bump 113 is an example of a second output bump, and is connected to an output end of the filter 100*c*. The output bump 112 is an example of a third output bump, and is connected to an output end of the filter 100*b*. The output bump 111 is an example of a fourth output bump, and is connected to an output end of the filter 100*a*. The output bump 116 is an example of a fifth output bump and is connected to an output end of the filter 100*f*. The output bump 115 is an example of a sixth output bump, and is connected to an output end of the filter 100*e*. The output bump 118 is an example of a seventh output bump, and is connected to an output end of the filter 100*g*. The output bump 117 is an example of an eighth output bump, and is connected to an output end of the filter 100*h*.

In the output bumps 111 to 114, 117, and 118, the output bump 114 and the output bump 113 are disposed adjacent to each other, the output bump 112 and the output bump 111 are disposed adjacent to each other, and the output bump 117 and the output bump 118 are disposed adjacent to each other.

In the composite filter component 12 according to the present modification example, the output bumps 111, 112, and 115 are shown in the drawing to be aligned in the order of the output bumps 111, 112, and 115, but at least one of the output bumps 113, 114, 116, 117, or 118 does not need to be disposed between the output bumps 111, 112, and 115. In addition, the output bumps 113, 114, and 116 are shown in the drawing to be aligned in the order of the output bumps 113, 114, and 116, but at least one of the output bump 111, 112, 115, 117, or 118 does not need to be disposed between the output bumps 113, 114, and 116. For example, the output bumps 111, 112, and 115 may be aligned in the order of the output bumps 111, 115, and 112, or in the order of the output bumps 115, 111, and 112. For example, the output bumps 113, 114, and 116 may be aligned in the order of the output bumps 113, 116, and 114, or in the order of the output bumps 116, 113, and 114.

The low noise amplifier 33 is an example of the third low noise amplifier, and can amplify the signals of the AHR and the BHR. The bands AH and BH are a combination of bands signals of which are not simultaneously received. Therefore, the low noise amplifier 33 can be connected to the filter 100*g* including the AHR in the pass band and the filter 100*h* including the BHR in the pass band. In this manner, the input end of the low noise amplifier 33 is connected to the output bumps 117 and 118 with the switch 23B interposed therebetween.

The switch 20B is connected between the antenna connection terminal 200 and the composite filter component 12. The switch 21B is connected between the low noise amplifier 31 and the composite filter component 12. The switch 22B is connected between the low noise amplifier 32 and the composite filter component 12. The switch 23B is connected between the low noise amplifier 33 and the composite filter component 12.

The radio frequency module 1B according to the present modification example does not need to include at least one of the switches 20B to 23B and the inductors 41 to 46.

In the above-described configuration, on the input side of the composite filter component 12, the filters 100*b* (AMR), 100*d* (ALR), and 100*g* (AHR) configured to perform simultaneous reception are connected to the input bump 102, and the filters 100*a* (BMR), 100*c* (BLR), and 100*h* (BHR) configured to perform simultaneous reception are connected to the input bump 101. On the other hand, on the output side of the composite filter component 12, the output bump 114 connected to the filter 100*d* and the output bump 113 connected to the filter 100*c* are adjacent to each other, the output bump 112 connected to the filter 100*b* and the output bump 111 connected to the filter 100*a* are adjacent to each other, and the output bump 118 connected to the filter 100*g* and the output bump 117 connected to the filter 100*h* are adjacent to each other.

According to this configuration, assuming the filter 100*d* (to which the output bump 114 is connected), the filter 100*c* (to which the output bump 113 is connected), and the filter 100*f* (to which the output bump 116 is connected) which do not perform mutually simultaneous reception are connected to the low noise amplifier 32, the filter 100*b* (to which the output bump 112 is connected), the filter 100*a* (to which the output bump 111 is connected), and the filter 100*e* (to which the output bump 115 is connected) which do not perform mutually simultaneous reception are connected to the low noise amplifier 31, and the filter 100*g* (to which the output bump 118 is connected) and the filter 100*h* (to which the output bump 117 is connected) which do not perform mutually simultaneous reception are connected to the low noise amplifier 33, the filters 100*a* to 100*h* and the low noise amplifiers 31 to 33 can be connected without causing the intersection of the wires connecting the output bumps 111 to 118 and the low noise amplifiers 31 to 33. In this manner, it is possible to suppress the occurrence of the parasitic capacitance caused by the intersection of the wires, in the vicinity of the input ends of the low noise amplifiers 31 to 33. According to this configuration, the wires do not intersect in a region between the output bumps 111 to 118 and the low noise amplifiers 31 to 33. Therefore, the deterioration of the noise figure of the low noise amplifiers 31 to 33 can be suppressed, and the deterioration of the amplification characteristics on the output side of the composite filter component 12 can be suppressed.

For example, the band AL is Band 3 for LTE or n3 for 5GNR. For example, the band AM is Band 1 for LTE or n1 for 5GNR. For example, the band BL is Band 25 for LTE or n25 for 5GNR. For example, the band BM is Band 66 for LTE or n66 for 5GNR. For example, the band CL is Band 39 for LTE or n39 for 5GNR. For example, the band CM is Band 34 for LTE or n34 for 5GNR. For example, the band AH is Band 40 for LTE or n40 for 5GNR. For example, the band BH is Band 30 for LTE or n30 for 5GNR.

In the radio frequency module 1B according to the present modification example, the filter 100*g* or 100*h* does not need to be provided. In this case, in the disposition configuration of the output bumps, it is desirable that the output bumps 111, 112, and 115 are disposed adjacent to each other, the output bumps 113, 114, and 116 are disposed adjacent to each other, and the output bump 117 or 118 is disposed alone between the output bumps 111, 112, and 115 and the output bumps 113, 114, and 116.

1.10 Structure of Composite Filter Component 12A According to Example 6

Figure 7A:
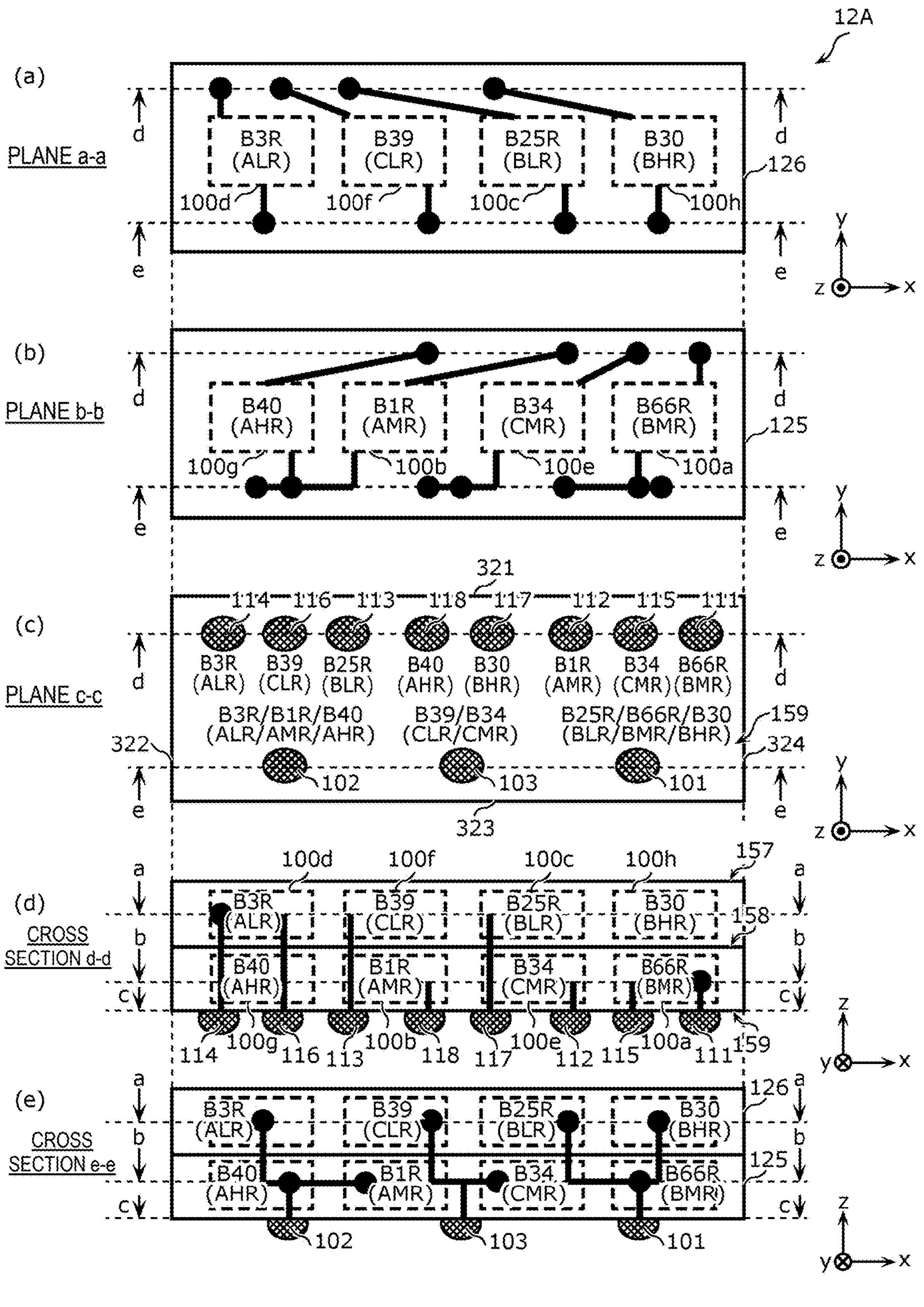
FIG. 7A is a plan view and a cross-sectional view of a composite filter component according to Example 6.

As a specific configuration example of the composite filter component 12 provided in the radio frequency module 1B according to Modification Example 2, a composite filter component 12A according to Example 6 will be described. FIG. 7A is a plan view and a cross-sectional view of the composite filter component 12A according to Example 6. FIG. 7A shows a disposition configuration example of each filter and each bump which form the composite filter component 12A. (a) of FIG. 7A is a view assuming a plane a-a is viewed from the positive side of the z-axis, (b) of FIG. 7A is a view assuming a plane b-b is viewed from the positive side of the z-axis, (c) of FIG. 7A is a view assuming a plane c-c is viewed from the positive side of the z-axis, (d) of FIG. 7A is a view assuming a cross section d-d is viewed from the negative side of the y-axis, and (e) of FIG. 7A is a view assuming a cross section e-e is viewed from the negative side of the y-axis. The plane a-a is a plane parallel to a main surface 157 and between the main surface and a facing main surface of a filter chip 126. In addition, the plane b-b is a plane parallel to a main surface 159 and between the main surface and a facing main surface of a filter chip 125. In addition, the plane c-c is the main surface 159. In addition, the cross section d-d is a plane perpendicular to the main surface 159 and passing through the output bumps 111 to 118. In addition, the cross section e-e is a plane perpendicular to the main surface 159 and passing through the input bumps 101 to 103.

The composite filter component 12A includes the filter chips 125 and 126 laminated on each other, and includes the main surface 159 (first main surface) and the main surface 157 (second main surface) which face each other. The filter chip 125 is an example of the first layer portion and includes the main surface 159 (first main surface), and the filters 100*a* (BMR), 100*b* (AMR), 100*e* (CMR), and 100*g* (AHR). The filter chip 126 is an example of the second layer portion, and includes the main surface 157 (second main surface), and the filters 100*c* (BLR), 100*d* (ALR), 100*f* (CLR), and 100*h* (BHR).

In the present example, the filter 100*d* is an example of the first filter, and is connected to the input bump 102 (first input bump) and the output bump 114 (first output bump). The filter 100*c* is an example of the second filter, and is connected to the input bump 101 (second input bump) and the output bump 113 (second output bump). The filter 100*b* is an example of the third filter, and is connected to the input bump 102 (first input bump) and the output bump 112 (third output bump). The filter 100*a* is an example of the fourth filter, and is connected to the input bump 101 (second input bump) and the output bump 111 (fourth output bump). The filter 100*f* is an example of the fifth filter, and is connected to the input bump 103 (third input bump) and the output bump 116 (fifth output bump). The filter 100*e* is an example of the sixth filter, and is connected to the input bump 103 (third input bump) and the output bump 115 (sixth output bump). The filter 100*g* is an example of the seventh filter, and is connected to the input bump 102 (first input bump) and the output bump 118 (seventh output bump). The filter 100*h* is an example of the eighth filter, and is connected to the input bump 101 (second input bump) and the output bump 117 (eighth output bump).

As shown in (c) of FIG. 7A, the composite filter component 12A has a rectangular shape assuming the main surface 159 is viewed in a plan view, and has outer edges 321 (first outer edge) and 323 (second outer edge) facing each other, and outer edges 322 and 324 facing each other. The composite filter component 12A may have a polygonal shape assuming the main surface 159 is viewed in a plan view.

The output bumps 111 to 118 are disposed on the main surface 159 in the first direction (x-axis negative direction) along the outer edge 321 in the order of the output bumps 111, 115, 112, 117, 118, 113, 116, and 114. On the other hand, the input bumps 101 to 103 are disposed on the main surface 159 in the first direction (x-axis negative direction) of a region between the output bumps 111 to 118 and the outer edge 323 in the order of the input bumps 101, 103, and 102.

According to this configuration, the wires do not intersect in a region between the output bumps 111 to 118 and the low noise amplifiers 31 to 33 disposed on the output side of the composite filter component 12A. Therefore, the deterioration of the noise figure of the low noise amplifiers 31 to 33 can be suppressed, and the deterioration of the amplification characteristics on the output side of the composite filter component 12A can be suppressed.

The output bumps 111 to 118 do not need to be linearly disposed in the first direction as shown in FIG. 7A. In the output bumps 111 to 118, in a region between the outer edge 321 and the input bumps 101 to 103, the output bumps 111, 112, and 115 may be disposed adjacent to each other, the output bumps 113, 114, and 116 may be disposed adjacent to each other, and the output bumps 117 and 118 may be disposed adjacent to each other.

The filters 100*c*, 100*d*, 100*f*, and 100*h* are disposed in the first direction (x-axis negative direction) in the order of the filters 100*h*, 100*c*, 100*f*, and 100*d*. The filters 100*a*, 100*b*, 100*e*, and 100*g* are disposed in the first direction (x-axis negative direction) in the order of the filters 100*a*, 100*e*, 100*b*, and 100*g*.

That is, in the composite filter component 12A according to the present example, the three filters 100*a*, 100*c*, and 100*h* which perform simultaneous reception are disposed close to the input bump 101, the three filters 100*b*, 100*d*, and 100*g* which perform simultaneous reception are disposed close to the input bump 102, and the two filters 100*e* and 100*f* which perform simultaneous reception are disposed close to the input bump 103. In this manner, the close contact and the intersection between the wire connected to the input bump 101, the wire connected to the input bump 102, and the wire connected to the input bump 103 are suppressed.

According to the above-described disposition configuration, the wire connecting the input bump 101 and the filters 100*a*, 100*c*, and 100*h*, the wire connecting the input bump 102 and the filters 100*b*, 100*d*, and 100*g*, and the wire connecting the input bump 103 and the filters 100*e* and 100*f* do not intersect inside the filter chip 125, and do not intersect inside the filter chip 126 (refer to (a), (b), and (e) of FIG. 7A). In addition, the wire connecting the output bump 111 and the filter 100*a*, the wire connecting the output bump 112 and the filter 100*b*, the wire connecting the output bump 113 and the filter 100*c*, the wire connecting the output bump 114 and the filter 100*d*, the wire connecting the output bump 115 and the filter 100*e*, the wire connecting the output bump 116 and the filter 100*f*, the wire connecting the output bump 117 and the filter 100*h*, and the wire connecting the output bump 118 and the filter 100*g* do not intersect inside the filter chip 125, and do not intersect inside the filter chip 126 (refer to (a), (b), and (d) of FIG. 7A).

That is, inside the composite filter component 12A, the wire connecting the input bump and the filter does not intersect inside the filter chip, and the wire connecting the output bump and the filter does not intersect inside the filter chip. In this manner, the deterioration of the noise figure of the low noise amplifiers 31 to 33 disposed on the output side of the composite filter component 12A can be further suppressed, and the isolation between the filters 100*a* to 100*h* inside the composite filter component 12A can be improved. Therefore, the composite filter component 12A can transmit the reception signal of the band AL, the reception signal of the band AM, and the reception signal of the band AH, which simultaneously pass therethrough, with a low loss, can transmit the reception signal of the band BL, the reception signal of the band BM, and the reception signal of the band BH, which simultaneously pass therethrough, with a low loss, and can transmit the reception signal of the band CL and the reception signal of the band CM, which simultaneously pass therethrough, with a low loss.

1.11 Structure of Composite Filter Component 12B According to Example 7

Figure 7B:
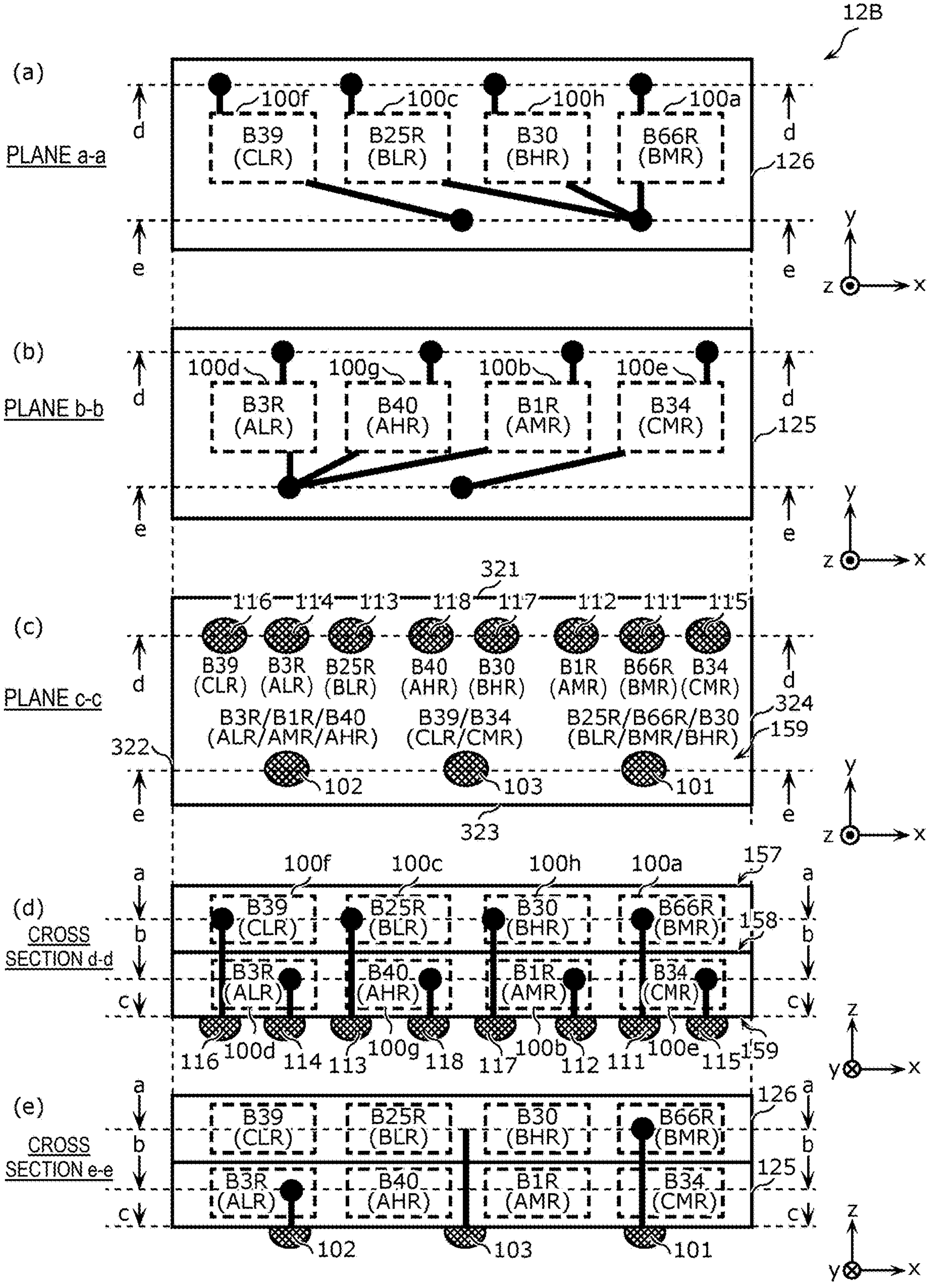
FIG. 7B is a plan view and a cross-sectional view of a composite filter component according to Example 7.

As a specific configuration example of the composite filter component 12 provided in the radio frequency module 1B according to Modification Example 2, a composite filter component 12B according to Example 7 will be described. FIG. 7B is a plan view and a cross-sectional view of the composite filter component 12B according to Example 7. In the composite filter component 12B according to the present example, the disposition configuration of each filter provided in the filter chips 125 and 126 is different from that of the composite filter component 12A according to Example 6. Hereinafter, the composite filter component 12B according to the present example will be described, and the same configurations as those of the composite filter component 12A according to Example 6 will be omitted in the description. Different configurations will be mainly described.

The composite filter component 12B includes the filter chips 125 and 126 laminated on each other, and includes the main surface 159 (first main surface) and the main surface 157 (second main surface) which face each other. The filter chip 125 is an example of the first layer portion, and includes the main surface 159 (first main surface), and the filters 100*b* (AMR), 100*d* (ALR), 100*e* (CMR), and 100*g* (AHR). The filter chip 126 is an example of the second layer portion, and includes the main surface 157 (second main surface), and the filters 100*a* (BMR), 100*c* (BLR), 100*f* (CLR), and 100*h* (BHR).

As shown in (c) of FIG. 7B, the composite filter component 12B has a rectangular shape assuming the main surface 159 is viewed in a plan view, and has outer edges 321 (first outer edge) and 323 (second outer edge) facing each other, and outer edges 322 and 324 facing each other. The composite filter component 12B may have a polygonal shape assuming the main surface 159 is viewed in a plan view.

The output bumps 111 to 118 are disposed on the main surface 159 in the first direction (x-axis negative direction) along the outer edge 321 in the order of the output bumps 115, 111, 112, 117, 118, 113, 114, and 116. On the other hand, the input bumps 101 to 103 are disposed on the main surface 159 in the first direction (x-axis negative direction) of a region between the output bumps 111 to 118 and the outer edge 323 in the order of the input bumps 101, 103, and 102.

According to this configuration, the wires do not intersect in a region between the output bumps 111 to 118 and the low noise amplifiers 31 to 33 disposed on the output side of the composite filter component 12B. Therefore, the deterioration of the noise figure of the low noise amplifiers 31 to 33 can be suppressed, and the deterioration of the amplification characteristics on the output side of the composite filter component 12B can be suppressed.

The output bumps 111 to 118 do not need to be linearly disposed in the first direction as shown in FIG. 7B. In the output bumps 111 to 118, in a region between the outer edge 321 and the input bumps 101 to 103, the output bumps 111, 112, and 115 may be disposed adjacent to each other, the output bumps 113, 114, and 116 may be disposed adjacent to each other, and the output bumps 117 and 118 may be disposed adjacent to each other.

The filters 100*a*, 100*c*, 100*f*, and 100*h* are disposed in the first direction (x-axis negative direction) in the order of the filters 100*a*, 100*h*, 100*c*, and 100*f*. The filters 100*b*, 100*d*, 100*e*, and 100*g* are disposed in the first direction (x-axis negative direction) in the order of the filters 100*e*, 100*b*, 100*g*, and 100*d*.

That is, in the composite filter component 12B according to the present example, the three filters 100*a*, 100*c*, and 100*h* which perform simultaneous reception are disposed in the filter chip 126, and the three filters 100*b*, 100*d*, and 100*g* which perform simultaneous reception are disposed in the filter chip 125. In addition, the three filters 100*a*, 100*b*, and 100*e* which do not perform mutually simultaneous reception are disposed together on a side in the x-axis positive direction, and the three filters 100*c*, 100*d*, and 100*f* which do not perform mutually simultaneous reception are disposed together on a side in the x-axis negative direction. In this manner, the filter and the output bump connected to the filter are brought close to each other to suppress the intersection of the wires connected to the respective output bumps.

In addition, assuming the band AL is Band 3 for LTE or n3 for 5GNR, the band AM is Band 1 for LTE or n1 for 5GNR, the band BL is Band 25 for LTE or n25 for 5GNR, the band BM is Band 66 for LTE or n66 for 5GNR, the band AH is Band 40 for LTE or n40 for 5GNR, and the band BH is Band 30 for LTE or n30 for 5GNR, the frequency range including the ALR, the AMR, and the AHR is wider than the frequency range including the BLR, the BMR, and the BHR. Assuming a plurality of signals are simultaneously received, as the above-described frequency range is wider, a so-called bundling loss is greater. In addition, assuming the filter chips 125 and 126 are compared with each other, the connection wire of the filter chip 125 disposed closer to the input bump can be shortened. From this viewpoint as well, the filters 100*b*, 100*d*, and 100*g* are disposed in the filter chip 125, and the filters 100*a*, 100*c*, and 100*h* are disposed in the filter chip 126. In this manner, the bundling loss of the composite filter component 12B can be reduced.

In addition, assuming the signals of the plurality of bands are simultaneously received, the bundling loss increases in the band on a low frequency side. From this viewpoint, in the filter chip 125, in the filters 100*b*, 100*d*, and 100*g* connected to the input bump 102, the filter 100*d* is disposed closest to the input bump 102. In this manner, the bundling loss of the composite filter component 12B can be reduced.

According to the above-described disposition configuration, the wire connecting the input bump 101 and the filters 100*a*, 100*c*, and 100*h*, the wire connecting the input bump 102 and the filters 100*b*, 100*d*, and 100*g*, and the wire connecting the input bump 103 and the filters 100*e* and 100*f* do not intersect inside the filter chip 125, and do not intersect inside the filter chip 126 (refer to (a), (b), and (e) of FIG. 7B). In addition, the wire connecting the output bump 111 and the filter 100*a*, the wire connecting the output bump 112 and the filter 100*b*, the wire connecting the output bump 113 and the filter 100*c*, the wire connecting the output bump 114 and the filter 100*d*, the wire connecting the output bump 115 and the filter 100_e_, the wire connecting the output bump 116 and the filter 100_f_, the wire connecting the output bump 117 and the filter 100_h_, and the wire connecting the output bump 118 and the filter 100_g_ do not intersect inside the filter chip 125, and do not intersect inside the filter chip 126 (refer to (a), (b), and (d) of FIG. 7B).

That is, inside the composite filter component 12B, the wire connecting the input bump and the filter does not intersect inside the filter chip, and the wire connecting the output bump and the filter does not intersect inside the filter chip. In this manner, the deterioration of the noise figure of the low noise amplifiers 31 to 33 disposed on the output side of the composite filter component 12B can be further suppressed, and the isolation between the filters 100_a_ to 100_h_ inside the composite filter component 12B can be improved. Therefore, the composite filter component 12B can transmit the reception signal of the band AL, the reception signal of the band AM, and the reception signal of the band AH, which simultaneously pass therethrough, with a low loss, can transmit the reception signal of the band BL, the reception signal of the band BM, and the reception signal of the band BH, which simultaneously pass therethrough, with a low loss, and can transmit the reception signal of the band CL, and the reception signal of the band CM which simultaneously pass therethrough, with a low loss.

In the composite filter component 12B according to the present example, the filters 100_e_ and 100_f_ do not need to be provided. In this case, the filter chip 125 includes the filters 100_b_, 100_d_, and 100_g_, and the filter chip 126 includes the filters 100_a_, 100_c_, and 100_h_. The filters 100_a_, 100_c_, and 100_h_ are disposed in the first direction in the order of the filters 100_a_, 100_h_, and 100_c_, and the filters 100_b_, 100_d_, and 100_g_ are disposed in the first direction in the order of the filters 100_b_, 100_g_, and 100_d_. In addition, the input bump 103, and the output bumps 117 and 118 are deleted, and the output bumps 111 to 116 are disposed on the main surface 159 in the first direction in the order of the output bumps 115, 111, 112, 113, 114, and 116. On the other hand, the input bumps 101 and 102 are disposed on the main surface 159 in the first direction of a region between the output bumps 111 to 116 and the outer edge 323 in the order of the input bumps 101 and 102.

1.12 Configuration of Radio Frequency Module 1C According to Modification Example 3

Figure 8A:
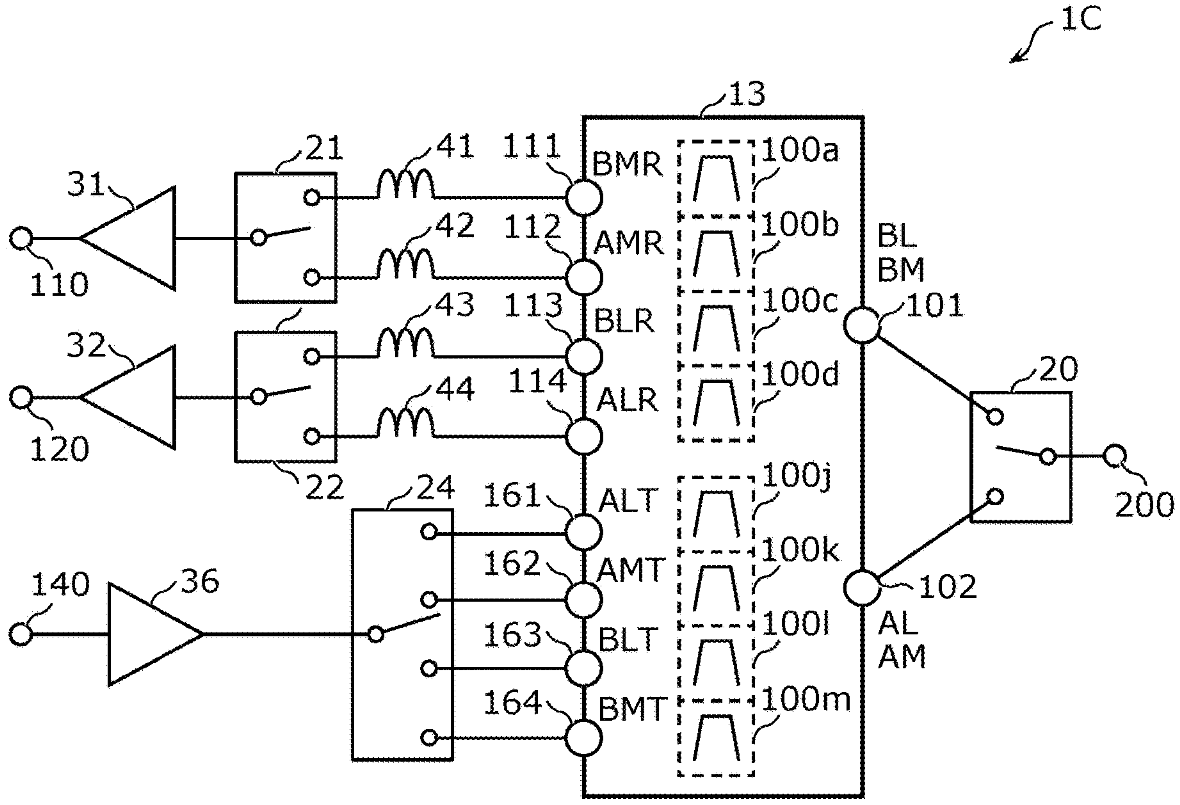
FIG. 8A is a circuit configuration diagram of a radio frequency module according to Modification Example 3 of Embodiment 1.

FIG. 8A is a circuit configuration diagram of a radio frequency module 1C according to Modification Example 3 of Embodiment 1. As shown in FIG. 8A, the radio frequency module 1C according to the present modification example includes a composite filter component 13, low noise amplifiers 31 and 32, a power amplifier 36, switches 20, 21, 22, and 24, inductors 41 to 44, an antenna connection terminal 200, signal output terminals 110 and 120, and a signal input terminal 140. The radio frequency module 1C according to the present modification example is different from the radio frequency module 1 according to Embodiment 1 in that a transmission circuit is added. Hereinafter, the radio frequency module 1C according to the present modification example will be described, and the same configurations as those of the radio frequency module 1 according to Embodiment 1 will be omitted in the description. Different configurations will be mainly described.

The composite filter component 13 includes the filters 100_a_, 100_b_, 100_c_, 100_d_, 100_j_, 100_k_, 100_l_, and 100_m_, the input bumps 101, 102, 161, 162, 163, and 164, and the output bumps 111, 112, 113, and 114.

Since the filters 100_a_ to 100_d_ have the same configurations as those of the filters 100_a_ to 100_d_ provided in the composite filter component 10 according to Embodiment 1, description thereof will be omitted.

The filter 100_j_ has a pass band including a transmission band (ALT) of the band AL. The filter 100_k_ has a pass band including a transmission band (BLT) of the band BL. The filter 100_l_ has a pass band including a transmission band (AMT) of the band AM. The filter 100_m_ has a pass band including a transmission band (BMT) of the band BM.

The signal of the band AL (first band) and the signal of the band AM (third band) can be simultaneously transmitted and received, and the signal of the band BL (second band) and the signal of the band BM (fourth band) can be simultaneously transmitted and received.

The input bump 102 is an example of the first input bump, and is connected to the input end of the filter 100_d_, the input end of the filter 100_b_, the output end of the filter 100_j_, and the output end of the filter 100_l_. The input bump 101 is an example of the second input bump, and is connected to the input end of the filter 100_c_, the input end of the filter 100_a_, the output end of the filter 100_k_, and the output end of the filter 100_m_.

In the output bumps 111 to 114, the output bump 111 and the output bump 112 are disposed adjacent to each other, and the output bump 113 and the output bump 114 are disposed adjacent to each other.

The input bump 161 is connected to the input end of the filter 100_j_. The input bump 162 is connected to the input end of the filter 100_l_. The input bump 163 is connected to the input end of the filter 100_k_. The input bump 164 is connected to the input end of the filter 100_m_.

The power amplifier 36 can amplify the signals of the ALT, the AMT, the BLT, and the BMT.

The switch 20 is connected between the antenna connection terminal 200 and the composite filter component 13. The switch 21 is connected between the low noise amplifier 31 and the composite filter component 13. The switch 22 is connected between the low noise amplifier 32 and the composite filter component 13. The switch 24 is connected between the power amplifier 36 and the composite filter component 13.

The radio frequency module 1C according to the present modification example does not need to include at least one of the switches 20 to 22, 24, and the inductors 41 to 44.

According to the above-described configuration, assuming the filter 100_d_ (to which the output bump 114 is connected) and the filter 100_c_ (to which the output bump 113 is connected) which do not perform mutually simultaneous reception are connected to the low noise amplifier 32, and the filter 100_b_ (to which the output bump 112 is connected) and the filter 100_a_ (to which the output bump 111 is connected) which do not perform mutually simultaneous reception are connected to the low noise amplifier 31, the filters 100_a_ to 100_d_ and the low noise amplifiers 31 and 32 can be connected without causing the intersection of the wires connecting the output bumps 111 to 114 and the low noise amplifiers 31 and 32. In this manner, it is possible to suppress the occurrence of the parasitic capacitance caused by the intersection of the wires, in the vicinity of the input ends of the low noise amplifiers 31 and 32. Therefore, the deterioration of the noise figure of the low noise amplifiers 31 and 32 can be suppressed, and the deterioration of the amplification characteristics on the output side of the composite filter component 13 can be suppressed.

Figure 8B:
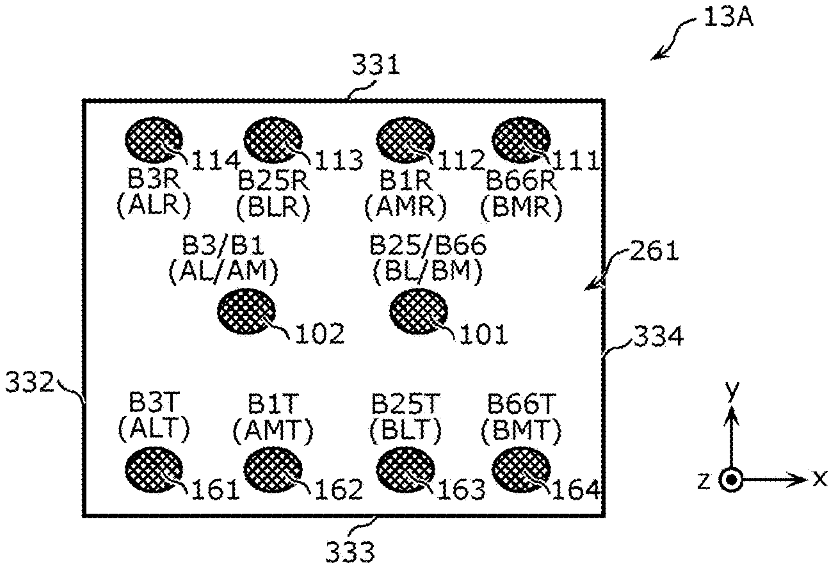
FIG. 8B is a plan view of a composite filter component according to Example 8.

Next, as a specific configuration example of the composite filter component 13 provided in the radio frequency module 1C according to Modification Example 3, a composite filter component 13A according to Example 8 will be described. FIG. 8B is a plan view of the composite filter component 13A according to Example 8.

As shown in FIG. 8B, the composite filter component 13A has a rectangular shape assuming the main surface 261 is viewed in a plan view, and has outer edges 331 and 333 facing each other and outer edges 332 and 334 facing each other. The composite filter component 13A may have a polygonal shape assuming the main surface 261 is viewed in a plan view.

The output bumps 111 to 114 are disposed on the main surface 261 in the first direction (x-axis negative direction) along the outer edge 331 in the order of the output bumps 111, 112, 113, and 114. On the other hand, the input bumps 101 and 102 are disposed on the main surface 261 in the first direction (x-axis negative direction) of a region between the output bumps 111 to 114 and the outer edge 333 in the order of the input bumps 101 and 102. Furthermore, the input bumps 161 to 164 are disposed on the main surface 261 in the first direction (x-axis negative direction) of the region between the input bumps 101 and 102 and the outer edge 333 in the order of the input bumps 164, 163, 162, and 161.

According to this configuration, the wires do not intersect in a region between the output bumps 111 to 114 and the low noise amplifiers 31 and 32 disposed on the output side of the composite filter component 13A. Therefore, the deterioration of the noise figure of the low noise amplifiers 31 and 32 can be suppressed, and the deterioration of the amplification characteristics on the output side of the composite filter component 13A can be suppressed.

In addition, since the input bumps 161 to 164 through which the transmission signal passes are disposed away from the output bumps 111 to 114 through which only the reception signal passes, the isolation between transmission and reception can be secured.

The output bumps 111 to 114 do not need to be linearly disposed in the first direction as shown in FIG. 8B. In the output bumps 111 to 114, in a region between the outer edge 331 and the input bumps 101 and 102, the output bumps 111 and 112 may be disposed adjacent to each other, and the output bumps 113 and 114 may be disposed adjacent to each other.

In Modification Example 3 and Example 8, for example, the band AL is Band 3 for LTE or n3 for 5GNR. For example, the band AM is Band 1 for LTE or n1 for 5GNR. For example, the band BL is Band 25 for LTE or n25 for 5GNR. For example, the band BM is Band 66 for LTE or n66 for 5GNR.

In this case, the frequencies of the ALT (B3T) and the BMT (B66T) partially overlap each other. In contrast, as shown in FIG. 8B, the input bumps 162 and 163 through which the signals of the AMT and the BLT having the frequencies not overlapping the frequencies of the ALT and the BMT pass are disposed between the input bump 161 through which the signal of the ALT passes and the input bump 164 through which the signal of the BMT passes.

According to this configuration, the isolation between the wires connecting the input bumps 161 to 164 and the power amplifier 36 can be secured.

1.13 Configuration of Radio Frequency Module 1D According to Modification Example 4

Figure 9A:
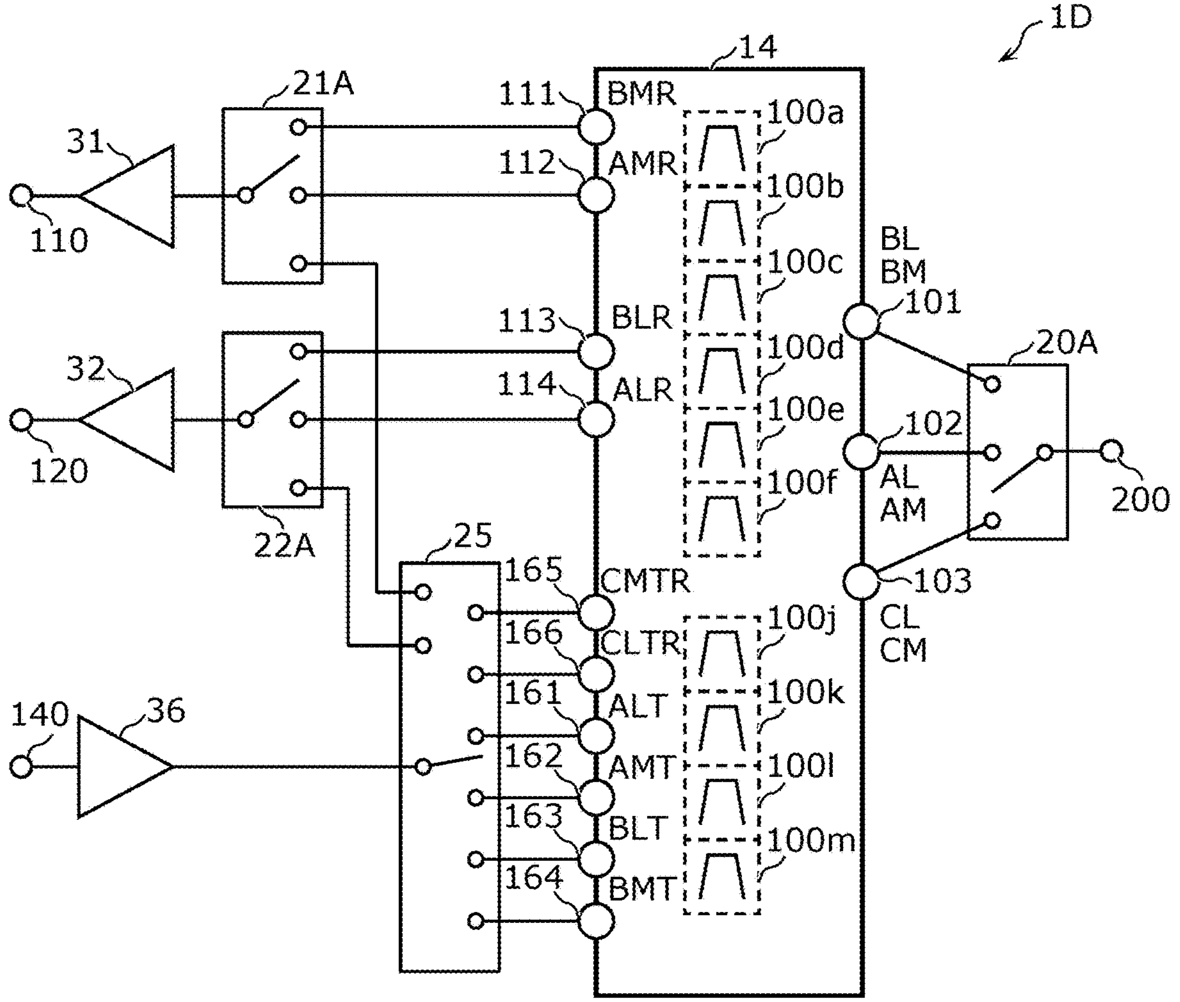
FIG. 9A is a circuit configuration diagram of a radio frequency module according to Modification Example 4 of Embodiment 1.

FIG. 9A is a circuit configuration diagram of a radio frequency module 1D according to Modification Example 4 of Embodiment 1. As shown in FIG. 9A, the radio frequency module 1D according to the present modification example includes the composite filter component 14, the low noise amplifiers 31 and 32, the power amplifier 36, the switches 20A, 21A, 22A, and 25, the antenna connection terminal 200, the signal output terminals 110 and 120, and the signal input terminal 140. The radio frequency module 1D according to the present modification example is different from the radio frequency module 1C according to Modification Example 3 in that the composite filter component 14 includes a filter for TDD. Hereinafter, the radio frequency module 1D according to the present modification example will be described, and the same configurations as those of the radio frequency module 1C according to Modification Example 3 will be omitted in the description. Different configurations will be mainly described.

The composite filter component 14 includes the filters 100*a*, 100*b*, 100*c*, 100*d*, 100*e*, 100*f*, 100*j*, 100*k*, 100*l*, and 100*m*, the input bumps 101, 102, 103, 161, 162, 163, and 164, the output bumps 111, 112, 113, and 114, and the input/output bumps 165 and 166.

Since the filters 100*a* to 100*d* and 100*j* to 100*m* have the same configurations as those of the filters 100*a* to 100*d* and 100*j* to 100*m* provided in the composite filter component 13 according to Modification Example 3, description thereof will be omitted.

The filter 100*f* has a fifth pass band including a transmission band and a reception band (CLTR) of the band CL (fifth band). The filter 100*e* has a sixth pass band including a transmission band and a reception band (CMTR) of the band CM (sixth band). The filters 100*f* and 100*e* are filters for TDD which cause the transmission signal and the reception signal to pass therethrough in time division.

The signal of the band AL (first band) and the signal of the band AM (third band) can be simultaneously transmitted and received, the signal of the band BL (second band) and the signal of the band BM (fourth band) can be simultaneously transmitted and received, and the signal of the band CL (fifth band) and the signal of the band CM (sixth band) can be simultaneously transmitted, and can be simultaneously received.

The input bump 102 is an example of the first input bump, and is connected to the input end of the filter 100*d*, the input end of the filter 100*b*, the output end of the filter 100*j*, and the output end of the filter 100*l*. The input bump 101 is an example of the second input bump, and is connected to the input end of the filter 100*c*, the input end of the filter 100*a*, the output end of the filter 100*k*, and the output end of the filter 100*m*. The input bump 103 is an example of the third input bump, and is connected to one end of the filter 100*e* and one end of the filter 100*f*.

In the output bumps 111 to 114, the output bump 111 and the output bump 112 are disposed adjacent to each other, and the output bump 113 and the output bump 114 are disposed adjacent to each other.

The input bump 161 is connected to the input end of the filter 100*j*. The input bump 162 is connected to the input end of the filter 100*l*. The input bump 163 is connected to the input end of the filter 100*k*. The input bump 164 is connected to the input end of the filter 100*m*.

The input/output bump 165 is an example of the sixth output bump, and is connected to the other end of the filter 100*e*. The input/output bump 166 is an example of the fifth output bump, and is connected to the other end of the filter 100*f*.

The power amplifier 36 can amplify the signals of the ALT, the AMT, the BLT, the BMT, the CLTR, and the CMTR.

The switch 20A is connected between the antenna connection terminal 200 and the composite filter component 14. The switch 21A is connected between the low noise amplifier 31 and the composite filter component 14. The switch 22A is connected between the low noise amplifier 32 and the composite filter component 14. The switch 25 is connected between the power amplifier 36 and the composite filter component 14.

The radio frequency module 1D according to the present modification example does not need to include at least one of the switches 20A to 22A and 25.

According to the above-described configuration, assuming the filter 100*d* (to which the output bump 114 is connected) and the filter 100*c* (to which the output bump 113 is connected) which do not perform simultaneous reception are connected to the low noise amplifier 32, and the filter 100*b* (to which the output bump 112 is connected) and the filter 100*a* (to which the output bump 111 is connected) which do not perform simultaneous reception are connected to the low noise amplifier 31, the filters 100*a* to 100*d* and the low noise amplifiers 31 and 32 can be connected without causing the intersection of the wires connecting the output bumps 111 to 114 and the low noise amplifiers 31 and 32. In this manner, it is possible to suppress the occurrence of the parasitic capacitance caused by the intersection of the wires, in the vicinity of the input ends of the low noise amplifiers 31 and 32. Therefore, the deterioration of the noise figure of the low noise amplifiers 31 and 32 can be suppressed, and the deterioration of the amplification characteristics on the output side of the composite filter component 14 can be suppressed.

Figure 9B:
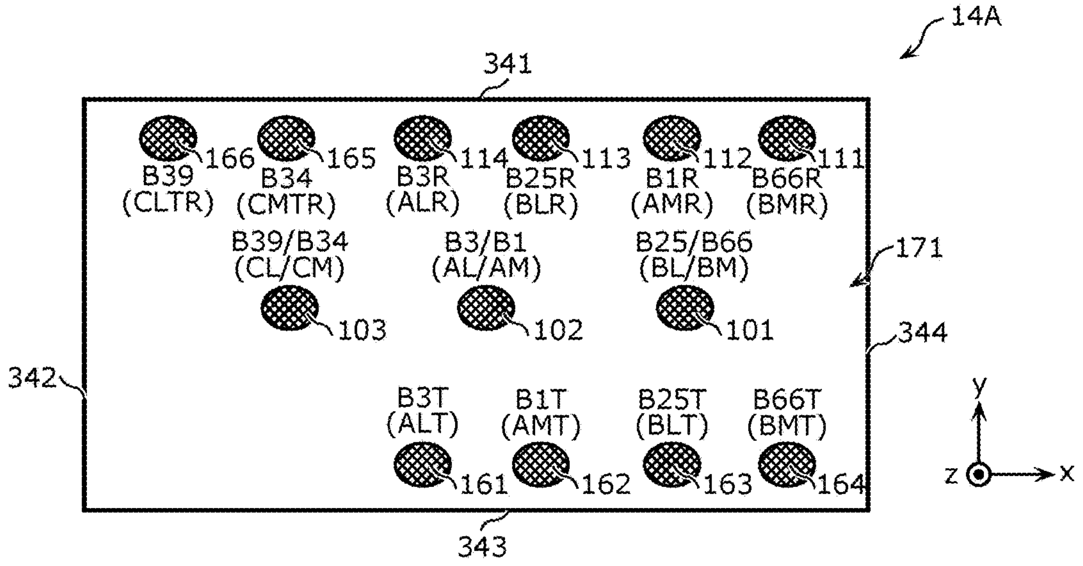
FIG. 9B is a plan view of a composite filter component according to Example 9.

Next, as a specific configuration example of the composite filter component 14 provided in the radio frequency module 1D according to Modification Example 4, a composite filter component 14A according to Example 9 will be described. FIG. 9B is a plan view of the composite filter component 14A according to Example 9.

As shown in FIG. 9B, the composite filter component 14A has a rectangular shape assuming the main surface 171 is viewed in a plan view, and has outer edges 341 and 343 facing each other and outer edges 342 and 344 facing each other. The composite filter component 14A may have a polygonal shape assuming the main surface 171 is viewed in a plan view.

The output bumps 111 to 114 and the input/output bumps 165 and 166 are disposed on the main surface 171 in the first direction (x-axis negative direction) along the outer edge 341 in the order of the output bumps 111, 112, 113, and 114, and the input/output bumps 165 and 166. On the other hand, the input bumps 101 to 103 are disposed on the main surface 171 in the first direction (x-axis negative direction) of a region between the output bumps 111 to 114, the input/output bumps 165 and 166, and the outer edge 343 in the order of the input bumps 101, 102, and 103. Furthermore, the input bumps 161 to 164 are disposed on the main surface 171 in the first direction (x-axis negative direction) of a region between the input bumps 101 to 103 and the outer edge 343 in the order of the input bumps 164, 163, 162, and 161.

According to this configuration, the wire connecting the output bumps 111 to 114 to the low noise amplifiers 31 and 32 does not intersect in a region between the output bumps 111 to 114 and the low noise amplifiers 31 and 32 disposed on the output side of the composite filter component 14A. Therefore, assuming the reception signal of the band AL and the reception signal of the band AM are simultaneously received, and assuming the reception signal of the band BL and the reception signal of the band BM are simultaneously received, the deterioration of the noise figure of the low noise amplifiers 31 and 32 can be suppressed, and the deterioration of the amplification characteristics on the output side of the composite filter component 14A can be suppressed.

In addition, since the input bumps 161 to 164 and the input/output bumps 165 and 166 through which the transmission signals pass are disposed away from the output bumps 111 to 114 through which only the reception signal passes, the isolation between transmission and reception can be secured.

The output bumps 111 to 114 do not need to be linearly disposed in the first direction as shown in FIG. 9B. In the output bumps 111 to 114, in a region between the outer edge 341 and the input bumps 101 to 103, the output bumps 111 and 112 may be disposed adjacent to each other, and the output bumps 113 and 114 may be disposed adjacent to each other.

In addition, in the composite filter component 14A according to the present example, the filters 100*j* to 100*m* do not need to be provided. In this case, in the disposition configuration of the input bumps and the output bumps shown in FIG. 9B, the input bumps 161 to 164 may be deleted, and the disposition configuration of the input bumps 101 to 103, the output bumps 111 to 114, and the input/output bumps 165 and 166 is not changed.

In Modification Example 4 and Example 9, for example, the band AL is Band 3 for LTE or n3 for 5GNR. For example, the band AM is Band 1 for LTE or n1 for 5GNR. For example, the band BL is Band 25 for LTE or n25 for 5GNR. For example, the band BM is Band 66 for LTE or n66 for 5GNR. For example, the band CL is Band 39 for LTE or n39 for 5GNR. For example, the band CM is Band 34 for LTE or n34 for 5GNR.

In this case, the frequencies of the ALT (B3T) and the BMT (B66T) partially overlap each other. In contrast, as shown in FIG. 9B, the input bumps 162 and 163 through which the signals of the AMT and the BLT having frequencies not overlapping the frequencies of the ALT and the BMT pass are disposed between the input bump 161 through which the signal of the ALT passes and the input bump 164 through which the signal of the BMT passes.

According to this configuration, the isolation between the wires connecting the input bumps 161 to 164 and the power amplifier 36 can be secured.

1.14 Configuration of Radio Frequency Module 1E According to Modification Example 5

Figure 10A:
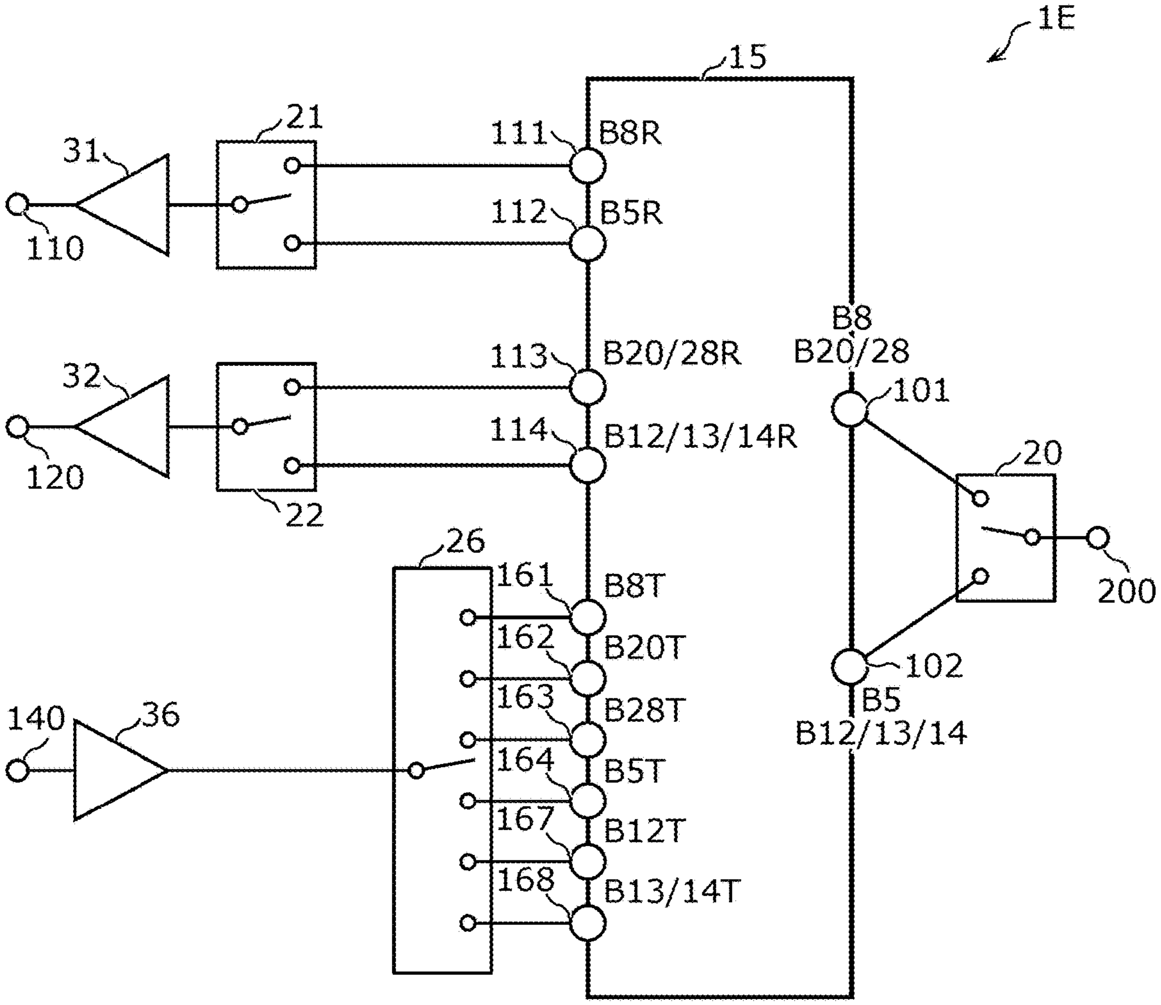
FIG. 10A is a circuit configuration diagram of a radio frequency module according to Modification Example 5 of Embodiment 1.

FIG. 10A is a circuit configuration diagram of a radio frequency module 1E according to Modification Example 5 of Embodiment 1. As shown in FIG. 10A, the radio frequency module 1E according to the present modification example includes a composite filter component 15, the low noise amplifiers 31 and 32, the power amplifier 36, the switches 20, 21, 22, and 26, the antenna connection terminal 200, the signal output terminals 110 and 120, and the signal input terminal 140. The radio frequency module 1E according to the present modification example is different from the radio frequency module 1C according to Modification Example 3 in that the number of the input bumps connected to the transmission filter provided in the composite filter component 15 is large. Hereinafter, the radio frequency module 1E according to the present modification example will be described, and the same configurations as those of the radio frequency module 1C according to Modification Example 3 will be omitted in the description. Different configurations will be mainly described.

The composite filter component 15 includes the filters 100*a*, 100*b*, 100*c*, 100*d*, 100*j*, 100*k*, 100*l*, 100*m*, 100*n*, and 100*p* (not shown), the input bumps 101, 102, 161, 162, 163, 164, 167, and 168, and the output bumps 111, 112, 113, and 114.

The filter 100*d* (ALR) is connected to the input bump 102 and the output bump 114. The filter 100*c* (BLR) is connected to the input bump 101 and the output bump 113. The filter 100*b* (AMR) is connected to the input bump 102 and the output bump 112. The filter 100*a* (BMR) is connected to the input bump 101 and the output bump 111.

The filter 100*j* (A1T) is connected to the input bumps 102 and 168. The filter 100*k* (A2T) is connected to the input bumps 102 and 167. The filter 100*l* (A3T) is connected to the input bumps 102 and 164. The filter 100*m* (A4T) is connected to the input bumps 101 and 163. The filter 100*n* (A5T) is connected to the input bumps 101 and 162. The filter 100*p* (A6T) is connected to the input bumps 101 and 161.

In the composite filter component 15A according to the present modification example and Example 10 (to be described later), for example, the ALR is a co-band including the reception band of Band 12, Band 13, and Band 14 for LTE or a co-band including the reception band of n12, n13, and n14 for 5GNR. For example, the AMR is the reception band of Band 5 for LTE or the reception band of n5 for 5GNR. For example, the BLR is a co-band including the reception band of Band 20 and Band 28 for LTE or a co-band including the reception band of n20 and n28 for 5GNR. For example, the BMR is the reception band of Band 8 for LTE or n8 for 5GNR.

For example, the A1T is a co-band including the transmission band of Band 13 and Band 14 for LTE or a co-band including the transmission band of n13 and n14 for 5GNR. For example, the A2T is the transmission band of Band 12 for LTE or the transmission band of n12 for 5GNR. For example, the A3T is the transmission band of Band 5 for LTE or the transmission band of n5 for 5GNR. For example, the A4T is the transmission band of Band 28 for LTE or the transmission band of n28 for 5GNR. For example, the A5T is the transmission band of Band 20 for LTE or the transmission band of n20 for 5GNR. For example, the A6T is the transmission band of Band 8 for LTE or the transmission band of n8 for 5GNR.

The signal of the ALR and the signal of the AMR can be simultaneously received, and the signal of the BLR and the signal of the BMR can be simultaneously received.

The input bump 102 is an example of the first input bump, and is connected to the input end of the filter 100*d*, the input end of the filter 100*b*, the output end of the filter 100*j*, the output end of the filter 100*k*, and the output end of the filter 100*l*. The input bump 101 is an example of the second input bump, and is connected to the input end of the filter 100*c*, the input end of the filter 100*a*, the output end of the filter 100*m*, the output end of the filter 100*n*, and the output end of the filter 100*p*.

In the output bumps 111 to 114, the output bump 111 and the output bump 112 are disposed adjacent to each other, and the output bump 113 and the output bump 114 are disposed adjacent to each other.

The power amplifier 36 can amplify the signals of the A1T to A6T.

The switch 26 is connected between the power amplifier 36 and the composite filter component 15. The radio frequency module 1E according to the present modification example does not need to include at least one of the switches 20 to 22 and 26.

According to the above-described configuration, assuming the filter 100*d* (to which the output bump 114 is connected) and the filter 100*c* (to which the output bump 113 is connected) which do not perform mutually simultaneous reception are connected to the low noise amplifier 32, and the filter 100*b* (to which the output bump 112 is connected) and the filter 100*a* (to which the output bump 111 is connected) which do not perform mutually simultaneous reception are connected to the low noise amplifier 31, the filters 100*a* to 100*d* and the low noise amplifiers 31 and 32 can be connected without causing the intersection of the wires connecting the output bumps 111 to 114 and the low noise amplifiers 31 and 32. In this manner, it is possible to suppress the occurrence of the parasitic capacitance caused by the intersection of the wires, in the vicinity of the input ends of the low noise amplifiers 31 and 32. Therefore, the deterioration of the noise figure of the low noise amplifiers 31 and 32 can be suppressed, and the deterioration of the amplification characteristics on the output side of the composite filter component 15 can be suppressed.

Figure 10B:
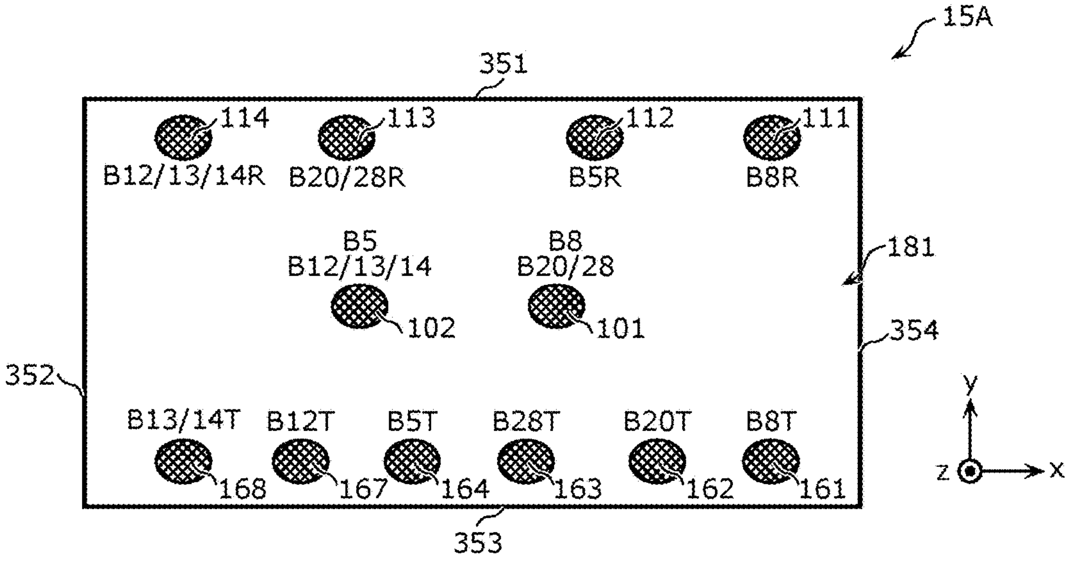
FIG. 10B is a plan view of a composite filter component according to Example 10.

Next, as a specific configuration example of the composite filter component 15 provided in the radio frequency module 1E according to Modification Example 5, a composite filter component 15A according to Example 10 will be described. FIG. 10B is a plan view of the composite filter component 15A according to Example 10.

As shown in FIG. 10B, the composite filter component 15A has a rectangular shape assuming the main surface 181 is viewed in a plan view, and has outer edges 351 and 353 facing each other and outer edges 352 and 354 facing each other. The composite filter component 15A may have a polygonal shape assuming the main surface 181 is viewed in a plan view.

The output bumps 111 to 114 are disposed on the main surface 181 in the first direction (x-axis negative direction) along the outer edge 351 in the order of the output bumps 111, 112, 113, and 114. On the other hand, the input bumps 101 and 102 are disposed on the main surface 181 in the first direction (x-axis negative direction) of a region between the output bumps 111 to 114 and the outer edge 353 in the order of the input bumps 101 and 102. Furthermore, the input bumps 161 to 164, 167, and 168 are disposed on the main surface 181 in the first direction (x-axis negative direction) of a region between the input bumps 101 and 102 and the outer edge 353 in the order of the input bumps 161, 162, 163, 164, 167, and 168.

According to this configuration, the wires do not intersect in a region between the output bumps 111 to 114 and the low noise amplifiers 31 and 32 disposed on the output side of the composite filter component 15A. Therefore, the deterioration of the noise figure of the low noise amplifiers 31 and 32 can be suppressed, and the deterioration of the amplification characteristics on the output side of the composite filter component 15A can be suppressed.

In addition, since the input bumps 161 to 164, 167 and 168 through which the transmission signals pass are disposed away from the output bumps 111 to 114 through which only the reception signal passes, the isolation between transmission and reception can be secured.

The output bumps 111 to 114 do not need to be linearly disposed in the first direction as shown in FIG. 10B. In the output bumps 111 to 114, in a region between the outer edge 341 and the input bumps 101 to 103, the output bumps 111 and 112 may be disposed adjacent to each other, and the output bumps 113 and 114 may be disposed adjacent to each other.

In addition, the filter 100*d* (ALR) is the filter in which a co-band including the reception band of Band 13 and Band 14 for LTE or a co-band including the reception band of n13 and n14 for 5GNR is used as the pass band. In addition, the filter 100*c* (BLR) is the filter in which a co-band including the reception band of Band 20 and 28 for LTE or a co-band including the reception band of n20 and n28 for 5GNR is used as the pass band.

According to this configuration, the number of the output bumps on the reception side can be reduced, and a size of the composite filter component 15A can be reduced. In addition, since the number of the wires connecting the low noise amplifiers 31 and 32 and the output bump of the composite filter component 15A can be reduced, the close contact between the wires can be suppressed. Therefore, the parasitic capacitance generated in the above-described wire can be reduced. Therefore, the deterioration of the noise figure of the low noise amplifiers 31 and 32 can be suppressed, and the deterioration of the amplification characteristics on the output side of the composite filter component 15A can be suppressed.

1.15 Configuration of Radio Frequency Module 1F According to Modification Example 6

Figure 11A:
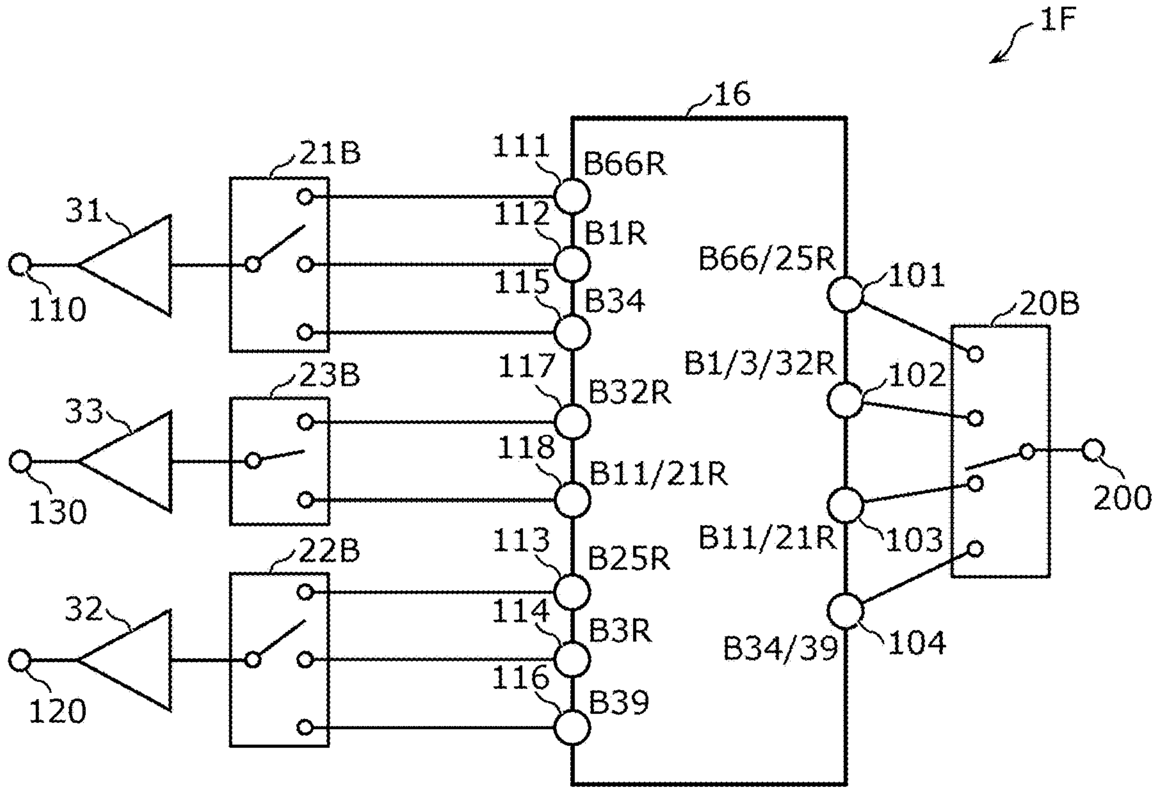
FIG. 11A is a circuit configuration diagram of a radio frequency module according to Modification Example 6 of Embodiment 1.

FIG. 11A is a circuit configuration diagram of a radio frequency module 1F according to Modification Example 6 of Embodiment 1. As shown in FIG. 11A, the radio frequency module 1F according to the present modification example includes a composite filter component 16, the low noise amplifiers 31, 32, and 33, switches 20B, 21B, 22B, and 23B, the antenna connection terminal 200, and the signal output terminals 110, 120, and 130. The radio frequency module 1F according to the present modification example is mainly different from the radio frequency module 1B according to Modification Example 2 in that the number of the input bumps provided in the composite filter component 16 is large. Hereinafter, the radio frequency module 1F according to the present modification example will be described, and the same configurations as those of the radio frequency module 1B according to Modification Example 2 will be omitted in the description. Different configurations will be mainly described.

The composite filter component 16 includes the filters 100*a*, 100*b*, 100*c*, 100*d*, 100*e*, 100*f*, 100*g*, and 100*h* (not shown), the input bumps 101, 102, 103, and 104, and the output bumps 111, 112, 113, 114, 115, 116, 117, and 118.

The filter 100*d* (ALR) is connected to the input bump 102 and the output bump 114. The filter 100*c* (BLR) is connected to the input bump 101 and the output bump 113. The filter 100*b* (AMR) is connected to the input bump 102 and the output bump 112. The filter 100*a* (BMR) is connected to the input bump 101 and the output bump 111. The filter 100*e* (CMR) is connected to the input bump 104 and the output bump 115. The filter 100*f* (CLR) is connected to the input bump 104 and the output bump 116. The filter 100*g* (AHR) is connected to the input bump 102 and the output bump 117. The filter 100*h* (DLR) is connected to the input bump 103 and the output bump 118.

In the present modification example and Example 11 (to be described later), for example, the band AL is Band 3 for LTE or n3 for 5GNR. For example, the band AM is Band 1 for LTE or n1 for 5GNR. For example, the band BL is Band 25 for LTE or n25 for 5GNR. For example, the band BM is Band 66 for LTE or n66 for 5GNR. For example, the band CL is Band 39 for LTE or n39 for 5GNR. For example, the band CM is Band 34 for LTE or n34 for 5GNR. For example, the band AH is Band 32 for LTE or n32 for 5GNR. For example, the band DL is a co-band of Band 11 and Band 21 for LTE or a co-band of n11 and n21 for 5GNR.

The signal of the band AL, the signal of the band AM, and the signal of the band AH can be simultaneously received, the signal of the band BL and the signal of the band BM can be simultaneously received, and the signal of the band CL and the signal of the band CM can be simultaneously received.

The input bump 102 is connected to the input end of the filter 100*d* (B3), the input end of the filter 100*b* (B1), and the input end of the filter 100*g* (B32). The input bump 101 is connected to the input end of the filter 100*c* (B25) and the input end of the filter 100*a* (B66). The input bump 103 is connected only to the input end of the filter 100*h* (B11/21). The input bump 104 is connected to the input end (B34) of the filter 100*e* and the input end of the filter 100*f* (B39).

The output bump 114 is connected to the output end of the filter 100*d* (B3). The output bump 113 is connected to the output end of the filter 100*c* (B25). The output bump 112 is connected to the output end of the filter 100*b* (B1). The output bump 111 is connected to the output end of the filter 100*a* (B66). The output bump 116 is connected to the output end of the filter 100*f* (B39). The output bump 115 is connected to the output end of the filter 100*e* (B34). The output bump 118 is connected to the output end of the filter 100*h* (B11/21). The output bump 117 is connected to the output end of the filter 100*g* (B32).

In the output bumps 111 to 118, the output bump 114, the output bump 113, and the output bump 116 are disposed adjacent to each other, the output bump 112, the output bump 111, and the output bump 115 are disposed adjacent to each other, and the output bump 117 and the output bump 118 are disposed adjacent to each other.

The low noise amplifier 31 can amplify the signals of the AMR (B1), the BMR (B66), and the CMR (B34). The bands AM, BM, and CM are a combination of bands signals of which are not simultaneously received. Therefore, the low noise amplifier 31 can be connected to the filter 100*b* including the AMR in the pass band, the filter 100*a* including the BMR in the pass band, and the filter 100*e* including the CMR in the pass band. In this manner, the input end of the low noise amplifier 31 is connected to the output bumps 111, 112, and 115 with the switch 21B interposed therebetween.

The low noise amplifier 32 can amplify the signals of the ALR (B3), the BLR (B25), and the CLR (B39). The bands AL, BL, and CL are a combination of bands signals of which are not simultaneously received. Therefore, the low noise amplifier 32 can be connected to the filter 100*d* including the ALR in the pass band, the filter 100*c* including the BLR in the pass band, and the filter 100*f* including the CLR in the pass band. In this manner, the input end of the low noise amplifier 32 is connected to the output bumps 113, 114, and 116 with the switch 22B interposed therebetween.

The low noise amplifier 33 can amplify the signals of the AHR (B32) and the DLR (B11/21). Since the bands AH and DL are a combination of bands signals of which are not simultaneously received, the low noise amplifier 33 can be connected to the filter 100*g* including the AHR in the pass band and the filter 100*h* including the DLR in the pass band. In this manner, the input end of the low noise amplifier 33 is connected to the output bumps 117 and 118 with the switch 23B interposed therebetween.

The switch 20B is connected between the antenna connection terminal 200 and the composite filter component 16. The switch 21B is connected between the low noise amplifier 31 and the composite filter component 16. The switch 22B is connected between the low noise amplifier 32 and the composite filter component 16. The switch 23B is connected between the low noise amplifier 33 and the composite filter component 16. The radio frequency module 1F according to the present modification example does not need to include at least one of the switches 20B to 23B.

In the above-described configuration of the composite filter component 16 according to the present modification example, on the input side of the composite filter component 16, the filters 100*a* (B66) and 100*c* (B25) which can perform simultaneous reception are connected to the input bump 101, the filters 100*b* (B1), 100*d* (B3), and 100*g* (B32) which can perform simultaneous reception are connected to the input bump 102, the filter 100*h* (B11/21) is connected alone to the input bump 103, and the filters 100*e* (B34) and 100*f* (B39) which can perform simultaneous reception are connected to the input bump 104. On the other hand, on the output side of the composite filter component 16, the output bump 114 connected to the filter 100*d* (B3), the output bump 113 connected to the filter 100*c* (B25), and the output bump 116 connected to the filter 100*f* (B39) are adjacent to each other, the output bump 112 connected to the filter 100*b* (B1), the output bump 111 connected to the filter 100*a* (B66), and the output bump 115 connected to the filter 100*e* (B34) are adjacent to each other, and the output bump 117 connected to the filter 100*g* (B32) and the output bump 118 connected to the filter 100*h* (B11/21) are adjacent to each other. According to this configuration, assuming the filters 100*d*, 100*c* and 100*f* which do not perform simultaneous reception are connected to the low noise amplifier 32, the filters 100*b*, 100*a*, and 100*e* which do not perform simultaneous reception are connected to the low noise amplifier 31, and the filters 100*g* and 100*h* which do not perform simultaneous reception are connected to the low noise amplifier 33, the filters 100*a* to 100*h* and the low noise amplifiers 31 to 33 can be connected without causing the intersection of the wires connecting the output bumps 111 to 118 and the low noise amplifiers 31 to 33. In this manner, it is possible to suppress the occurrence of the parasitic capacitance caused by the intersection of the wires, in the vicinity of the input ends of the low noise amplifiers 31 to 33. According to this configuration, the wires do not intersect in a region between the output bumps 111 to 118 and the low noise amplifiers 31 to 33. Therefore, the deterioration of the noise figure of the low noise amplifiers 31 to 33 can be suppressed, and the deterioration of the amplification characteristics on the output side of the composite filter component 16 can be suppressed.

Figure 11B:
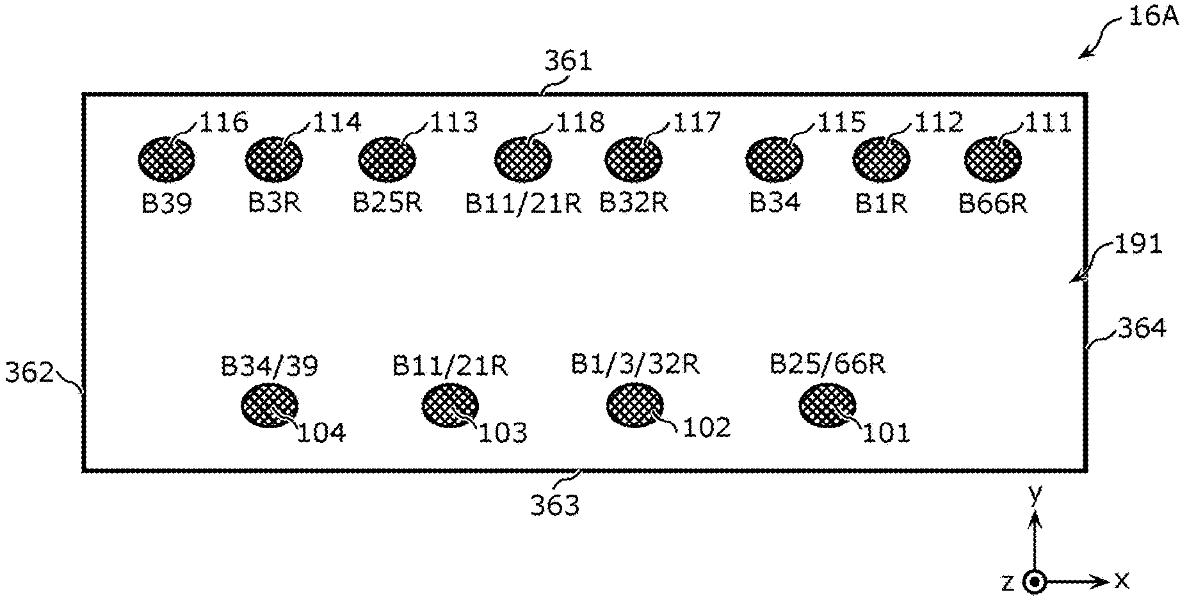
FIG. 11B is a plan view of a composite filter component according to Example 11.

Next, as a specific configuration example of the composite filter component 16 provided in the radio frequency module 1F according to Modification Example 6, a composite filter component 16A according to Example 11 will be described. FIG. 11B is a plan view of the composite filter component 16A according to Example 11.

As shown in FIG. 11B, the composite filter component 16A has a rectangular shape assuming the main surface 191 is viewed in a plan view, and has outer edges 361 and 363 facing each other, and outer edges 362 and 364 facing each other. The composite filter component 16A may have a polygonal shape assuming the main surface 191 is viewed in a plan view.

The output bumps 111 to 118 are disposed on the main surface 191 in the first direction (x-axis negative direction) along the outer edge 361 in the order of the output bumps 111, 112, 115, 117, 118, 113, 114, and 116. On the other hand, the input bumps 101 to 104 are disposed on the main surface 191 in the first direction (x-axis negative direction) of a region between the output bumps 111 to 118 and the outer edge 363 in the order of the input bumps 101, 102, 103, and 104.

According to this configuration, the wires do not intersect in a region between the output bumps 111 to 118 and the low noise amplifiers 31 to 33 disposed on the output side of the composite filter component 16A. Therefore, the deterioration of the noise figure of the low noise amplifiers 31 to 33 can be suppressed, and the deterioration of the amplification characteristics on the output side of the composite filter component 16A can be suppressed.

The output bumps 111 to 118 do not need to be linearly disposed in the first direction as shown in FIG. 11B. In the output bumps 111 to 118, in a region between the outer edge 361 and the input bumps 101 to 104, the output bumps 111, 112, and 115 may be disposed adjacent to each other, the output bumps 113, 114, and 116 may be disposed adjacent to each other, and the output bumps 117 and 118 may be disposed adjacent to each other.

1.16 Advantageous Effects, Etc.

As described above, the composite filter component 10 according to the present embodiment includes the filter 100*d* having the first pass band including the reception band of the band AL, the filter 100*c* having the second pass band including the reception band of the band BL, the filter 100*b* having the third pass band including the reception band of the band AM a signal of which is configured to be simultaneously received with a signal of the band AL, the filter 100*a* having the fourth pass band including the reception band of the band BM a signal of which is configured to be simultaneously received with a signal of the band BL, the input bump 102 connected to the input end of the filter 100*d* and the input end of the filter 100*b*, the input bump 101 connected to the input end of the filter 100*c* and the input end of the filter 100*a*, the output bump 114 connected to the output end of the filter 100*d*, the output bump 113 connected to the output end of the filter 100*c*, the output bump 112 connected to the output end of the filter 100*b*, and the output bump 111 connected to the output end of the filter 100*a*. In the output bumps 111 to 114, the output bump 114 and the output bump 113 are disposed adjacent to each other, and the output bump 112 and the output bump 111 are disposed adjacent to each other.

According to this configuration, assuming the filters 100*d* and 100*c* which do not perform simultaneous reception are connected to the low noise amplifier 32, and the filters 100*b* and 100*a* which do not perform simultaneous reception are connected to the low noise amplifier 31, the filters 100*a* to 100*d* and the low noise amplifiers 31 and 32 can be connected without causing the intersection of the wires connecting the output bumps 111 to 114 and the low noise amplifiers 31 and 32. In this manner, it is possible to suppress the occurrence of the parasitic capacitance caused by the intersection of the wires, in the vicinity of the input ends of the low noise amplifiers 31 and 32. Therefore, it is possible to provide the multi-band compatible composite filter component 10 which can suppress the deterioration of the noise figure of the low noise amplifiers 31 and 32.

In addition, for example, the composite filter components 10A to 10D have the main surfaces 153 and 151 facing each other, and when the main surface 153 is viewed in a plan view, the composite filter components 10A to 10D have a polygonal shape having the outer edges 301 and 303 facing each other, the output bumps 111 to 114 are disposed on the main surface 153 in the first direction along the outer edge 301 in the order of the output bumps 111, 112, 113, and 114, and the input bumps 101 and 102 are disposed on the main surface 153 between the output bumps 111 to 114 and the outer edge 303.

According to this configuration, the wires do not intersect in a region between the output bumps 111 to 114 and the low noise amplifiers 31 and 32 disposed on the output side of the composite filter components 10A to 10D. Therefore, the deterioration of the noise figure of the low noise amplifiers 31 and 32 can be suppressed, and the deterioration of the amplification characteristics on the output side of the composite filter components 10A to 10D can be suppressed.

In addition, for example, the composite filter component 10A according to Example 1 includes the filter chips 121 and 122 laminated on each other, the filter chip 121 includes the main surface 153, and the filters 100*a* and 100*b*, the filter chip 122 includes the main surface 151, and the filters 100*c* and 100*d*. The filters 100*c* and 100*d* are disposed in the first direction in the order of the filters 100*c* and 100*d*, the filters 100*a* and 100*b* are disposed in the first direction in the order of the filters 100*a* and 100*b*, and assuming the main surfaces 151 and 153 are viewed in a plan view, the filter 100*d* and the filter 100*b* at least partially overlap each other, and the filter 100*c* and the filter 100*a* at least partially overlap each other.

According to this configuration, two filters which do not perform simultaneous reception are disposed in one filter chip, and two filters which perform simultaneous reception are disposed in different filter chips. In this manner, the isolation between the two reception signals which are simultaneously received can be improved. In addition, two filters which perform simultaneous reception are disposed to overlap each other in a plan view. In this manner, the close contact and the intersection between the wire connected to the input bump 101 and the wire connected to the input bump 102 can be suppressed.

In addition, for example, the composite filter component 10B according to Example 2 includes the filter chips 121 and 122 laminated on each other, the filter chip 121 includes the main surface 153 and the filters 100*a* and 100*b*, the filter chip 122 includes the main surface 151 and the filters 100*c* and 100*d*, the filters 100*d* and 100*c* are disposed in the first direction in the order of the filters 100*d* and 100*c*, the filters 100*a* and 100*b* are disposed in the first direction in the order of the filters 100*a* and 100*b*, and assuming the main surfaces 151 and 153 are viewed in a plan view, the filter 100*d* and the filter 100*a* at least partially overlap each other, and the filter 100*c* and the filter 100*b* at least partially overlap each other.

According to this configuration, two filters which do not perform simultaneous reception are disposed in one filter chip, and two filters which perform simultaneous reception are disposed in different filter chips, and are further disposed not to overlap each other in a plan view, so that the isolation between the two reception signals which are simultaneously received can be improved.

In addition, for example, in the composite filter components 10A to 10D, the filter chip 121 includes the piezoelectric substrate 326, the filters 100*a* and 100*b* are formed on the piezoelectric substrate 326, the filter chip 122 includes the piezoelectric substrate 327, and the filters 100*c* and 100*d* are formed on the piezoelectric substrate 327.

According to the above-described configuration, the hollow space where the IDT electrode (functional electrode) is formed on the piezoelectric substrates 326 and 327 is the air layer having the relative permittivity of 1. Therefore, the parasitic capacitance generated assuming the wire formed on the piezoelectric substrate 326 and the wire formed on the piezoelectric substrate 327 intersect is smaller than the parasitic capacitance generated assuming the wire formed on the dielectric substrate intersects. Therefore, the isolation between the filters 100*a* and 100*b* and the filters 100*c* and 100*d* can be improved.

In addition, for example, the composite filter component 10C according to Example 3 includes the filter chips 121 and 122 laminated on each other, the filter chip 121 includes the main surface 153 and the filters 100*b* and 100*d*, the filter chip 122 includes the main surface 151 and the filters 100*a* and 100*c*, the filters 100*b* and 100*d* are disposed in the first direction in the order of the filters 100*b* and 100*d*, the filters 100*a* and 100*c* are disposed in the first direction in the order of the filters 100*a* and 100*c*, and assuming the main surfaces 151 and 153 are viewed in a plan view, the filter 100*d* and the filter 100*c* at least partially overlap each other, and the filter 100*b* and the filter 100*a* at least partially overlap each other.

According to this configuration, two filters which perform simultaneous reception are disposed in one filter chip. In this manner, the close contact between the wires connecting the two filters which perform simultaneous reception and the output bump can be avoided.

In addition, for example, in the composite filter component 10C, the filter chip 121 includes the piezoelectric substrate 326, the filters 100*b* and 100*d* are formed on the piezoelectric substrate 326, the filter chip 122 includes the piezoelectric substrate 327, and the filters 100*a* and 100*c* are formed on the piezoelectric substrate 327.

According to the above-described configuration, the hollow space where the IDT electrode (functional electrode) is formed on the piezoelectric substrates 326 and 327 is the air layer having the relative permittivity of 1. Therefore, the parasitic capacitance generated assuming the wire formed on the piezoelectric substrate 326 and the wire formed on the piezoelectric substrate 327 intersect is smaller than the parasitic capacitance generated assuming the wire formed on the dielectric substrate intersects. Therefore, the isolation between the filters 100*b* and 100*d* and the filters 100*a* and 100*c* can be improved.

In addition, for example, the composite filter component 11 according to Modification Example 1 further includes the filter 100*f* having the fifth pass band including the reception band of the band CL, the filter 100*e* having the sixth pass band including the reception band of the band CM that is different from the band CL and a signal of which is configured to be simultaneously received with a signal of the band CL, the input bump 103 connected to the input end of the filter 100*f* and the input end of the filter 100*e*, the output bump 116 connected to the output end of the filter 100*f*, and the output bump 115 connected to the output end of the filter 100*e*. In the output bumps 111 to 116, the output bump 116 is disposed adjacent to the output bumps 113 and 114, and the output bump 115 is disposed adjacent to the output bumps 111 and 112.

According to this configuration, assuming the filters 100*d*, 100*c*, and 100*f* which do not perform simultaneous reception are connected to the low noise amplifier 32, and the filters 100*a*, 100*b*, and 100*e* which do not perform simultaneous reception are connected to the low noise amplifier 31, the filters 100*a* to 100*f* and the low noise amplifiers 31 and 32 can be connected without causing the intersection of the wires connecting the output bumps 111 to 116 and the low noise amplifiers 31 and 32. In this manner, it is possible to suppress the occurrence of the parasitic capacitance caused by the intersection of the wires, in the vicinity of the input ends of the low noise amplifiers 31 and 32. Therefore, it is possible to provide the multi-band compatible composite filter component 11 which can suppress the deterioration of the noise figure of the low noise amplifiers 31 and 32.

In addition, for example, the composite filter component 14A according to Example 9 further includes the filter 100*f* having the fifth pass band including the transmission band and the reception band of the band CL, the filter 100*e* having the sixth pass band including the transmission band and the reception band of the band CM, the input bump 103 connected to one end of the filter 100*f* and one end of the filter 100*e*, the input/output bump 166 connected to the other end of the filter 100*f*, and the input/output bump 165 connected to the other end of the filter 100*e*. Each of the filter 100*f* and the filter 100*e* is the filter for TDD. The composite filter component 14A has the first main surface and the second main surface which face each other, and has a polygonal shape having the outer edges 341 and 343 facing each other assuming the first main surface is viewed in a plan view. The output bumps 111 to 114 and the input/output bumps 165 and 166 are disposed on the first main surface in the first direction along the outer edge 341 in the order of the output bumps 111, 112, 113, and 114, and the input/output bumps 165 and 166. The input bumps 101 to 103 are disposed on the first main surface in the first direction of the region between the output bumps 111 to 114, the input/output bumps 165 and 166, and the outer edge 343 in the order of the input bumps 101, 102, and 103.

According to this configuration, the wire connecting the output bumps 111 to 114 to the low noise amplifiers 31 and 32 does not intersect in a region between the output bumps 111 to 114 and the low noise amplifiers 31 and 32 disposed on the output side of the composite filter component 14A. Therefore, assuming the reception signal of the band AL and the reception signal of the band AM are simultaneously received, and assuming the reception signal of the band BL and the reception signal of the band BM are simultaneously received, the deterioration of the noise figure of the low noise amplifiers 31 and 32 can be suppressed, and the deterioration of the amplification characteristics on the output side of the composite filter component 14A can be suppressed. In addition, since the input/output bumps 165 and 166 through which the transmission signals pass are disposed away from the output bumps 111 to 114 through which only the reception signal passes, the isolation between transmission and reception can be secured.

In addition, for example, the composite filter component 12 according to Modification Example 2 further includes the filter 100*g* having the seventh pass band including the reception band of the band AH that is different from the bands AL and AM and a signal of which is configured to be simultaneously received with signals of the bands AL and AM, the filter 100*h* having the eighth pass band including the reception band of the band BH that is different from the bands BL and BM and a signal of which is configured to be simultaneously received with signals of the bands BL and BM, the output bump 118 connected to the output end of the filter 100*g*, and the output bump 117 connected to the output end of the filter 100*h*. The input bump 102 is connected to the input end of the filter 100*d*, the input end of the filter 100*b*, and the input end of the filter 100*g*, and the input bump 101 is connected to the input end of the filter 100*c*, the input end of the filter 100*a*, and the input end of the filter 100*h*. In the output bumps 111 to 114, and 117 to 118, the output bump 114 and the output bump 113 are disposed adjacent to each other, the output bump 112 and the output bump 111 are disposed adjacent to each other, and the output bump 118 and the output bump 117 are disposed adjacent to each other.

According to this configuration, assuming the filters 100*d* and 100*c* which do not perform simultaneous reception are connected to the low noise amplifier 32, the filters 100*b* and 100*a* which do not perform simultaneous reception are connected to the low noise amplifier 31, and the filters 100*g* and 100*h* which do not perform simultaneous reception are connected to the low noise amplifier 33, the filters 100*a* to 100*d* and 100*g* to 100*h* and the low noise amplifiers 31 to 33 can be connected without causing the intersection of the wires connecting the output bumps 111 to 114 and 117 to 118 to the low noise amplifiers 31 to 33. In this manner, it is possible to suppress the occurrence of the parasitic capacitance caused by the intersection of the wires, in the vicinity of the input ends of the low noise amplifiers 31 to 33. Therefore, it is possible to provide the multi-band compatible composite filter component 12 which can suppress the deterioration of the noise figure of the low noise amplifiers 31 to 33.

In addition, for example, the radio frequency modules 1 and 1A to 1E according to Embodiment 1 includes the mounting substrate 90 having the main surfaces 90*a* and 90*b* facing each other, any one of the composite filter components 10 to 15 disposed on the mounting substrate 90, and the low noise amplifiers 31 and 32 disposed on the mounting substrate 90. The input end of the low noise amplifier 32 is connected to the output bumps 113 and 114, and the input end of the low noise amplifier 31 is connected to the output bumps 111 and 112.

According to this configuration, it is possible to provide the multi-band compatible radio frequency modules 1 and 1A to 1E which can suppress the deterioration of the noise figure of the low noise amplifiers 31 and 32.

In addition, for example, in the radio frequency modules 1 and 1A to 1E, the output bumps 113 and 114 are disposed closer to the low noise amplifier 32 than the low noise amplifier 31, and the output bumps 111 and 112 are disposed closer to the low noise amplifier 31 than the low noise amplifier 32.

According to this configuration, the wire connecting the output bumps 113 and 114 to the low noise amplifier 32 and the wire connecting the output bumps 111 and 112 to the low noise amplifier 31 can be shortened. Therefore, a loss and a size of the radio frequency modules 1 and 1A to 1E can be reduced.

Embodiment 2

In Embodiment 1, a configuration in which the deterioration of the amplification characteristics is suppressed by suppressing the wire intersection of the reception circuits has been described as an example, but in the present embodiment, a configuration in which the deterioration of the amplification characteristic is suppressed by suppressing the wire intersection of the transmission circuits will be described.

2.1 Configuration of Radio Frequency Module 5 and Communication Device 6

Figure 12:
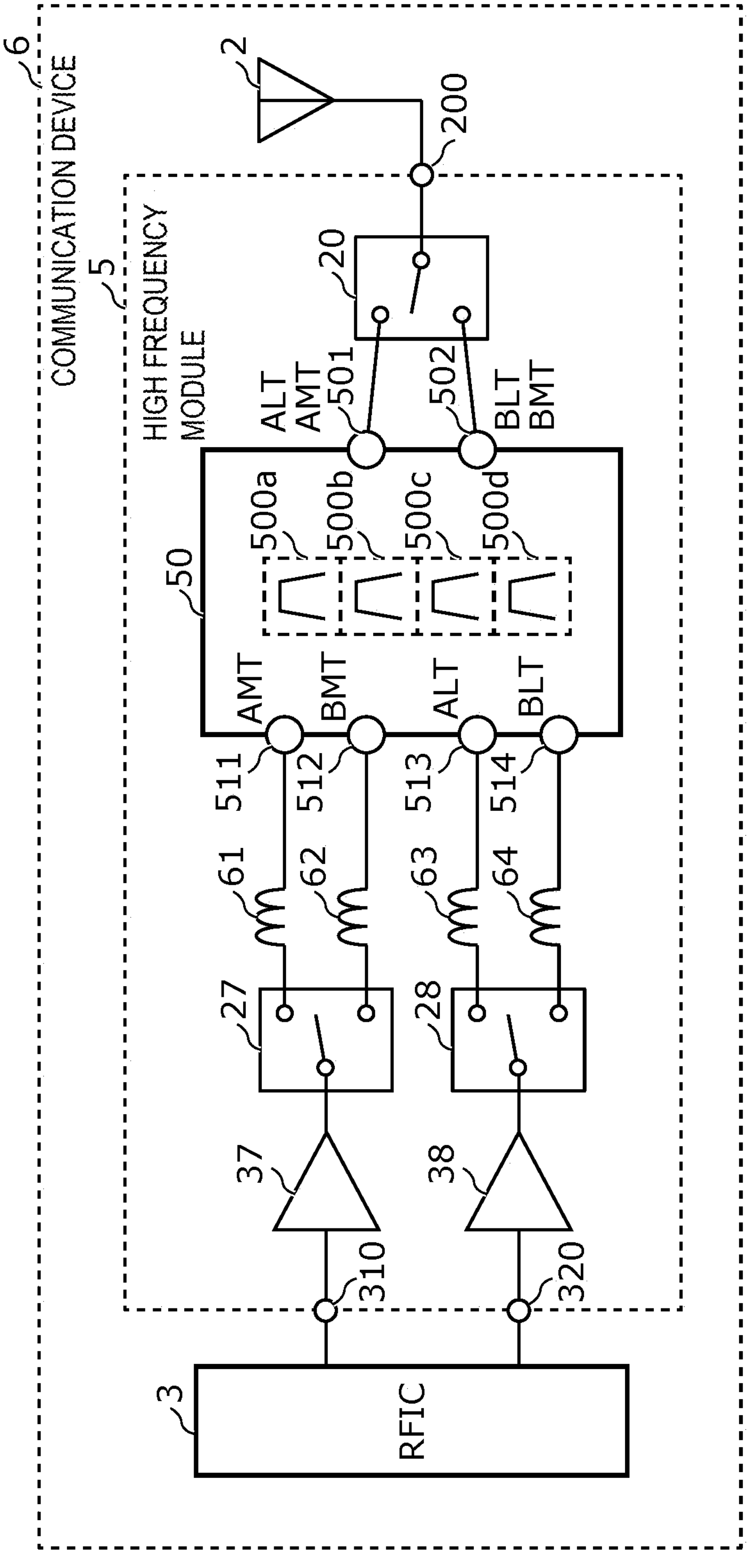
FIG. 12 is a circuit configuration diagram of a radio frequency module and a communication device according to Embodiment 2.

First, a circuit configuration and a component disposition configuration of a radio frequency module 5 and a communication device 6 according to the present embodiment will be described with reference to FIG. 12. FIG. 12 is a circuit configuration diagram of the radio frequency module 5 and the communication device 6 according to Embodiment 2. FIG. 12 shows an exemplary circuit configuration of the radio frequency module 5 and the communication device 6, and the radio frequency module 5 and the communication device 6 can be mounted by using any of various circuit mounting methods and circuit technologies. Therefore, description of the radio frequency module 5 and the communication device 6 provided below should not be interpreted as being limited.

The communication device 6 is mounted on a UE of a cellular network, and is typically a mobile phone, a smartphone, a tablet computer, a wearable device, or the like. The communication device 6 may be an IoT sensor/device, a medical/healthcare device, a vehicle, a UAV, or an AGV. In addition, the communication device 6 may be mounted on a BS of the cellular communication system.

As shown in FIG. 12, the communication device 6 includes the radio frequency module 5, the antenna 2, and the RFIC 3. The radio frequency module 5 can transmit a radio frequency signal between the antenna 2 and the RFIC 3. An internal configuration of the radio frequency module 5 will be described below.

The antenna 2 is connected to the antenna connection terminal 200 of the radio frequency module 5. The antenna 2 transmits a radio frequency signal supplied from the radio frequency module 5 to the outside of the communication device 6. Furthermore, the antenna 2 may receive the radio frequency signal from the outside of the communication device 6 to supply the radio frequency signal to the radio frequency module 5. The antenna 2 does not need to be provided in the communication device 6. In addition, the communication device 6 may include a plurality of antennas.

The RFIC 3 is an example of a signal processing circuit that processes the radio frequency signal. Specifically, the RFIC 3 performs signal processing on the transmission signal input from the BBIC by performing up-conversion or the like, and outputs the radio frequency transmission signal generated by the signal processing to the radio frequency module 5. Furthermore, the RFIC 3 may perform signal processing on the radio frequency reception signal input via the reception path of the radio frequency module 5 by performing down-conversion or the like, and may output the reception signal generated by the signal processing to the BBIC.

Next, a circuit configuration of the radio frequency module 5 according to the present embodiment will be described. The radio frequency module 5 includes the composite filter component 50, the power amplifiers 37 and 38, the switches 20, 27, and 28, the inductors 61, 62, 63, and 64, the antenna connection terminal 200, and the signal input terminals 310 and 320.

The composite filter component 50 includes the filters 500*a*, 500*b*, 500*c*, and 500*d*, the output bumps 501 and 502, and the input bumps 511, 512, 513, and 514.

The filter 500*d* has the first pass band including the transmission band (BLT) of the band BL (first band). The filter 500*c* has the second pass band including the transmission band (ALT) of the band AL (second band). The filter 500*b* has the third pass band including the transmission band (BMT) of the band BM (third band). The filter 500*a* has the fourth pass band including the transmission band (AMT) of the band AM (fourth band). The filters 500*d* and 500*c* are each an example of one of the first filter and the second filter, and an example of the other of the first filter and the second filter, and the filters 500*b* and 500*a* are each an example of one of the third filter and the fourth filter, and an example of the other of the third filter and the fourth filter.

The filter 500*d* and the filter 500*c* may be each an example of one of the third filter and the fourth filter, and an example of the other of the third filter and the fourth filter. In this case, the filter 500*b* and the filter 500*a* are each an example of one of the first filter and the second filter, and an example of the other of the first filter and the second filter.

The band BL (first band) and the band BM (third band) are a combination of bands signals of which are configured to be simultaneously transmitted, and the band AL (second band) and the band AM (fourth band) are a combination of bands signals of which are configured to be simultaneously transmitted. That is, the signal of the band BL (first band) and the signal of the band BM (third band) can be simultaneously transmitted, and the signal of the band AL (second band) and the signal of the band AM (fourth band) can be simultaneously transmitted.

The output bump 502 is an example of the first output bump, and is connected to the output end of the filter 500*d* and the output end of the filter 500*b*. The output bump 501 is an example of the second output bump, and is connected to the output end of the filter 500*c* and the output end of the filter 500*a*.

According to this configuration, the output ends of the two filters 500*a* and 500*c* which can perform simultaneous transmission are connected in common to the output bump 501, and the output ends of the two filters 500*b* and 500*d* which can perform simultaneous transmission are connected in common to the output bump 502. Therefore, the number of the output bumps of the composite filter component 50 can be reduced, and a size of the composite filter component 50 can be reduced. Furthermore, the number of terminals of the switch 20 can be reduced by reducing the number of the output bumps of the composite filter component 50. Therefore, off-capacitance generated in the terminal of the switch 20 can be reduced.

The input bump 514 is an example of the first input bump, and is connected to the input end of the filter 500*d*. The input bump 513 is an example of the second input bump, and is connected to the input end of the filter 500*c*. The input bump 512 is an example of the third input bump, and is connected to the input end of the filter 500*b*. The input bump 511 is an example of the fourth input bump, and is connected to the input end of the filter 500*a*.

In the input bumps 511 to 514, the input bump 511 and the input bump 512 are disposed adjacent to each other, and the input bump 513 and the input bump 514 are disposed adjacent to each other.

The power amplifier 38 is an example of the first power amplifier, and can amplify the signals of the ALT and the BLT. Since the bands AL and BL are a combination of bands signals of which are not simultaneously transmitted, the power amplifier 38 can be connected to both the filter 500*d* including the BLT in the pass band and the filter 500*c* including the ALT in the pass band. In this manner, the output end of the power amplifier 38 is connected to the input bumps 513 and 514 with the switch 28 interposed therebetween.

The power amplifier 37 is an example of the second power amplifier, and can amplify the signals of the AMT and the BMT. Since the band AM and the band BM are a combination of bands signals of which are not simultaneously transmitted, the power amplifier 37 can be connected to both the filter 500*b* including the BMT in the pass band and the filter 500*a* including the AMT in the pass band. In this manner, the output end of the power amplifier 37 is connected to the input bumps 511 and 512 with the switch 27 interposed therebetween.

The switch 20 is connected between the antenna connection terminal 200 and the composite filter component 50, and switches between the connection of the antenna 2 and the output terminal 501 and the connection of the antenna 2 and the output terminal 502. The switch 27 is connected between the power amplifier 37 and the composite filter component 50, and switches between the connection of the power amplifier 37 and the input bump 511 and the connection of the power amplifier 37 and the input bump 512. The switch 28 is connected between the power amplifier 38 and the composite filter component 50, and switches between the connection of the power amplifier 38 and the input bump 513 and the connection of the power amplifier 38 and the input bump 514.

The inductor 61 is connected between the input bump 511 and the switch 27, and performs impedance matching between the composite filter component 50 and the power amplifier 37. The inductor 62 is connected between the input bump 512 and the switch 27, and performs impedance matching between the composite filter component 50 and the power amplifier 37. The inductor 63 is connected between the input bump 513 and the switch 28, and performs the impedance matching between the composite filter component 50 and the power amplifier 38. The inductor 64 is connected between the input bump 514 and the switch 28, and performs impedance matching between the composite filter component 50 and the power amplifier 38. Each of the inductors 61 to 64 may be a circuit including at least one of an inductor or a capacitor.

In addition, the radio frequency module 5 according to the present embodiment does not need to include at least one of the switches 20, 27, and 28 and the inductors 61 to 64.

In the composite filter component including the plurality of filters 500*a* to 500*d* in the related art, the filters 500*b* (BMT) and 500*d* (BLT) which can perform simultaneous transmission are connected to the output bump 502, and the filters 500*a* (AMT) and 500*c* (ALT) which can perform simultaneous transmission are connected to the output bump 501. In the composite filter component, in order that the wires connecting the output bump and each filter are shortened without causing the intersection, inside the composite filter component, the filters 500*b* and 500*d* are disposed adjacent to each other, and the filters 500*a* and 500*c* are disposed adjacent to each other. On the other hand, in order that the wires connecting the input bump and each filter are shortened without causing the intersection, on the input side of the composite filter component, the filters 500*b* and 500*d* are disposed adjacent to each other. Therefore, the input bump 514 connected to the filter 500*d* and the output bump 512 connected to the filter 500*b* are adjacent to each other. The filters 500*a* and 500*c* are disposed adjacent to each other. Therefore, the input bump 511 connected to the filter 500*a* and the input bump 513 connected to the filter 500*c* are adjacent to each other. In the power amplifiers 37 and 38 that output the transmission signals to the composite filter component, it is difficult to output two signals to be simultaneously transmitted from one power amplifier, and it is desirable to respectively distribute and output the two signals to the power amplifiers 37 and 38. Therefore, the input bump 512 and the input bump 514 that are disposed adjacent to each other are distributed and connected to the power amplifiers 37 and 38, and the input bump 511 and the input bump 513 that are disposed adjacent to each other are distributed and connected to the power amplifiers 37 and 38. In this case, the connection wires intersect in a region between the input bumps 511 to 514 and the power amplifiers 37 and 38, and the parasitic capacitance caused by the intersection is generated, in the vicinity of the output ends of the power amplifiers 37 and 38. The power amplifiers 37 and 38 have a low impedance in the output end. As the generated parasitic capacitance is closer to the output end of the power amplifier, the matching loss increases in the output end of the power amplifier, and the amplification characteristics deteriorate.

In contrast, in above-described configuration of the composite filter component 50 according to the present embodiment, on the output side of the composite filter component 50, the filters 500*b* (BMT) and 500*d* (BLT) which can perform simultaneous transmission are connected to the output bump 502, and the filters 500*a* (ANT) and 500*c* (ALT) which can perform simultaneous transmission are connected to the output bump 501. On the other hand, on the input side of the composite filter component 50, the input bump 514 connected to the filter 500*d* and the input bump 513 connected to the filter 500*c* are adjacent to each other, and the input bump 512 connected to the filter 500*b* and the input bump 511 connected to the filter 500*a* are adjacent to each other. According to this configuration, assuming the filters 500*d* (to which the input bump 514 is connected) and 500*c* (to which the input bump 513 is connected) which do not perform mutually simultaneous transmission are connected to the power amplifier 38, and the filters 500*b* (to which the input bump 512 is connected) and 500*a* (to which the input bump 511 is connected) which do not perform mutually simultaneous transmission are connected to the power amplifier 37, the filters 500*a* to 500*d* and the power amplifiers 37 and 38 can be connected without causing the intersection of the wires connecting the input bumps 511 to 514 and the power amplifiers 37 and 38. In this manner, it is possible to suppress the occurrence of the parasitic capacitance caused by the intersection of the wires, in the vicinity of the output ends of the power amplifiers 37 to 38.

Therefore, the wires do not intersect in a region between the input bumps 511 to 514 and the power amplifiers 37 and 38. Therefore, the matching loss of the transmission signals output from the power amplifiers 37 and 38 can be reduced, and the deterioration of the amplification characteristics on the input side of the composite filter component 50 can be suppressed.

In addition, since the wires do not intersect between the input bumps 511 to 514 and the power amplifiers 37 and 38, the height of the radio frequency module 5 can be reduced.

For example, the band AL is Band 3 for LTE or n3 for 5GNR. For example, the band AM is Band 1 for LTE or n1 for 5GNR. For example, the band BL is Band 66 for LTE or n66 for 5GNR. For example, the band BM is Band 25 for LTE or n25 for 5GNR.

The radio frequency module 5 may further include a mounting substrate. The composite filter component 50, the switches 20, 27, and 28, the inductors 61 to 64, and the power amplifiers 37 and 38 are disposed on the main surface of the mounting substrate.

For example, the composite filter component 50 has a form in which (1) the IC chip is used on the silicon substrate, (2) the filters 500*a* to 500*d* are accommodated inside one package, (3) a plurality of piezoelectric substrates are bonded with the support layer interposed therebetween, or (4) the filters 500*a* to 500*d* are disposed on one substrate.

For example, each of the inductors 61 to 64 is a surface mounting type chip inductor. Each of the inductors 61 to 64 may include a coil conductor formed on the mounting substrate.

The power amplifiers 37 and 38 may be formed inside one IC. In addition, the switches 20, 27, and 28 may be formed inside one IC.

Here, the input bumps 513 and 514 may be disposed closer to the power amplifier 38 than the power amplifier 37, and the input bumps 511 and 512 may be disposed closer to the power amplifier 37 than the power amplifier 38.

According to this configuration, the wire connecting the input bumps 513 and 514 and the power amplifier 38, and the wire connecting the input bumps 511 and 512 and the power amplifier 37 can be shortened. Therefore, a loss and a size of the radio frequency module 5 can be reduced.

2.2 Structure of Composite Filter Component 50A According to Example 12

Figure 13A:
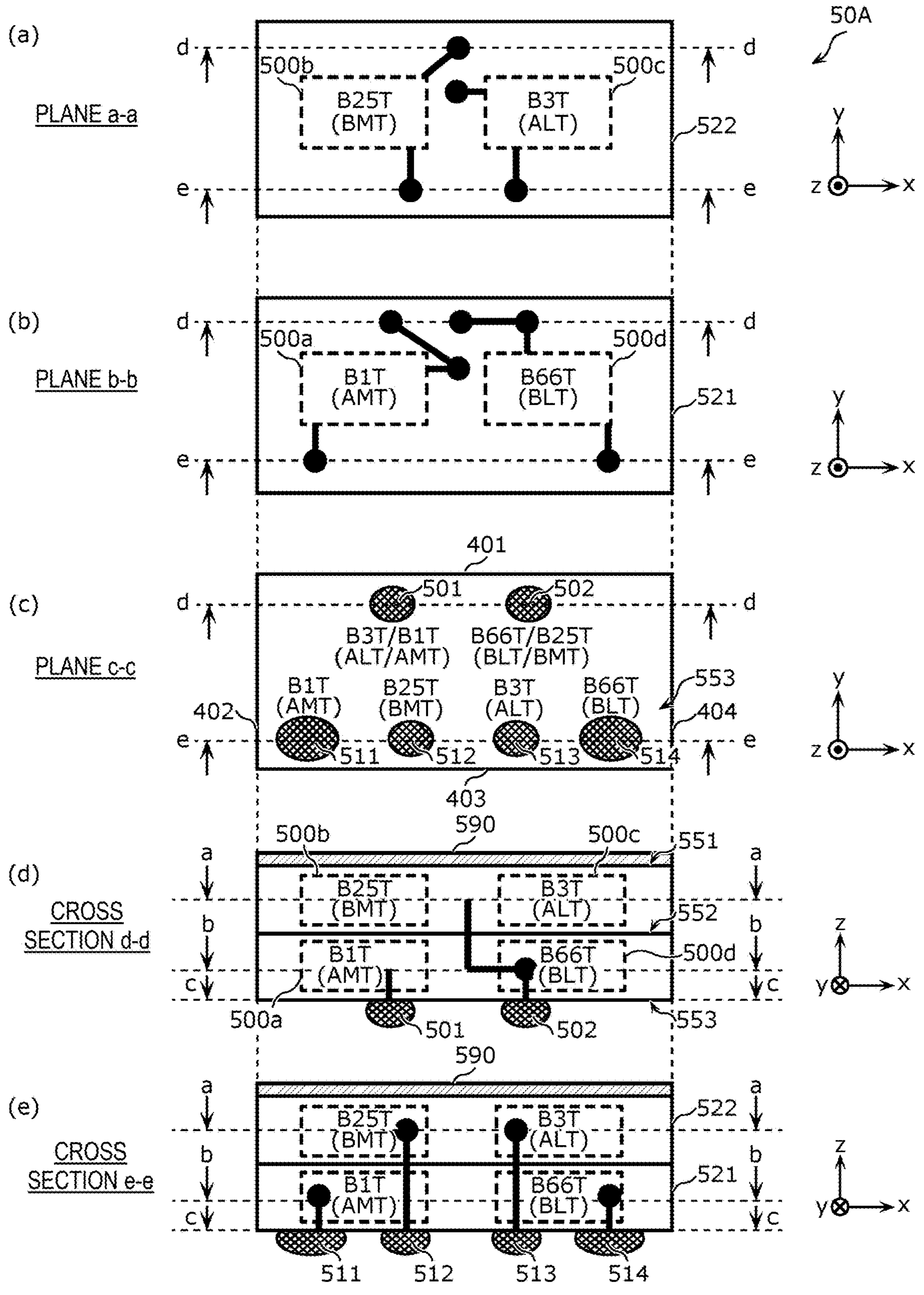
FIG. 13A is a plan view and a cross-sectional view of a composite filter component according to Example 12.

FIG. 13A is a plan view and a cross-sectional view of a composite filter component 50A according to Example 12. FIG. 13A shows a disposition configuration example of each filter and each bump which form the composite filter component 50A. (a) of FIG. 13A is a view assuming the plane a-a is viewed from the positive side of the z-axis, (b) of FIG. 13A is a view assuming the plane b-b is viewed from the positive side of the z-axis, (c) of FIG. 13A is a view assuming the plane c-c is viewed from the positive side of the z-axis, (d) of FIG. 13A is a view assuming the cross section d-d is viewed from the negative side of the y-axis, and (e) of FIG. 13A is a view assuming the cross section e-e is viewed from the negative side of the y-axis. The plane a-a is a plane parallel to a main surface 551 and between the main surface and a facing main surface of a filter chip 522. In addition, the plane b-b is a plane parallel to a main surface 553 and between the main surface and a facing main surface of a filter chip 521. In addition, the plane c-c is the main surface 553. In addition, the cross section d-d is a plane perpendicular to the main surface 553 and passing through the output bumps 501 and 502. In addition, the cross section e-e is a plane perpendicular to the main surface 553 and passing through the input bumps 511 to 514.

The composite filter component 50A includes the filter chips 521 and 522 laminated on each other, and includes the main surface 553 (first main surface) and the main surface 551 (second main surface) which face each other. The filter chip 521 is an example of the first layer portion, and includes the main surface 553 (first main surface), and the filters **500*d* (BLT) and 500*a* (AMT). The filter chip 522 is an example of the second layer portion and includes the main surface 551 (second main surface), and the filters 500*b* (BMT) and 500*c*** (ALT).

In the present example, the filter **500*d* is an example of the first filter, and is connected to the output bump 502 (first output bump) and the input bump 514 (first input bump). The filter 500*c* is an example of the second filter, and is connected to the output bump 501 (second output bump) and the input bump 513 (second input bump). The filter 500*b* is an example of the third filter, and is connected to the output bump 502 (first output bump) and the input bump 512 (third input bump). The filter 500*a* is an example of the fourth filter, and is connected to the output bump 501 (second output bump) and the input bump 511** (fourth input bump).

For example, each of the filter chips 521 and 522 has a form in which (1) the IC chip is used on the silicon substrate, (2) two filters are accommodated inside one package, or (3) functional electrodes of two filters are formed on one piezoelectric substrate. In addition, for example, the composite filter component 50A has at least one form of (1) the filter chips 521 and 522 are bonded between electrodes, (2) the filter chips 521 and 522 are bonded with an adhesive, and (3) the filter chips 521 and 522 are formed in a resin mold. In the present example, the filter chips 521 and 522 are bonded in an interface 552.

As shown in (c) of FIG. 13A, the composite filter component 50A has a rectangular shape assuming the main surface 553 is viewed in a plan view, and has outer edges 401 (second outer edge) and 403 (first outer edge) facing each other, and outer edges 402 and 404 facing each other. The composite filter component 50A may have a polygonal shape assuming the main surface 553 is viewed in a plan view.

The input bumps 511 to 514 are disposed on the main surface 553 in the first direction (x-axis negative direction) along the outer edge 403 in the order of the input bumps 514, 513, 512, and 511. On the other hand, the output bumps 501 and bump 502 are disposed on the main surface 553 in the first direction (x-axis negative direction) of the region between the input bumps 511 to 514 and the outer edge 401 in the order of the output bumps 502 and 501.

According to this configuration, the wires do not intersect in a region between the input bump 511 to 514 and the power amplifiers 37 and 38 disposed on the input side of the composite filter component 50A. Therefore, the matching loss of the transmission signals output from the power amplifiers 37 and 38 can be reduced, and the deterioration of the amplification characteristics on the input side of the composite filter component 50A can be suppressed.

The input bumps 511 to 514 do not need to be linearly disposed in the first direction as shown in FIG. 13A. In the input bumps 511 to 514, in a region between the outer edge 403 and the output bumps 501 and 502, the input bumps 511 and 512 may be disposed adjacent to each other, and the input bumps 513 and 514 may be disposed adjacent to each other.

The filters **500*d* and 500*a* are disposed in the first direction (x-axis negative direction) in the order of the filters 500*d* and 500*a*. The filters 500*c* and 500*b* are disposed in the first direction (x-axis negative direction) in the order of the filters 500*c* and 500*b*. Assuming the main surfaces 551 and 553 are viewed in a plan view, the filter 500*c* and the filter 500*d* at least partially overlap each other, and the filter 500*a* and the filter 500*b*** at least partially overlap each other.

That is, in the composite filter component 50A according to the present example, two filters which do not perform simultaneous transmission are disposed in one filter chip. In this manner, the isolation between two transmission signals which are simultaneously transmitted is improved, and heat dissipation from the filter chip is dispersed. In addition, the two filters which perform simultaneous transmission are disposed in different filter chips, and are disposed not to overlap each other in a plan view. In this manner, a distance between the two filters which perform simultaneous transmission is secured, and the isolation between the two transmission signals which are simultaneously transmitted is further improved.

According to the above-described disposition configuration, the wires connecting the output bump 501 and the filters **500*a* and 500*c* do not intersect the wire connecting the output bump 502 and the filters 500*b* and 500*d* inside the filter chip 521, and do not intersect inside the filter chip 522 (refer to (a), (b), and (d) of FIG. 13A). In addition, the wire connecting the input bump 511 and the filter 500*a*, the wire connecting the input bump 512 and the filter 500***b*, the wire connecting the input bump 513 and the filter 500*c*, and the wire connecting the input bump 514 and the filter 500*d* do not intersect inside the filter chip 521, and do not intersect inside the filter chip 522 (refer to (a), (b), and (e) of FIG. 13A).

That is, inside the composite filter component 50A, the wire connecting the input bump and the filter does not intersect inside the filter chip, and the wire connecting the output bump and the filter does not intersect inside the filter chip. In this manner, the matching loss of the transmission signals output from the power amplifiers 37 and 38 disposed on the input side of the composite filter component 50A can be reduced, and the isolation between the filters 500*a* to 500*d* inside the composite filter component 50A can be improved. Therefore, the composite filter component 50A can transmit the transmission signal of the ALT and the transmission signal of the AMT, which simultaneously pass therethrough, with a low loss, and can transmit the transmission signal of the BLT and the transmission signal of the BMT, which simultaneously pass therethrough, with a low loss.

In addition, as shown in (c) of FIG. 13A, assuming the main surface 553 is viewed in a plan view, an area of the input bump 514 is larger than an area of the input bump 512, and an area of the input bump 511 is larger than an area of the input bump 513.

The filters 500*b* and 500*c* disposed in the filter chip 522 have high heat dissipation to the main surface 551 side which is a top surface. On the other hand, the filters 500*a* and 500*d* disposed in the filter chip 521 pinched between the filter chip 522 and the mounting substrate have low heat dissipation to the outside. In contrast, the area of the input bump 514 connected to the filter 500*d* is larger than the area of the input bump 512 connected to the filter 500*b*, and the area of the input bump 511 connected to the filter 500*a* is larger than the area of the input bump 513 connected to the filter 500*c*. Therefore, the heat dissipation of the filter chip 521 can be improved. Therefore, the heat dissipation of the composite filter component 50A can be improved.

A shield electrode layer 590 may be formed on the main surface 551 of the composite filter component 50A. According to this configuration, the heat dissipation from the filter chip 522 to the main surface 551 side can be further improved.

In addition, the input bumps 511 to 514 may be disposed in the first direction in the order of the input bumps 513, 514, 511, and 512. In this case, the input bumps 511 and 514 connected from the filter chip 521 are adjacent to each other, and dispersing performance of the heat dissipation from the filter chip 521 is degraded. In contrast, a shield plate may be disposed between the filter 500*a* and the filter 500*d* to be perpendicular to the main surface 553 from the main surface 553 to the main surface 551.

According to this configuration, heat conduction between the filter 500*a* and the filter 500*d* is suppressed. Therefore, the heat dissipation of the composite filter component 50A is improved.

2.3 Structure of Composite Filter Component 50B According to Example 13

Figure 13B:
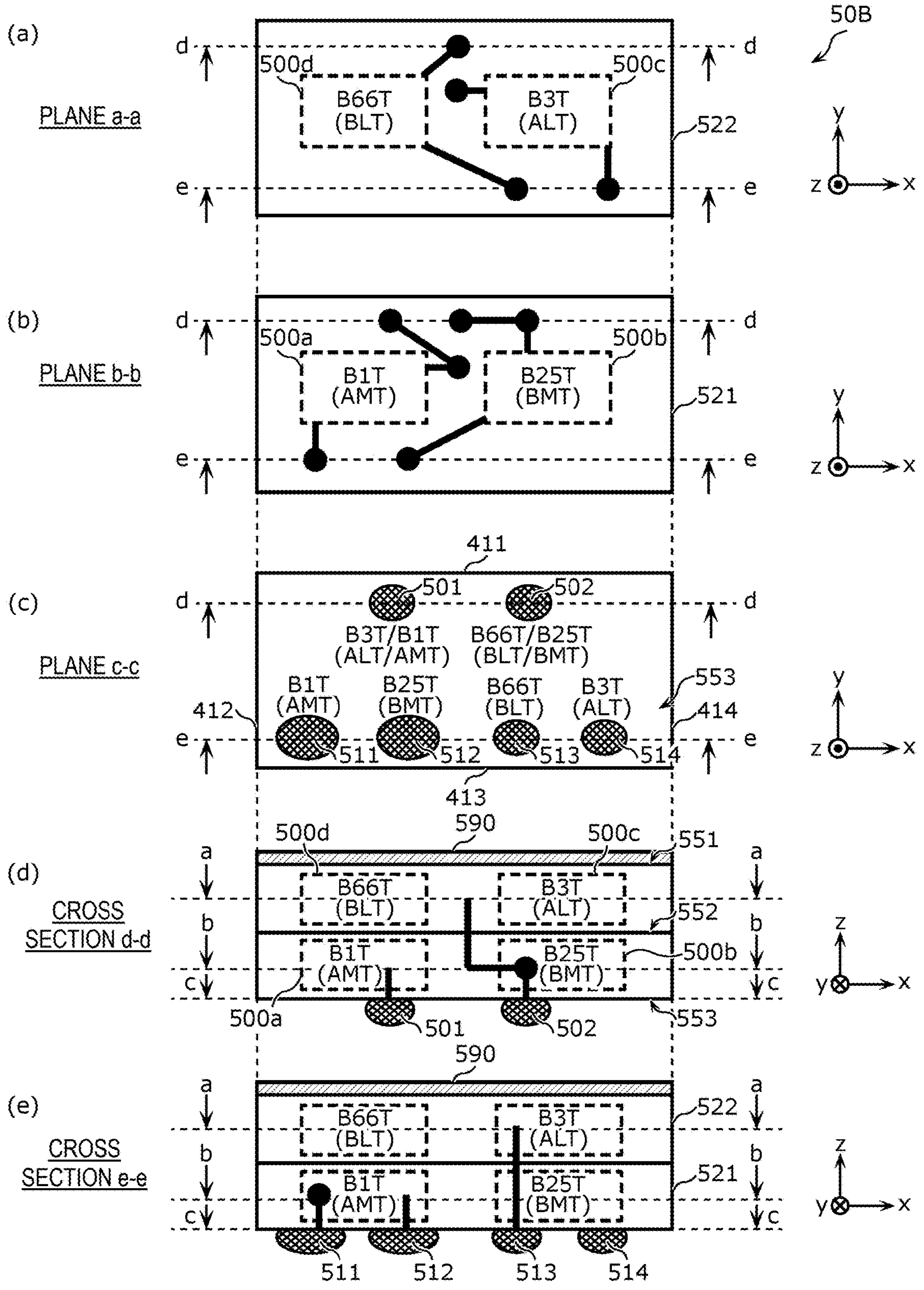
FIG. 13B is a plan view and a cross-sectional view of a composite filter component according to Example 13.

FIG. 13B is a plan view and a cross-sectional view of a composite filter component 50B according to Example 13. FIG. 13B shows a disposition configuration example of each filter and each bump which form the composite filter component 50B. (a) of FIG. 13B is a view assuming the plane a-a is viewed from the positive side of the z-axis, (b) of FIG. 13B is a view assuming the plane b-b is viewed from the positive side of the z-axis, (c) of FIG. 13B is a view assuming the plane c-c is viewed from the positive side of the z-axis, (d) of FIG. 13B is a view assuming the cross section d-d is viewed from the negative side of the y-axis, and (e) of FIG. 13B is a view assuming the cross section e-e is viewed from the negative side of the y-axis. The plane a-a is a plane parallel to a main surface 551 and between the main surface and a facing main surface of a filter chip 522. In addition, the plane b-b is a plane parallel to a main surface 553 and between the main surface and a facing main surface of a filter chip 521. In addition, the plane c-c is the main surface 553. In addition, the cross section d-d is a plane perpendicular to the main surface 553 and passing through the output bumps 501 and 502. In addition, the cross section e-e is a plane perpendicular to the main surface 553 and passing through the input bumps 511 to 514.

In the composite filter component 50B according to the present example, the disposition configuration of the filters in the filter chips 521 and 522 is different from that in the composite filter component 50A according to Example 12. Therefore, hereinafter, the composite filter component 50B according to the present example will be described, and the same configurations as those of the composite filter component 50A according to Example 12 will be omitted in the description. The configurations different from those of the composite filter component 50A will be mainly described.

The composite filter component 50B includes the filter chips 521 and 522 laminated on each other, and includes the main surfaces 553 (first main surface) and 551 (second main surface) facing each other. The filter chip 521 is an example of the first layer portion, and includes the main surface 553 (first main surface), and the filters 500*a* (AMT) and 500*b* (BMT). The filter chip 522 is an example of the second layer portion, and includes the main surface 551 (second main surface), and the filters 500*c* (ALT) and 500*d* (BLT).

In the present example, the filter 500*d* is an example of the first filter, and is connected to the output bump 502 (first output bump) and the input bump 513 (first input bump). The filter 500*c* is an example of the second filter, and is connected to the output bump 501 (second output bump) and the input bump 514 (second input bump). The filter 500*b* is an example of the third filter, and is connected to the output bump 502 (first output bump) and the input bump 512 (third input bump). The filter 500*a* is an example of the fourth filter, and is connected to the output bump 501 (second output bump) and the input bump 511 (fourth input bump).

As shown in (c) of FIG. 13B, the composite filter component 50B has a rectangular shape assuming the main surface 553 is viewed in a plan view, and has outer edges 411 (second outer edge) and 413 (first outer edge) facing each other, and outer edges 412 and 414 facing each other. The composite filter component 50B may have a polygonal shape assuming the main surface 553 is viewed in a plan view.

The input bumps 511 to 514 are disposed on the main surface 553 in the first direction (x-axis negative direction) along the outer edge 413 in the order of the input bumps 514, 513, 512, and 511. On the other hand, the output bumps 501 and bump 502 are disposed on the main surface 553 in the first direction (x-axis negative direction) of a region between the input bumps 511 to 514 and the outer edge 411 in the order of the output bumps 502 and 501.

According to this configuration, the wires do not intersect in a region between the input bumps 511 to 514 and the power amplifiers 37 and 38 disposed on the input side of the composite filter component 50B. Therefore, the matching loss of the transmission signals output from the power amplifiers 37 and 38 can be reduced, and the deterioration of the amplification characteristics on the input side of the composite filter component 50B can be suppressed.

The input bumps 511 to 514 do not need to be linearly disposed in the first direction as shown in FIG. 13B. In the input bumps 511 to 514, in a region between the outer edge 413 and the output bumps 501 and 502, the input bumps 511 and 512 may be disposed adjacent to each other, and the input bumps 513 and 514 may be disposed adjacent to each other.

The filters 500*a* and 500*b* are disposed in the first direction (x-axis negative direction) in the order of the filters 500*b* and 500*a*. The filters 500*c* and 500*d* are disposed in the first direction (x-axis negative direction) in the order of the filters 500*c* and 500*d*. Assuming the main surfaces 551 and 553 are viewed in a plan view, the filter 500*b* and the filter 500*c* at least partially overlap each other, and the filter 500*a* and the filter 500*d* at least partially overlap each other.

That is, in the composite filter component 50B according to the present example, two filters which do not perform simultaneous transmission are disposed in one filter chip. In this manner, the isolation between two transmission signals which are simultaneously transmitted is improved, and the heat dissipation from the filter chip is dispersed. In addition, the two filters which perform simultaneous transmission are disposed in different filter chips, and are disposed not to overlap each other in a plan view. In this manner, a distance between the two filters which perform simultaneous transmission is secured, and the isolation between the two transmission signals which are simultaneously transmitted is further improved.

In addition, the frequencies of the BLT (B66T) and the ALT (B3T) partially overlap each other. Therefore, assuming the filter 500*c* and the filter 500*d* overlap each other in a plan view of the main surface 551, the isolation deteriorates. Therefore, the filter 500*c* and the filter 500*d* are disposed in a plane in the same filter chip 522.

According to the above-described disposition configuration, the wire connecting the output bump 501 and the filters 500*a* and 500*c* does not intersect the wire connecting the output bump 502 and the filters 500*b* and 500*d* inside the filter chip 521, and does not intersect inside the filter chip 522 (refer to (a), (b), and (d) of FIG. 13B). In addition, the wire connecting the input bump 511 and the filter 500*a*, the wire connecting the input bump 512 and the filter 500*b*, the wire connecting the input bump 513 and the filter 500*d*, and the wire connecting the input bump 514 and the filter 500*c* do not intersect inside the filter chip 521, and do not intersect inside the filter chip 522 (refer to (a), (b), and (e) of FIG. 13B).

That is, inside the composite filter component 50B, the wire connecting the input bump and the filter does not intersect inside the filter chip, and the wire connecting the output bump and the filter does not intersect inside the filter chip. In this manner, the matching loss of the transmission signals output from the power amplifiers 37 and 38 disposed on the input side of the composite filter component 50B can be reduced, and the isolation between the filters 500*a* to 500*d* inside the composite filter component 50B can be improved. Therefore, the composite filter component 50B can transmit the transmission signal of the ALT and the transmission signal of the AMT, which simultaneously pass therethrough, with a low loss, and can transmit the transmission signal of the BLT and the transmission signal of the BMT, which simultaneously pass therethrough, with a low loss.

In addition, as shown in (c) of FIG. 13B, assuming the main surface 553 is viewed in a plan view, an area of the input bump 512 is larger than an area of the input bump 513, and an area of the input bump 511 is larger than an area of the input bump 514.

The filters 500*c* and 500*d* disposed in the filter chip 522 have high heat dissipation to the main surface 551 side which is the top surface. On the other hand, the filters 500*a* and 500*b* disposed in the filter chip 521 pinched between the filter chip 522 and the mounting substrate have low heat dissipation to the outside. In contrast, the area of the input bump 511 connected to the filter 500*a* is larger than the area of the input bump 514 connected to the filter 500*c*, and the area of the input bump 512 connected to the filter 500*b* is larger than the area of the input bump 513 connected to the filter 500*d*. Therefore, the heat dissipation of the filter chip 521 can be improved. Therefore, the heat dissipation of the composite filter component 50B can be improved.

The shield electrode layer 590 may be formed on the main surface 551 of the composite filter component 50B. According to this configuration, the heat dissipation from the filter chip 522 to the main surface 551 side can be further improved.

Figure 14:
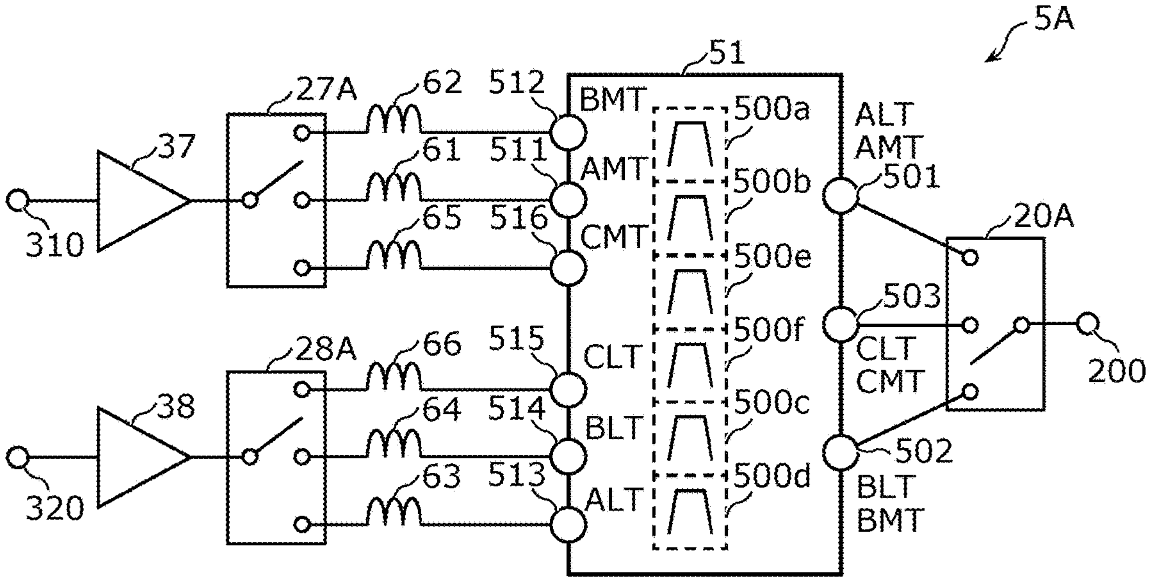
FIG. 14 is a circuit configuration diagram of a radio frequency module according to a modification example of Embodiment 2.

2.4 Configuration of Radio Frequency Module 5A According to Modification Example FIG. 14 is a circuit configuration diagram of a radio frequency module 5A according to a modification example of Embodiment 2. As shown in FIG. 14, the radio frequency module 5A according to the present modification example includes a composite filter component 51, the power amplifiers 37 and 38, the switches 20A, 27A, and 28A, the inductors 61, 62, 63, 64, 65, and 66, the antenna connection terminal 200, and the signal input terminals 310 and 320. The radio frequency module 5A according to the present modification example is different from the radio frequency module 5 according to Embodiment 2 in that there are three sets of bands signals of which are simultaneously transmitted. Hereinafter, the radio frequency module 5A according to the present modification example will be described, and the same configurations as those of the radio frequency module 5 according to Embodiment 2 will be omitted in the description. Different configurations will be mainly described.

The composite filter component 51 includes the filters 500*a*, 500*b*, 500*c*, 500*d*, 500*e*, and 500*f*, the output bumps 501, 502, and 503, and the input bumps 511, 512, 513, 514, 515, and 516.

The filter 500*d* has the first pass band including the transmission band (BLT) of the band BL (first band). The filter 500*c* has the second pass band including the transmission band (ALT) of the band AL (second band). The filter 500*b* has the third pass band including the transmission band (BMT) of the band BM (third band). The filter 500*a* has the fourth pass band including the transmission band (AMT) of the band AM (fourth band). The filter 500*f* has the pass band including the transmission band (CLT) of the band CL. The filter 500*e* has the pass band including the transmission band (CMT) of the band CM.

The signal of the band BL (first band) and the signal of the band BM (third band) can be simultaneously transmitted, and the signal of the band AL (second band) and the signal of the band AM (fourth band) can be simultaneously transmitted. In addition, the signal of the band CL and the signal of the band CM are not simultaneously transmitted.

The output bump 502 is an example of the first output bump, and is connected to the output end of the filter 500*d* and the output end of the filter 500*b*. The output bump 501 is an example of the second output bump, and is connected to the output end of the filter 500*c* and the output end of the filter 500*a*. The output bump 503 is connected to the output end of the filter 500*f* and the output end of the filter 500*e*.

The input bump 514 is an example of the first input bump, and is connected to the input end of the filter 500*d*. The input bump 513 is an example of the second input bump, and is connected to the input end of the filter 500*c*. The input bump 512 is an example of the third input bump, and is connected to the input end of the filter 500*b*. The input bump 511 is an example of the fourth input bump, and is connected to the input end of the filter 500*a*. The input bump 515 is connected to the input end of the filter 500*f*. The input bump 516 is connected to the input end of the filter 500*e*.

In the input bumps 511 to 516, the input bump 511, the input bump 512, and the input bump 516 are disposed adjacent to each other, and the input bump 513, the input bump 514, and the input bump 515 are disposed adjacent to each other.

The power amplifier 38 is an example of the first power amplifier, and can amplify the signals of the ALT, the BLT, and the CLT. Since the bands AL, BL, and CL are a combination of bands signals of which are not simultaneously transmitted, the power amplifier 38 can be connected to the filter 500*d* including the BLT in the pass band, the filter 500*c* including the ALT in the pass band, and the filter 500*f* including the CLT in the pass band. In this manner, the output end of the power amplifier 38 is connected to the input bumps 513, 514, and 515 with the switch 28A interposed therebetween.

The power amplifier 37 is an example of the second power amplifier, and can amplify the signals of the AMT, BMT, and CMT. Since the bands AM, BM, and CM are a combination of bands signals of which are not simultaneously transmitted, the power amplifier 37 can be connected to the filter 500*b* including the BMT in the pass band, the filter 500*a* including the AMT in the pass band, and the filter 500*e* including the CMT in the pass band. In this manner, the output end of the power amplifier 37 is connected to the input bumps 511, 512, and 516 with the switch 27A interposed therebetween.

The switch 20A is connected between the antenna connection terminal 200 and the composite filter component 51. The switch 27A is connected between the power amplifier 37 and the composite filter component 51. The switch 28A is connected between the power amplifier 38 and the composite filter component 51.

The inductor 65 is connected between the input bump 516 and the switch 27A. The inductor 66 is connected between the input bump 515 and the switch 28A.

In addition, the radio frequency module 5A according to the present modification example does not need to include at least one of the switches 20A, 27A, and 28A or the inductors 61 to 66.

In the above-described configuration of the composite filter component 51 according to the present modification example, on the output side of the composite filter component 51, the filters 500*b* (BMT) and 500*d* (BLT) which can perform simultaneous transmission are connected to the output bump 502, and the filters 500*a* (ANMT) and 500*c* (ALT) which can perform simultaneous transmission are connected to the output bump 501. On the other hand, on the input side of the composite filter component 51, the input bump 514 connected to the filter 500*d*, the input bump 513 connected to the filter 500*c*, and the input bump 515 connected to the filter 500*f* are adjacent to each other, and the input bump 512 connected to the filter 500*b*, the input bump 511 connected to the filter 500*a*, and the input bump 516 connected to the filter 500*e* are adjacent to each other.

According to this configuration, assuming the filters 500*d* (to which the input bump 514 is connected), 500*c* (to which the input bump 513 is connected), and 500*f* (to which the input bump 515 is connected) which do not perform simultaneous transmission are connected to the power amplifier 38, and the filters 500*b* (to which the input bump 512 is connected), 500*a* (to which the input bump 511 is connected), and 500*e* (to which the input bump 516 is connected) which do not perform simultaneous transmission are connected to the power amplifier 37, the filters 500*a* to 500*f* and the power amplifiers 37 and 38 can be connected without causing the intersection of the wires connecting the input bumps 511 to 516 and the power amplifiers 37 and 38. In this manner, it is possible to suppress the occurrence of the parasitic capacitance caused by the intersection of the wires, in the vicinity of the output ends of the power amplifiers 37 and 38. According to this configuration, the wires do not intersect in a region between the input bumps 511 to 516 and the power amplifiers 37 and 38. Therefore, the matching loss of the transmission signals output from the power amplifiers 37 and 38 can be reduced, and the deterioration of the amplification characteristics on the input side of the composite filter component 51 can be suppressed.

For example, the band AL is Band 3 for LTE or n3 for 5GNR. For example, the band AM is Band 1 for LTE or n1 for 5GNR. For example, the band BL is Band 66 for LTE or n66 for 5GNR. For example, the band BM is Band 25 for LTE or n25 for 5GNR. For example, the band CL is Band 39 for LTE or n39 for 5GNR. For example, the band CM is Band 34 for LTE or n34 for 5GNR.

2.5 Structure of Composite Filter Component 51A According to Example 14

Figure 15:
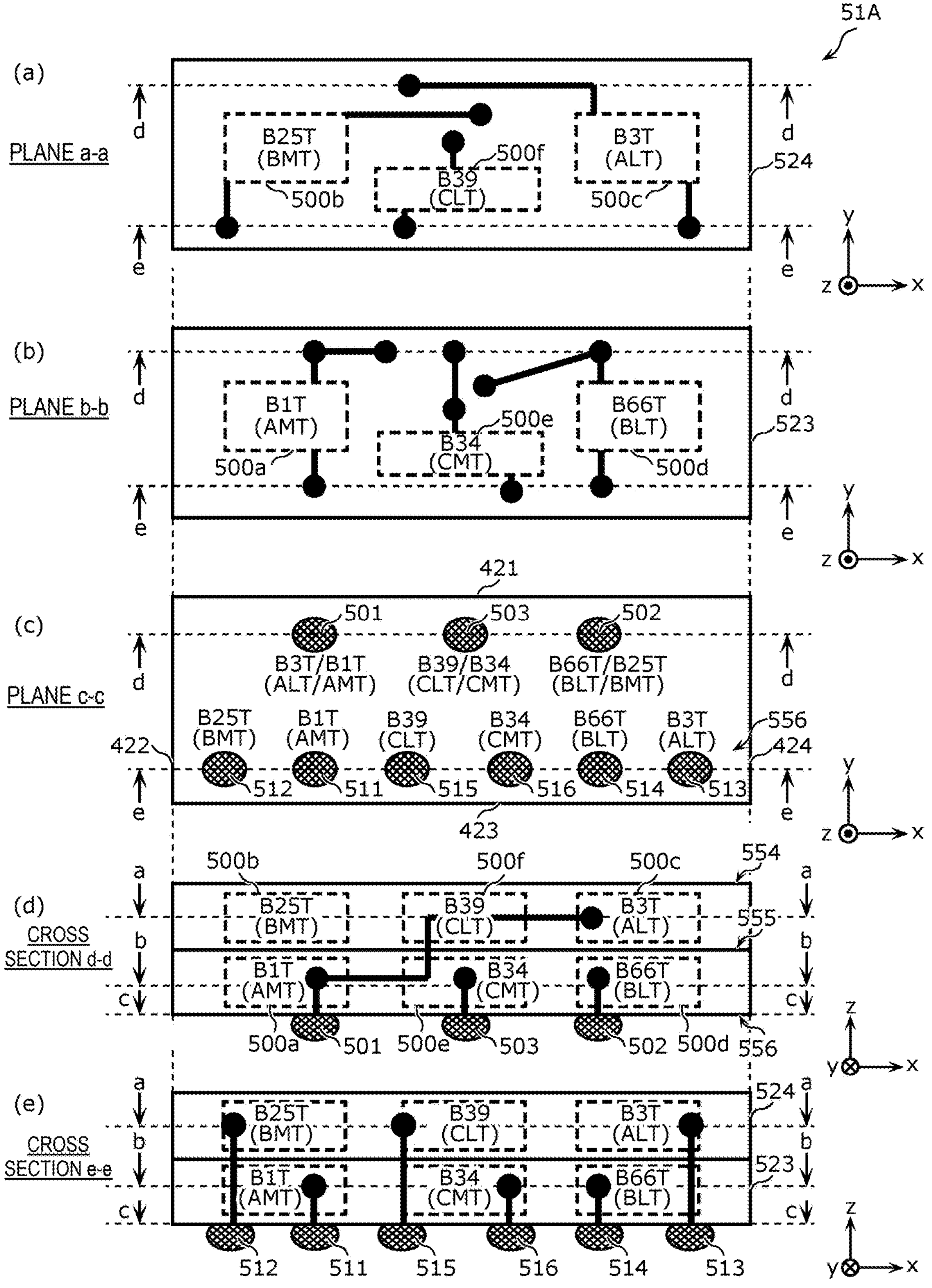
FIG. 15 is a plan view and a cross-sectional view of a composite filter component according to Example 14.

As a specific configuration example of the composite filter component 51 provided in the radio frequency module 5A according to the modification example, a composite filter component 51A according to Example 14 will be described. FIG. 15 is a plan view and a cross-sectional view of the composite filter component 51A according to Example 14. FIG. 15 shows a disposition configuration example of each filter and each bump which form the composite filter component 51A. (a) of FIG. 15 is a view assuming the plane a-a is viewed from the positive side of the z-axis, (b) of FIG. 15 is a view assuming the plane b-b is viewed from the positive side of the z-axis, (c) of FIG. 15 is a view assuming the plane c-c is viewed from the positive side of the z-axis, (d) of FIG. 15 is a view assuming the cross section d-d is viewed from the negative side of the y-axis, and (e) of FIG. 15 is a view assuming the cross section e-e is viewed from the negative side of the y-axis. The plane a-a is a plane parallel to a main surface 554 and between the main surface and a facing main surface of a filter chip 524. In addition, the plane b-b is a plane parallel to a main surface 556 and between the main surface and a facing main surface of a filter chip 523. In addition, the plane c-c is the main surface 556. In addition, the cross section d-d is a plane perpendicular to the main surface 556 and passing through the output bumps 501 to 503. In addition, the cross section e-e is a plane perpendicular to the main surface 556 and passing through the input bumps 511 to 516.

The composite filter component 51A includes the filter chips 523 and 524 laminated on each other, and includes the main surface 556 (first main surface) and the main surface 554 (second main surface) which face each other. The filter chip 523 is an example of the first layer portion, and includes the main surface 556 (first main surface), and the filters 500*a* (ANMT), 500*d* (BLT), and 500*e* (CMT). The filter chip 524 is an example of the second layer portion, and includes the main surface 554 (second main surface), and the filters 500*b* (BMT), 500*c* (ALT), and 500*f* (CLT).

In the present example, the filter 500*d* is connected to the output bump 502 (first output bump) and the input bump 514 (first input bump). The filter 500*c* is connected to the output bump 501 (second output bump) and the input bump 513 (second input bump). The filter 500*b* is connected to the output bump 502 (first output bump) and the input bump 512 (third input bump). The filter 500*a* is connected to the output bump 501 (second output bump) and the input bump 511 (fourth input bump). The filter 500*f* is connected to the output bump 503 (third output bump) and the input bump 515 (sixth input bump). The filter 500*e* is connected to the output bump 503 (third output bump) and the input bump 516 (fifth input bump).

Assuming the band CL is Band 39 for LTE or n39 for 5GNR, the filter 500*f* is a filter for TDD. Assuming the band CM is Band 34 for LTE or n34 for 5GNR, the filter 500*e* is the filter for TDD.

For example, each of the filter chips 523 and 524 has a form in which (1) the IC chip is used on the silicon substrate, (2) two filters are accommodated inside one package, or (3) functional electrodes of two filters are formed on one piezoelectric substrate. In addition, for example, the composite filter component 51A has at least one form of (1) the filter chips 523 and 524 are bonded between electrodes, (2) the filter chips 523 and 524 are bonded with an adhesive, and (3) the filter chips 523 and 524 are formed in a resin mold. In the present example, the filter chips 523 and 524 are bonded in an interface 555.

As shown in (c) of FIG. 15, the composite filter component 51A has a rectangular shape assuming the main surface 556 is viewed in a plan view, and has outer edges 421 (second outer edge) and 423 (first outer edge) facing each other, and outer edges 422 and 424 facing each other. The composite filter component 51A may have a polygonal shape assuming the main surface 556 is viewed in a plan view.

The input bumps 511 to 516 are disposed on the main surface 556 in the first direction (x-axis negative direction) along the outer edge 423 in the order of the output bumps 513, 514, 516, 515, 511, and 512. On the other hand, the output bumps 501 to 503 are disposed on the main surface 556 in the first direction (x-axis negative direction) of a region between the input bumps 511 to 516 and the outer edge 421 in the order of the output bumps 502, 503, and 501.

According to this configuration, the wires do not intersect in a region between the input bumps 511 to 516 and the power amplifiers 37 and 38 disposed on the input side of the composite filter component 51A. Therefore, the matching loss of the transmission signals output from the power amplifiers 37 and 38 can be reduced, and the deterioration of the amplification characteristics on the input side of the composite filter component 51A can be suppressed.

The input bumps 511 to 516 do not need to be linearly disposed in the first direction as shown in FIG. 15. In the input bumps 511 to 516, in a region between the outer edge 423 and the output bumps 501 to 503, the input bumps 511, 512, and 515 may be disposed adjacent to each other, and the input bumps 513, 514, and 516 may be disposed adjacent to each other.

The filters 500*a*, 500*d*, and 500*e* are disposed in the first direction (x-axis negative direction) in the order of the filters 500*d*, 500*e*, and 500*a*. The filters 500*b*, 500*c*, and 500*f* are disposed in the first direction (x-axis negative direction) in the order of the filters 500*c*, 500*f*, and 500*b*. Assuming the main surfaces 554 and 556 are viewed in a plan view, the filter 500*d* and the filter 500*c* at least partially overlap each other, the filter 500*e* and the filter 500*f* at least partially overlap each other, and the filter 500*a* and the filter 500*b* at least partially overlap each other.

That is, in the composite filter component 51A according to the present example, three filters which do not perform simultaneous transmission are disposed in one filter chip. In addition, two filters that perform simultaneous transmission are distributed to different filter chips, and are disposed not to overlap each other in a plan view. Furthermore, the filters 500*e* and 500*f* which perform transmission alone are disposed between two filters which perform simultaneous transmission in a plan view. In this manner, the isolation between the two transmission signals which are simultaneously transmitted is improved.

According to the above-described disposition configuration, the wire connecting the output bump 501 and the filters 500*a* and 500*c*, the wire connecting the output bump 502 and the filters 500*b* and 500*d*, and the wire connecting the output bump 503 and the filters 500*e* and 500*f* do not intersect inside the filter chip 523, and do not intersect inside the filter chip 524 (refer to (a), (b), and (d) of FIG. 15). In addition, the wire connecting the input bump 511 and the filter 500*a*, the wire connecting the input bump 512 and the filter 500*b*, the wire connecting the input bump 513 and the filter 500*c*, the wire connecting the input bump 514 and the filter 500*d*, the wire connecting the input bump 515 and the filter 500*f*, and the wire connecting the input bump 516 and the filter 500*e* do not intersect inside the filter chip 523, and do not intersect inside the filter chip 524 (refer to (a), (b), and (e) of FIG. 15).

That is, inside the composite filter component 51A, the wire connecting the input bump and the filter does not intersect inside the filter chip, and the wire connecting the output bump and the filter does not intersect inside the filter chip. In this manner, the matching loss of the transmission signals output from the power amplifiers 37 and 38 disposed on the input side of the composite filter component 51A can be reduced, and the isolation between the filters 500*a* to 500*f* inside the composite filter component 51A can be improved. Therefore, the composite filter component 51A can transmit the transmission signal of the band AL and the transmission signal of the band AM, which simultaneously pass therethrough, with a low loss, and can transmit the transmission signal of the band BL and the transmission signal of the band BM, which simultaneously pass therethrough, with a low loss.

2.6 Advantageous Effects, Etc.

As described above, the composite filter component 50 according to the present embodiment includes the filter 500*d* having the first pass band including the transmission band of the band BL, the filter 500*c* having the second pass band including the transmission band of the band AL, the filter 500*b* having the third pass band including the transmission band of the band BM a signal of which is configured to be simultaneously transmitted with a signal of the band BL, the filter 500*a* having the fourth pass band including the transmission band of the band AM a signal of which is configured to be simultaneously transmitted with a signal of the band AL, the output bump 502 connected to the output end of the filter 500*d* and the output end of the filter 500*b*, the output bump 501 connected to the output end of the filter 500*c* and the output end of the filter 500*a*, the input bump 514 connected to the input end of the filter 500*d*, the input bump 513 connected to the input end of the filter 500*c*, the input bump 512 connected to the input end of the filter 500*b*, and the input bump 511 connected to the input end of the filter 500*a*. In the input bumps 511 to 514, the input bump 514 and the input bump 513 are disposed adjacent to each other, and the input bump 512 and the input bump 511 are disposed adjacent to each other.

According to this configuration, assuming the filters 500*d* and 500*c* which do not perform simultaneous transmission are connected to the power amplifier 38, and the filters 500*b* and 500*a* which do not perform simultaneous transmission are connected to the power amplifier 37, the filters 500*a* to 500*d* and the power amplifiers 37 and 38 can be connected without causing the intersection of the wires connecting the input bumps 511 to 514 and the power amplifiers 37 and 38. In this manner, it is possible to suppress the occurrence of the parasitic capacitance caused by the intersection of the wires, in the vicinity of the output ends of the power amplifiers 37 to 38. Therefore, it is possible to provide the multi-band compatible composite filter component 50 which can reduce the matching loss of the transmission signals output from the power amplifiers 37 and 38.

In addition, for example, the composite filter components 50A and 50B have the main surfaces 553 and 551 facing each other, and have a polygonal shape having the outer edges 401 (411) and 403 (413) facing each other assuming the main surface 553 is viewed in a plan view. The input bumps 511 to 514 are disposed on the main surface 553 in the first direction along the outer edge 403 (413) in the order of the input bumps 514, 513, 512, and 511, and the output bumps 501 and 502 are disposed on the main surface 553 between the input bumps 511 to 514 and the outer edge 401 (411).

According to this configuration, the wires do not intersect in a region between the input bumps 511 to 514 and the power amplifiers 37 and 38 disposed on the input side of the composite filter components 50A and 50B. Therefore, the matching loss of the transmission signals output from the power amplifiers 37 and 38 can be reduced, and the deterioration of the amplification characteristics on the input side of the composite filter components 50A and 50B can be suppressed.

In addition, for example, the composite filter component 50A according to Example 12 includes the filter chips 521 and 522 laminated on each other, the filter chip 521 includes the main surface 553, and the filters 500*a* and 500*d*. The filter chip 522 includes the main surface 551, and the filters 500*b* and 500*c*. The filters 500*a* and 500*d* are disposed in the first direction in the order of the filters 500*d* and 500*a*. The filters 500*b* and 500*c* are disposed in the first direction in the order of the filters 500*c* and 500*b*. Assuming the main surfaces 551 and 553 are viewed in plan view, the filter 500*d* and the filter 500*c* at least partially overlap each other, and the filter 500*b* and the filter 500*a* at least partially overlap each other.

According to this configuration, two filters which do not perform simultaneous transmission are disposed in one filter chip, two filters which perform simultaneous transmission are disposed in different filter chips not to overlap each other in a plan view. In this manner, the isolation between the two transmission signals which are simultaneously transmitted can be improved, and the heat dissipation from the filter chip can be dispersed.

In addition, for example, in the composite filter component 50A, assuming the main surface 553 is viewed in a plan view, an area of the input bump 514 is larger than an area of the input bump 512, and an area of the input bump 511 is larger than an area of the input bump 513.

According to this configuration, the heat dissipation of the filter chip 521 pinched between the filter chip 522 and the mounting substrate can be improved. Therefore, the heat dissipation of the composite filter component 50A can be improved.

In addition, for example, the composite filter component 50B according to Example 13 includes the filter chips 521 and 522 laminated on each other. The transmission band of the band BL and the transmission band of the band AL at least partially overlap each other. The filter chip 521 includes the main surface 553, and the filters 500*a* and 500*b*. The filter chip 522 includes the main surface 551, and the filters 500*c* and 500*d*. The filters 500*b* and 500*a* are disposed in the first direction in the order of the filter 500*b* and the filter 500*a*. The filters 500*c* and 500*d* are disposed in the first direction in the order of the filter 500*c* and the filter 500*d*. Assuming the main surfaces 551 and 553 are viewed in a plan view, the filter 500*b* and the filter 500*c* at least partially overlap each other, and the filter 500*a* and the filter 500*d* at least partially overlap each other.

According to this configuration, two filters which do not perform simultaneous transmission are disposed in one filter chip, and two filters which perform simultaneous transmission are disposed in different filter chips not to overlap each other in a plan view. In this manner, the isolation between the two transmission signals which are simultaneously transmitted can be improved, and the heat dissipation from the filter chip can be dispersed. In addition, the filter 500*c* and the filter 500*d* whose frequencies of the pass bands partially overlap each other do not overlap each other in a plan view. In this manner, the isolation between the filter 500*c* and the filter 500*d* can be improved.

In addition, for example, in the composite filter component 50B, assuming the main surface 553 is viewed in a plan view, an area of the input bump 512 is larger than an area of the input bump 513, and an area of the input bump 511 is larger than an area of the input bump 514.

According to this configuration, the heat dissipation of the filter chip 521 pinched between the filter chip 522 and the mounting substrate can be improved. Therefore, the heat dissipation of the composite filter component 50B can be improved.

In addition, for example, the radio frequency modules 5 and 5A according to Embodiment 2 include the mounting substrate having the third main surface and the fourth main surface which face each other, any one of the composite filter components 50 and 51 disposed on the mounting substrate, and the power amplifiers 37 and 38 disposed on the mounting substrate. The output end of the power amplifier 38 is connected to the input bumps 513 and 514, and the output end of the power amplifier 37 is connected to the input bumps 511 and 512.

According to this configuration, it is possible to provide the multi-band compatible radio frequency modules 5 and 5A which can reduce the matching loss of the transmission signals output from the power amplifiers 37 and 38.

In addition, for example, in the radio frequency modules 5 and 5A, the input bumps 513 and 514 are disposed closer to the power amplifier 38 than the power amplifier 37, and the input bumps 511 and 512 are disposed closer to the power amplifier 37 than the power amplifier 38.

According to this configuration, the wire connecting the input bumps 513 and 514 and the power amplifier 38, and the wire connecting the input bumps 511 and 512 and the power amplifier 37 can be shortened. Therefore, a loss and a size of the radio frequency modules 5 and 5A can be reduced.

Other Embodiments

Hitherto, the composite filter component and the radio frequency module according to the present disclosure have been described with reference to the embodiments. The composite filter component and the radio frequency module according to the present disclosure are not limited to the above-described embodiments. The present disclosure also includes another embodiment realized by combining any configuration elements in the above-described embodiments, modification examples obtained by various modifications conceived by those skilled in the art within the scope not departing from the concept of the present disclosure with respect to the above-described embodiments, and various devices incorporating the composite filter component and the radio frequency module.

For example, in the circuit configuration of the composite filter component and the radio frequency module according to each embodiment, another circuit element, a wire, or the like may be inserted between the paths connecting each circuit element and each signal path which are disclosed in the drawings.

The band applied in the above-described embodiment may be a band described below. Hereinafter, Band X for LTE and nX for 5GNR will be collectively referred to as BX. For example, combinations of bands connected to the same low noise amplifier (signals of which are not simultaneously received) include (1) at least two of B5, B8, and B26, (2) at least two of B12, B13, B14, B20, B28, B29, and n85, (3) B11+B21 and B32, (4) B71 and n105, (5) at least two of B1, B66, and B34, (6) at least two of B3, B25, B39, and n70, (7) B7 and B41, and (8) B30 and B40.

Hereinafter, characteristics of the composite filter component and the radio frequency module which are described based on the above-described embodiments, modification examples, and examples will be described.

<1> A composite filter component includes a first filter having a first pass band including a reception band of a first band, a second filter having a second pass band including a reception band of a second band, a third filter having a third pass band including a reception band of a third band a signal of which is configured to be simultaneously received with a signal of the first band, a fourth filter having a fourth pass band including a reception band of a fourth band a signal of which is configured to be simultaneously received with a signal of the second band, a first input bump connected to an input end of the first filter and an input end of the third filter, a second input bump connected to an input end of the second filter and an input end of the fourth filter, a first output bump connected to an output end of the first filter, a second output bump connected to an output end of the second filter, a third output bump connected to an output end of the third filter, and a fourth output bump connected to an output end of the fourth filter. In the first output bump, the second output bump, the third output bump, and the fourth output bump, the first output bump and the second output bump are disposed adjacent to each other, and the third output bump and the fourth output bump are disposed adjacent to each other.

<2> In the composite filter component according to <1>, the composite filter component has a first main surface and a second main surface which face each other, and has a substantially rectangular shape having a first outer edge and a second outer edge which face each other, assuming the first main surface is viewed in a plan view. The first output bump, the second output bump, the third output bump, and the fourth output bump are disposed on the first main surface in a first direction along the first outer edge in an order of the fourth output bump, the third output bump, the second output bump, and the first output bump. The first input bump and the second input bump are disposed on the first main surface between the first output bump, the second output bump, the third output bump, and the fourth output bump, and the second outer edge.

<3> In the composite filter component according to <2>, the composite filter component includes a first layer portion and a second layer portion which are laminated on each other. The first layer portion includes the first main surface, the third filter, and the fourth filter. The second layer portion includes the second main surface, the first filter, and the second filter. The first filter and the second filter are disposed in the first direction in an order of the second filter and the first filter. The third filter and the fourth filter are disposed in the first direction in an order of the fourth filter and the third filter. Assuming the first main surface and the second main surface are viewed in a plan view, the first filter and the third filter at least partially overlap each other, and the second filter and the fourth filter at least partially overlap each other.

<4> In the composite filter component according to <2>, the composite filter component includes a first layer portion and a second layer portion which are laminated on each other. The first layer portion includes the first main surface, the third filter, and the fourth filter. The second layer portion includes the second main surface, the first filter, and the second filter. The first filter and the second filter are disposed in the first direction in an order of the first filter and the second filter. The third filter and the fourth filter are disposed in the first direction in an order of the fourth filter and the third filter. Assuming the first main surface and the second main surface are viewed in a plan view, the first filter and the fourth filter at least partially overlap each other, and the second filter and the third filter at least partially overlap each other.

<5> In the composite filter component according to <3> or <4>, the first chip includes a first piezoelectric substrate. The third filter and the fourth filter are formed on the first piezoelectric substrate. The second chip includes a second piezoelectric substrate. The first filter and the second filter are formed on the second piezoelectric substrate.

<6> In the composite filter component according to <2>, the composite filter component includes a first layer portion and a second layer portion which are laminated on each other. The first layer portion includes the first main surface, the first filter, and the third filter. The second layer portion includes the second main surface, the second filter, and the fourth filter. The first filter and the third filter are disposed in the first direction in an order of the third filter and the first filter. The second filter and the fourth filter are disposed in the first direction in an order of the fourth filter and the second filter. Assuming the first main surface and the second main surface are viewed in a plan view, the first filter and the second filter at least partially overlap each other, and the third filter and the fourth filter at least partially overlap each other.

<7> In the composite filter component according to <6>, the first chip includes a first piezoelectric substrate. The first filter and the third filter are formed on the first piezoelectric substrate. The second chip includes a second piezoelectric substrate. The second filter and the fourth filter are formed on the second piezoelectric substrate.

<8> The composite filter component according to any one of <1> to <7> further includes a fifth filter having a fifth pass band including a reception band of a fifth band, a sixth filter having a sixth pass band including a reception band of a sixth band that is different from the fifth band and a signal of which is configured to be simultaneously received with a signal of the fifth band, a third input bump connected to an input end of the fifth filter and an input end of the sixth filter, a fifth output bump connected to an output end of the fifth filter, and a sixth output bump connected to an output end of the sixth filter. In the first output bump to the sixth output bump, the fifth output bump is disposed adjacent to the first output bump and the second output bump, and the sixth output bump is disposed adjacent to the third output bump and the fourth output bump.

<9> The composite filter component according to any one of <1> to <7> further includes a fifth filter having a fifth pass band including a transmission band and a reception band of a fifth band, a sixth filter having a sixth pass band including a transmission band and a reception band of a sixth band, a third input bump connected to one end of the fifth filter and one end of the sixth filter, a fifth output bump connected to the other end of the fifth filter, and a sixth output bump connected to the other end of the sixth filter. Each of the fifth filter and the sixth filter is a filter for time division duplex communication. The composite filter component has a first main surface and a second main surface which face each other, and has a polygonal shape having a first outer edge and a second outer edge which face each other assuming the first main surface is viewed in a plan view. The first output bump to the sixth output bump are disposed on the first main surface in a first direction along the first outer edge in an order of the fourth output bump, the third output bump, the second output bump, the first output bump, the sixth output bump, and the fifth output bump. The first input bump to the third input bump are disposed on the first main surface in the first direction in a region between the first output bump to the sixth output bump and the second outer edge in an order of the second input bump, the first input bump, and the third input bump.

<10> The composite filter component according to any one of <1> to <7> further includes a seventh filter having a seventh pass band including a reception band of a seventh band that is different from the first band and the third band and a signal of which is configured to be simultaneously received with signals of the first band and the third band, an eighth filter having an eighth pass band including a reception band of an eighth band that is different from the second band and the fourth band and a signal of which is configured to be simultaneously received with signals of the second band and the fourth band, a seventh output bump connected to an output end of the seventh filter, and an eighth output bump connected to an output end of the eighth filter. The first input bump is connected to an input end of the first filter, an input end of the third filter, and an input end of the seventh filter. The second input bump is connected to an input end of the second filter, an input end of the fourth filter, and an input end of the eighth filter. In the first output bump to the fourth output bump, the seventh output bump, and the eighth output bump, the first output bump and the second output bump are disposed adjacent to each other, the third output bump and the fourth output bump are disposed adjacent to each other, and the seventh output bump and the eighth output bump are disposed adjacent to each other.

<11> A composite filter component includes a first filter having a first pass band including a transmission band of a first band, a second filter having a second pass band including a transmission band of a second band, a third filter having a third pass band including a transmission band of a third band a signal of which is configured to be simultaneously transmitted with a signal of the first band, a fourth filter having a fourth pass band including a transmission band of a fourth band a signal of which is configured to be simultaneously transmitted with a signal of the second band, a first output bump connected to an output end of the first filter and an output end of the third filter, a second output bump connected to an output end of the second filter and an output end of the fourth filter, a first input bump connected to an input end of the first filter, a second input bump connected to an input end of the second filter, a third input bump connected to an input end of the third filter, and a fourth input bump connected to an input end of the fourth filter. In the first input bump, the second input bump, the third input bump, and the fourth input bump, the first input bump and the second input bump are disposed adjacent to each other, and the third input bump and the fourth input bump are disposed adjacent to each other.

<12> In the composite filter component according to <11>, the composite filter component has a first main surface and a second main surface which face each other, and has a polygonal shape having a first outer edge and a second outer edge which face each other, assuming the first main surface is viewed in a plan view. The first input bump, the second input bump, the third input bump, and the fourth input bump are disposed on the first main surface in a first direction along the first outer edge in an order of the first input bump, the second input bump, the third input bump, and the fourth input bump. The first output bump and the second output bump are disposed on the first main surface between the first input bump, the second input bump, the third input bump, and the fourth input bump, and the second outer edge.

<13> In the composite filter component according to <12>, the composite filter component includes a first layer portion and a second layer portion which are laminated on each other. The first layer portion includes the first main surface, the first filter, and the fourth filter. The second layer portion includes the second main surface, the second filter, and the third filter. The first filter and the fourth filter are disposed in the first direction in an order of the first filter and the fourth filter. The second filter and the third filter are disposed in the first direction in an order of the second filter and the third filter. Assuming the first main surface and the second main surface are viewed in a plan view, the first filter and the second filter at least partially overlap each other, and the third filter and the fourth filter at least partially overlap each other.

<14> In the composite filter component according to <13>, assuming the first main surface is viewed in a plan view, an area of the first input bump is larger than an area of the third input bump, and an area of the fourth input bump is larger than an area of the second input bump.

<15> In the composite filter component according to <11>, the composite filter component includes a first layer portion and a second layer portion which are laminated on each other. The composite filter component has a first main surface and a second main surface which face each other. A transmission band of the first band and a transmission band of the second band at least partially overlap each other. The first layer portion includes the first main surface, the third filter, and the fourth filter. The second layer portion includes the second main surface, the first filter, and the second filter. The third filter and the fourth filter are disposed in the first direction in an order of the third filter and the fourth filter. The first filter and the second filter are disposed in the first direction in an order of the second filter and the first filter. Assuming the first main surface and the second main surface are viewed in a plan view, the first filter and the fourth filter at least partially overlap each other, and the second filter and the third filter at least partially overlap each other.

<16> In the composite filter component according to <15>, assuming the first main surface is viewed in a plan view, an area of the third input bump is larger than an area of the first input bump, and an area of the fourth input bump is larger than an area of the second input bump.

<17> A radio frequency module includes a mounting substrate having a third main surface and a fourth main surface which face each other, the composite filter component according to any one of <1> to <10>, which is disposed on the mounting substrate, and a first low noise amplifier and a second low noise amplifier which are disposed on the mounting substrate. An input end of the first low noise amplifier is connected to the first output bump and the second output bump, and an input end of the second low noise amplifier is connected to the third output bump and the fourth output bump.

<18> In the radio frequency module according to <17>, the first output bump and the second output bump are disposed closer to the first low noise amplifier than the second low noise amplifier, and the third output bump and the fourth output bump are disposed closer to the second low noise amplifier than the first low noise amplifier.

<19> A radio frequency module includes a mounting substrate having a third main surface and a fourth main surface which face each other, the composite filter component according to any one of <11> to <16>, which is disposed on the mounting substrate, and a first power amplifier and a second power amplifier which are disposed on the mounting substrate. An output end of the first power amplifier is connected to the first input bump and the second input bump, and an output end of the second power amplifier is connected to the third input bump and the fourth input bump.

<20> In the radio frequency module according to <19>, the first input bump and the second input bump are disposed closer to the first power amplifier than the second power amplifier, and the third input bump and the fourth input bump are disposed closer to the second power amplifier than the first power amplifier.

The present disclosure can be widely used in a communication device such as a mobile phone and the like, as a multi-band compatible radio frequency module.

What is claimed is:

1. A composite filter component comprising:

a first filter having a first pass band including a reception band of a first band;

a second filter having a second pass band including a reception band of a second band;

a third filter having a third pass band including a reception band of a third band a signal of which is configured to be simultaneously received with a signal of the first band;

a fourth filter having a fourth pass band including a reception band of a fourth band a signal of which is configured to be simultaneously received with a signal of the second band;

a first input bump connected to an input end of the first filter and an input end of the third filter;

a second input bump connected to an input end of the second filter and an input end of the fourth filter;

a first output bump connected to an output end of the first filter;

a second output bump connected to an output end of the second filter;

a third output bump connected to an output end of the third filter; and a fourth output bump connected to an output end of the fourth filter, wherein in the first output bump, the second output bump, the third output bump, and the fourth output bump, the first output bump and the second output bump are disposed adjacent to each other, and the third output bump and the fourth output bump are disposed adjacent to each other.

2. The composite filter component according to claim 1, wherein the composite filter component has a first main surface and a second main surface which face each other, and has a substantially rectangular shape having a first outer edge and a second outer edge which face each other, assuming the first main surface is viewed in a plan view, the first output bump, the second output bump, the third output bump, and the fourth output bump are disposed on the first main surface in a first direction along the first outer edge in an order of the fourth output bump, the third output bump, the second output bump, and the first output bump, and the first input bump and the second input bump are disposed on the first main surface between the first output bump, the second output bump, the third output bump, and the fourth output bump, and the second outer edge.

3. The composite filter component according to claim 2, further comprising:

a first layer portion and a second layer portion which are laminated on each other, wherein the first layer portion includes the first main surface, the third filter, and the fourth filter, the second layer portion includes the second main surface, the first filter, and the second filter, the first filter and the second filter are disposed in the first direction in an order of the second filter and the first filter, the third filter and the fourth filter are disposed in the first direction in an order of the fourth filter and the third filter, and assuming the first main surface and the second main surface are viewed in a plan view, the first filter and the third filter at least partially overlap each other, and the second filter and the fourth filter at least partially overlap each other.

4. The composite filter component according to claim 2, further comprising:

a first layer portion and a second layer portion which are laminated on each other, wherein the first layer portion includes the first main surface, the third filter, and the fourth filter, the second layer portion includes the second main surface, the first filter, and the second filter, the first filter and the second filter are disposed in the first direction in an order of the first filter and the second filter, the third filter and the fourth filter are disposed in the first direction in an order of the fourth filter and the third filter, and assuming the first main surface and the second main surface are viewed in a plan view, the first filter and the fourth filter at least partially overlap each other, and the second filter and the third filter at least partially overlap each other.

5. The composite filter component according to claim 3, further comprising:

a first chip and a second chip which are laminated on each other, wherein the first chip includes a first piezoelectric substrate, the third filter and the fourth filter are formed on the first piezoelectric substrate, the second chip includes a second piezoelectric substrate, and the first filter and the second filter are formed on the second piezoelectric substrate.

6. The composite filter component according to claim 2, further comprising:

a first layer portion and a second layer portion which are laminated on each other, wherein the first layer portion includes the first main surface, the first filter, and the third filter, the second layer portion includes the second main surface, the second filter, and the fourth filter, the first filter and the third filter are disposed in the first direction in an order of the third filter and the first filter, the second filter and the fourth filter are disposed in the first direction in an order of the fourth filter and the second filter, and assuming the first main surface and the second main surface are viewed in a plan view, the first filter and the second filter at least partially overlap each other, and the third filter and the fourth filter at least partially overlap each other.

7. The composite filter component according to claim 6, further comprising:

a first chip and a second chip which are laminated on each other, wherein the first chip includes a first piezoelectric substrate, the first filter and the third filter are formed on the first piezoelectric substrate, the second chip includes a second piezoelectric substrate, and the second filter and the fourth filter are formed on the second piezoelectric substrate.

8. The composite filter component according to claim 7, further comprising:

a fifth filter having a fifth pass band including a reception band of a fifth band;

a sixth filter having a sixth pass band including a reception band of a sixth band that is different from the fifth band and a signal of which is configured to be simultaneously received with a signal of the fifth band;

a third input bump connected to an input end of the fifth filter and an input end of the sixth filter;

a fifth output bump connected to an output end of the fifth filter; and a sixth output bump connected to an output end of the sixth filter, wherein in the first output bump to the sixth output bump, the fifth output bump is disposed adjacent to the first output bump and the second output bump, and the sixth output bump is disposed adjacent to the third output bump and the fourth output bump.

9. The composite filter component according to claim 7, further comprising:

a fifth filter having a fifth pass band including a transmission band and a reception band of a fifth band;

a sixth filter having a sixth pass band including a transmission band and a reception band of a sixth band;

a third input bump connected to one end of the fifth filter and one end of the sixth filter;

a fifth output bump connected to another end of the fifth filter; and a sixth output bump connected to another end of the sixth filter, wherein each of the fifth filter and the sixth filter is a filter for time division duplex communication, the composite filter component has a first main surface and a second main surface which face each other, and has a polygonal shape having a first outer edge and a second outer edge which face each other assuming the first main surface is viewed in a plan view, the first output bump to the sixth output bump are disposed on the first main surface in a first direction along the first outer edge in an order of the fourth output bump, the third output bump, the second output bump, the first output bump, the sixth output bump, and the fifth output bump, and the first input bump to the third input bump are disposed on the first main surface in the first direction in a region between the first output bump to the sixth output bump and the second outer edge in an order of the second input bump, the first input bump, and the third input bump.

10. The composite filter component according to claim 7, further comprising:

a seventh filter having a seventh pass band including a reception band of a seventh band that is different from the first band and the third band and a signal of which is configured to be simultaneously received with signals of the first band and the third band;

an eighth filter having an eighth pass band including a reception band of an eighth band that is different from the second band and the fourth band and a signal of which is configured to be simultaneously received with signals of the second band and the fourth band;

a seventh output bump connected to an output end of the seventh filter; and an eighth output bump connected to an output end of the eighth filter, wherein the first input bump is connected to an input end of the first filter, an input end of the third filter, and an input end of the seventh filter, the second input bump is connected to an input end of the second filter, an input end of the fourth filter, and an input end of the eighth filter, and in the first output bump to the fourth output bump, the seventh output bump, and the eighth output bump, the first output bump and the second output bump are disposed adjacent to each other, the third output bump and the fourth output bump are disposed adjacent to each other, and the seventh output bump and the eighth output bump are disposed adjacent to each other.

11. A radio frequency module comprising:
a mounting substrate having a third main surface and a fourth main surface which face each other;
the composite filter component according to claim 1, which is disposed on the mounting substrate; and
a first low noise amplifier and a second low noise amplifier which are disposed on the mounting substrate,
wherein an input end of the first low noise amplifier is connected to the first output bump and the second output bump, and
an input end of the second low noise amplifier is connected to the third output bump and the fourth output bump.

12. The radio frequency module according to claim 11,
wherein the first output bump and the second output bump are disposed closer to the first low noise amplifier than the second low noise amplifier, and
the third output bump and the fourth output bump are disposed closer to the second low noise amplifier than the first low noise amplifier.

13. A composite filter component comprising:
a first filter having a first pass band including a transmission band of a first band;
a second filter having a second pass band including a transmission band of a second band;
a third filter having a third pass band including a transmission band of a third band a signal of which is configured to be simultaneously transmitted with a signal of the first band;
a fourth filter having a fourth pass band including a transmission band of a fourth band a signal of which is configured to be simultaneously transmitted with a signal of the second band;
a first output bump connected to an output end of the first filter and an output end of the third filter;
a second output bump connected to an output end of the second filter and an output end of the fourth filter;
a first input bump connected to an input end of the first filter;
a second input bump connected to an input end of the second filter;
a third input bump connected to an input end of the third filter; and
a fourth input bump connected to an input end of the fourth filter,
wherein in the first input bump, the second input bump, the third input bump, and the fourth input bump, the first input bump and the second input bump are disposed adjacent to each other, and the third input bump and the fourth input bump are disposed adjacent to each other.

14. The composite filter component according to claim 13,
wherein the composite filter component has a first main surface and a second main surface which face each other, and has a polygonal shape having a first outer edge and a second outer edge which face each other, assuming the first main surface is viewed in a plan view,
the first input bump, the second input bump, the third input bump, and the fourth input bump are disposed on the first main surface in a first direction along the first outer edge in an order of the first input bump, the second input bump, the third input bump, and the fourth input bump, and
the first output bump and the second output bump are disposed on the first main surface between the first input bump, the second input bump, the third input bump, and the fourth input bump, and the second outer edge.

15. The composite filter component according to claim 14, further comprising:
a first layer portion and a second layer portion which are laminated on each other,
wherein the first layer portion includes the first main surface, the first filter, and the fourth filter,
the second layer portion includes the second main surface, the second filter, and the third filter,
the first filter and the fourth filter are disposed in the first direction in an order of the first filter and the fourth filter,
the second filter and the third filter are disposed in the first direction in an order of the second filter and the third filter, and
assuming the first main surface and the second main surface are viewed in a plan view, the first filter and the second filter at least partially overlap each other, and the third filter and the fourth filter at least partially overlap each other.

16. The composite filter component according to claim 15,
wherein assuming the first main surface is viewed in a plan view, an area of the first input bump is larger than an area of the third input bump, and an area of the fourth input bump is larger than an area of the second input bump.

17. The composite filter component according to claim 13, further comprising:
a first layer portion and a second layer portion which are laminated on each other,
wherein the composite filter component has a first main surface and a second main surface which face each other,
a transmission band of the first band and a transmission band of the second band at least partially overlap each other,
the first layer portion includes the first main surface, the third filter, and the fourth filter,
the second layer portion includes the second main surface, the first filter, and the second filter,
the third filter and the fourth filter are disposed in the first direction in an order of the third filter and the fourth filter,
the first filter and the second filter are disposed in the first direction in an order of the second filter and the first filter, and
assuming the first main surface and the second main surface are viewed in a plan view, the first filter and the fourth filter at least partially overlap each other, and the second filter and the third filter at least partially overlap each other.

18. The composite filter component according to claim 17,
wherein assuming the first main surface is viewed in a plan view, an area of the third input bump is larger than an area of the first input bump, and an area of the fourth input bump is larger than an area of the second input bump.

19. A radio frequency module comprising:
a mounting substrate having a third main surface and a fourth main surface which face each other;
the composite filter component according to claim 13, which is disposed on the mounting substrate; and a first power amplifier and a second power amplifier which are disposed on the mounting substrate, wherein an output end of the first power amplifier is connected to the first input bump and the second input bump, and an output end of the second power amplifier is connected to the third input bump and the fourth input bump.

20. The radio frequency module according to claim 19, wherein the first input bump and the second input bump are disposed closer to the first power amplifier than the second power amplifier, and the third input bump and the fourth input bump are disposed closer to the second power amplifier than the first power amplifier.

* * * * *